(12) United States Patent
Yonkee et al.

(10) Patent No.: US 11,348,908 B2
(45) Date of Patent: May 31, 2022

(54) CONTACT ARCHITECTURES FOR TUNNEL JUNCTION DEVICES

(71) Applicant: THE REGENTS OF THE UNIVERSITY OF CALIFORNIA, Oakland, CA (US)

(72) Inventors: Benjamin P. Yonkee, Goleta, CA (US); Erin C. Young, Santa Barbara, CA (US); James S. Speck, Santa Barbara, CA (US); Steven P. DenBaars, Goleta, CA (US); Shuji Nakamura, Santa Barbara, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 239 days.

(21) Appl. No.: 16/325,709

(22) PCT Filed: Aug. 17, 2017

(86) PCT No.: PCT/US2017/047342
§ 371 (c)(1),
(2) Date: Feb. 14, 2019

(87) PCT Pub. No.: WO2018/035322
PCT Pub. Date: Feb. 22, 2018

(65) Prior Publication Data
US 2021/0104504 A1    Apr. 8, 2021

Related U.S. Application Data

(60) Provisional application No. 62/415,843, filed on Nov. 1, 2016, provisional application No. 62/410,954, filed (Continued)

(51) Int. Cl.
*H01L 25/16* (2006.01)
*H01L 33/22* (2010.01)
(Continued)

(52) U.S. Cl.
CPC ............ *H01L 25/167* (2013.01); *H01L 33/22* (2013.01); *H01L 33/32* (2013.01); *H01L 33/46* (2013.01); *H01L 33/62* (2013.01)

(58) Field of Classification Search
CPC ....... H01L 25/167; H01L 33/46; H01L 33/22; H01L 33/62; H01L 33/32
See application file for complete search history.

(56) References Cited

U.S. PATENT DOCUMENTS

| | | | | |
|---|---|---|---|---|
| 2002/0145147 A1* | 10/2002 | Chiou | ..................... | H01L 33/10 |
| | | | | 257/79 |
| 2003/0205712 A1* | 11/2003 | Bhat | ....................... | H01L 33/20 |
| | | | | 257/79 |

(Continued)

FOREIGN PATENT DOCUMENTS

| WO | 2017/011387 | 1/2017 |
|---|---|---|
| WO | 2017011387 A1 | 1/2017 |

OTHER PUBLICATIONS

PCT International Search Report & Written Opinion dated Dec. 26, 2017, International Application No. PCT/US17/47342.

(Continued)

*Primary Examiner* — Victor A Mandala
(74) *Attorney, Agent, or Firm* — Gates & Cooper LLP

(57) ABSTRACT

A flip chip III-Nitride LED which utilizes a dielectric coating backed by a metallic reflector (e.g., aluminum or silver). High reflectivity and low resistance contacts for optoelectronic devices. Low ESD rating optoelectronic devices. A VCSEL comprising a tunnel junction for current and optical confinement.

19 Claims, 30 Drawing Sheets

Related U.S. Application Data on Oct. 21, 2016, provisional application No. 62/394,060, filed on Sep. 13, 2016, provisional application No. 62/376,179, filed on Aug. 17, 2016, provisional application No. 62/376,289, filed on Aug. 17, 2016, provisional application No. 62/376,266, filed on Aug. 17, 2016.

(51) Int. Cl.
*H01L 33/32* (2010.01)
*H01L 33/46* (2010.01)
*H01L 33/62* (2010.01)

(56) References Cited

U.S. PATENT DOCUMENTS

| | | | |
|---|---|---|---|
| 2005/0087884 A1* | 4/2005 | Stokes | H01L 33/405 257/778 |
| 2005/0196887 A1 | 9/2005 | Liu | |
| 2007/0181894 A1* | 8/2007 | Stein | H01L 33/40 257/98 |
| 2008/0144688 A1* | 6/2008 | Chua | H01L 33/405 372/50.1 |
| 2011/0049555 A1* | 3/2011 | Engl | H01L 33/382 257/98 |
| 2011/0297979 A1* | 12/2011 | Diana | H01L 33/08 257/91 |
| 2012/0267668 A1 | 10/2012 | David et al. | |
| 2013/0020597 A1* | 1/2013 | Horng | H01L 33/0093 257/98 |
| 2013/0264592 A1* | 10/2013 | Bergmann | H01L 33/486 257/88 |
| 2016/0155881 A1* | 6/2016 | Kayes | H01L 31/0445 257/184 |
| 2019/0165213 A1* | 5/2019 | Yonkee | H01L 33/42 |
| 2019/0207043 A1* | 7/2019 | Yonkee | H01L 21/02579 |

OTHER PUBLICATIONS

Lian et al., "Optical anisotropy of wurtzite GaN on sapphire characterized by spectroscopic ellipsometry". Semicond. Sci. Technol. 19, 417-420 (2003).

Esaki, "New Phenomenon in Narrow Germanium p-n Junctions," Phys. Rev., vol. 109, No. 2, pp. 603-604, Jan. 1958.

McPeak et al., "Plasmonic Films Can Easily Be Better: Rules and Recipes". ACS Photonics. 2, pp. 326-333 (2015).

Krishnamoorthy et al., "InGaN/GaN tunnel junctions for hole injection in GaN light emitting diodes," Appl. Phys. Lett., vol. 105, No. 14, p. 141104-1 to 141104-4, Oct. 2014.

Krishnamoorthy et al., "Low resistance GaN/InGaN/GaN tunnel junctions," Appl. Phys. Lett., vol. 102, No. 11, pp. 113503-1 to 113503-5, 2013.

Leonard et al., "Demonstration of a III-nitride edge-emitting laser diode utilizing a GaN tunnel junction Contact," vol. 24, No. 7, DOI:10.1364/OE.24.007816 | Optics Express 7816.

Simon et al., "Polarization-induced hole doping in wide-band-gap uniaxial semiconductor heterostructures.," Science, vol. 327, No. 5961, pp. 60-64, Jan. 2010.

Yonkee et. al., "Silver free III-nitride flip chip light emitting diode with wall plug efficiency over 70% utilizing a GaN tunnel junction," Applied Physics Letters, vol. 109, Issue 19, id.191104.

Young et al., "Hybrid tunnel junction contacts to III-nitride light-emitting diodes". Appl. Phys. Express. 9, 022102-1 to 022102-4 (2016).

* cited by examiner

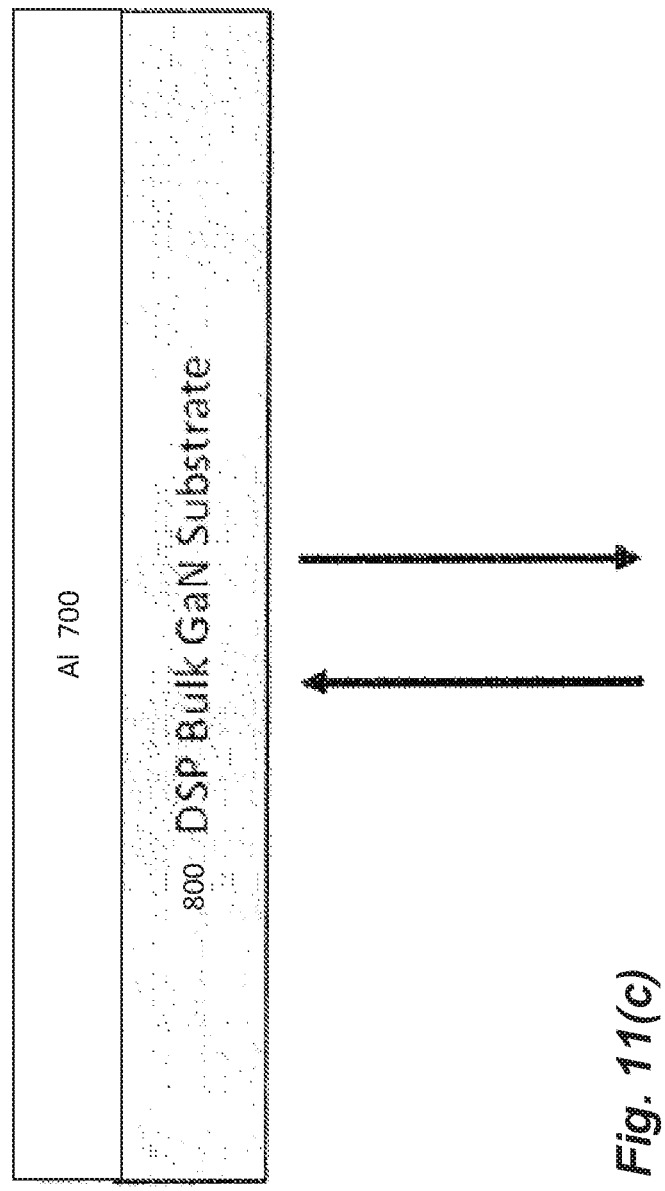

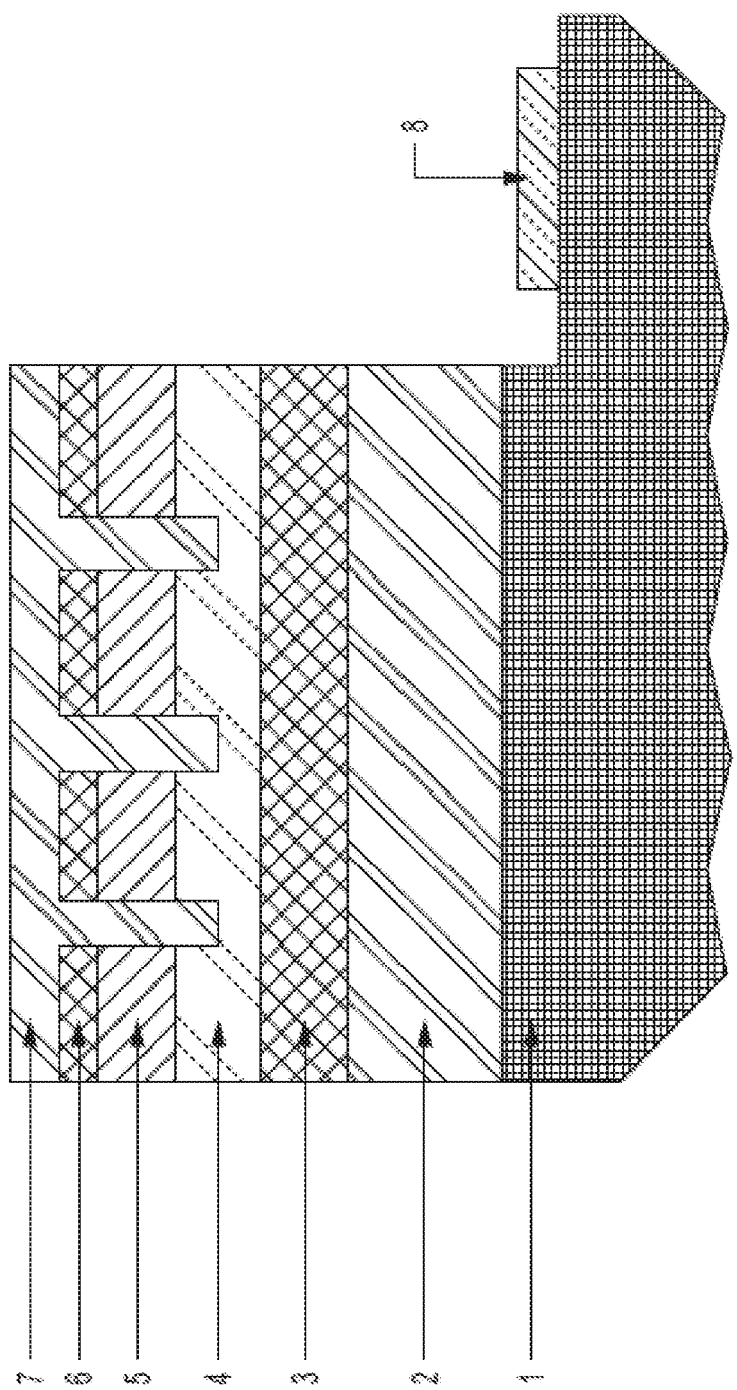

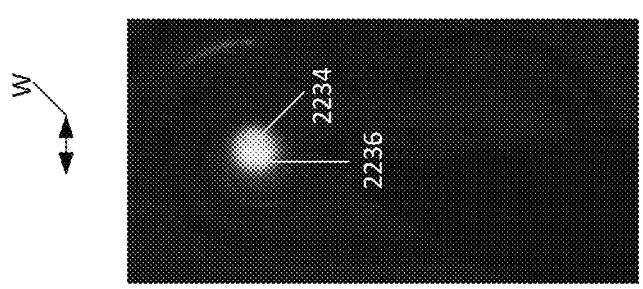
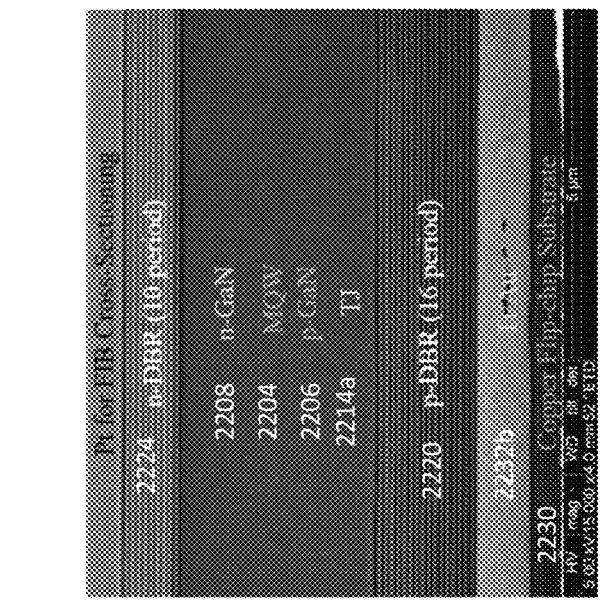
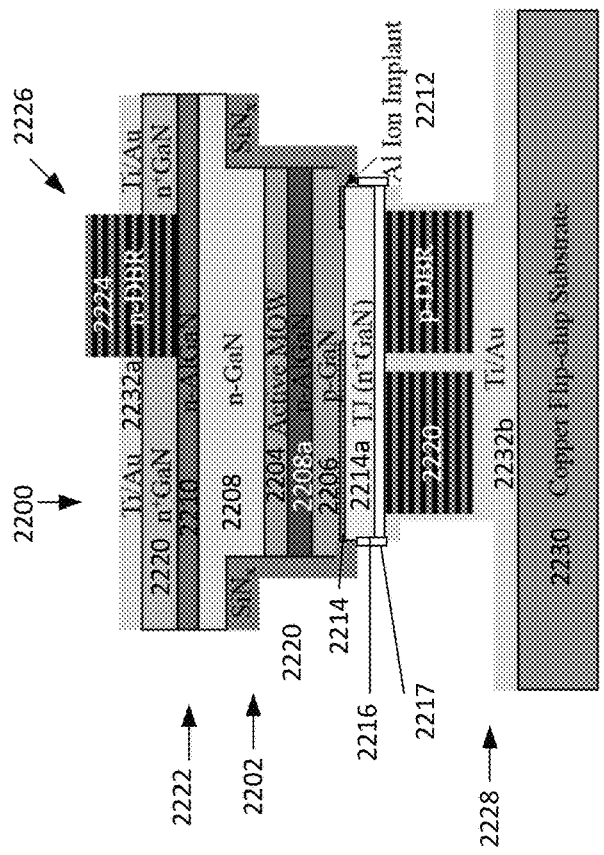
*Fig. 22(a)*
*Fig. 22(b)*
*Fig. 22(c)*

CONTACT ARCHITECTURES FOR TUNNEL JUNCTION DEVICES

CROSS REFERENCE TO RELATED APPLICATIONS

This application claims the benefit under 35 U.S.C. Section 119(e) of the following co-pending and commonly-assigned applications:

U.S. Provisional Patent Application No. 62/376,179, filed on Aug. 17, 2016, by Benjamin P. Yonkee, Erin C. Young, James S. Speck, Steven P. DenBaars, and Shuji Nakamura, entitled "III-NITRIDE FLIP CHIP LIGHT EMITTING DIODE WITH DIELECTRIC BASED MIRROR," (UC Ref. 2017-132-1);

U.S. Provisional Patent Application No. 62/376,266, filed on Aug. 17, 2016, by Benjamin P. Yonkee, Erin C. Young, James S. Speck, Steven P. DenBaars, and Shuji Nakamura. entitled "HIGH REFLECTIVITY OHMIC CONTACTS TO N-TYPE GALLIUM NITRIDE UTILIZING VACUUM ANNEALED ALUMINUM," (UC Ref 2017-133-1);

U.S. Provisional Patent Application No. 62/376,289, filed on Aug. 17, 2016, by Steven P. DenBaars, Benjamin P. Yonkee, James S. Speck, and Shuji Nakamura, entitled "III-NITRIDE TUNNEL JUNCTION LIGHT EMITTING DIODE WITH HIGH ELECTROSTATIC DISCHARGE (ESD) RATING," (UC Ref. 2017-136-1);

U.S. Provisional Patent Application No. 62/410,954, filed on Oct. 21, 2016, by Michael Iza, Steven P. DenBaars, and Shuji Nakamura, entitled "(Al, In, Ga, B)N DEVICE STRUCTURES," (UC Ref. 2017-238-1);

U.S. Provisional Patent Application No. 62/415,843, filed on Nov. 1, 2016, by Burhan SaifAddin, Abdullah Almogbel, Humberto Foronda, Michael Iza, Erin C. Young, Shuji Nakamura, Steven P. DenBaars, and. James S. Speck, entitled "METHOD TO FABRICATE HIGH EXTRACTION EFFICIENCY THIN FILM LIGHT EMITTING DEVICES WITH TUNNEL JUNCTIONS AND SUBSTRATE LIFTOFF," (UC Ref. 2017-242-1); and U.S. Provisional Patent Application No. 62/394,060, filed on Sep. 13, 2016, by Charles Forman, John T. Leonard, SeungGeun Lee, Dan Cohen, Robert M. Farrell, Steven P. DenBaars, James S. Speck, and Shuji Nakamura, entitled "BURIED TUNNEL JUNCTION APERTURE FOR III-NITRIDE SURFACE-EMITTING LASERS," (UC Ref. 2017-135-1);

all of which applications are incorporated by reference herein.

This application is related to the following co-pending and commonly-assigned U.S. patent applications:

International PCT Application No. PCT/US17/16720 filed Feb. 6, 2017, entitled III-NITRIDE LIGHT EMITTING DIODES WITH TUNNEL JUNCTIONS WAFER BONDED TO A CONDUC FIVE OXIDE AND HAVING OPTICALLY PUMPED LAYERS, by Asad J. Mughal, Stacy J. Kowsz, Robert M. Farrell, Benjamin Yonkee, Erin C. Young, Christopher D. Pynn, Tal Margalith, James S. Speck, Shuji Nakamura, and Steven P. DenBaars, which application claims the benefit under 35 U.S.C Section 119(e) of the following co-pending and commonly-assigned applications:

U.S. Provisional Application Ser. No. 62/292,015, filed on Feb. 5, 2016, by James S. Speck, Asad Mughal, Erin C. Young, and Steven P. DenBaars, entitled "LIGHT EMITTING DIODE WITH A TUNNEL JUNCTION CONTACT WAFER BONDED TO A CONDUCTIVE OXIDE," (2016-324-1);

U.S. Provisional Application Ser. No. 62/298,268, filed on Feb. 22, 2016, by Stacy J. Kowsz, Robert M. Farrell, Benjamin Yonkee, Erin C. Young, Christopher D. Pynn, Tal Margalith, Shuji Nakamura, and Steven P. DenBaars, entitled "TUNNEL JUNCTION DEVICES WITH MONOLITHIC OPTICALLY-PUMPED AND ELECTRICALLY-INJECTED III-NITRIDE LAYERS," (2016-325-1);

PCT International Utility Patent Application Serial No. PCT/US16/59929, filed on Nov. 1, 2016, by Benjamin P. Yonkee, Erin C. Young, John T. Leonard, Tal Margalith, James S. Speck, Steven P. DenBaars, and Shuji Nakamura entitled III-NITRIDE TUNNEL JUNCTION WITH MODIFIED P-N INTERFACE, which application claims the benefit under 35 U.S.C. § 119 of U.S. Provisional Patent Application No. 62/250,758, filed on Nov. 4, 2015, by Benjamin P. Yonkee, Erin C. Young, John T. Leonard, Tal Margalith, James S. Speck, Steven P. DenBaars, and Shuji Nakamura, entitled "III-NITRIDE TUNNEL JUNCTION WITH MODIFIED P-N INTERFACE" (UC Ref 2016-245-1);

PCT International Utility Patent Application Serial No. PCT/US16/41744, filed on Jul. 11, 2016, by Erin C. Young, Benjamin P. Yonkee, John T. Leonard, Tal Margalith, James S. Speck, Steven P. DenBaars, and Shuji Nakamura, entitled "HYBRID GROWTH METHOD FOR HI-NITRIDE TUNNEL JUNCTION DEVICES," (2015-904-2), which application claims the benefit under 35 U.S.C. § 119 of U.S. Provisional Application Ser. No. 62/190,929, filed on Jul. 10, 2015, by Erin C. Young, Benjamin P. Yonkee, John T. Leonard, Tal Margalith, James S. Speck, Steven P. DenBaars, and Shuji Nakamura, entitled "HYBRID GROWTH METHOD FOR III-NITRIDE TUNNEL JUNCTION DEVICES," (2015-904-1);

all of which applications are incorporated by reference herein.

BACKGROUND OF THE INVENTION

1. Field of the Invention

This invention relates to methods and devices for improving performance of III-nitride light emitting devices.

2. Description of the Related Art (Note: This application references a number of different references as indicated throughout the specification by one or more reference numbers in brackets, e.g., [x]. A list of these different references ordered according to these reference numbers can be found below in the section entitled "References." Each of these references is incorporated by reference herein.)

Current commercially-available III-nitride light-emitting diodes (LEDs) use an active region in a biased p-n junction to allow for electron and hole injection. However, the p-GaN is difficult to contact electrically and has low hole concentration and mobility. This means that p-GaN cannot be used as a current spreading layer and that traditional p-contacts will add significant voltage to devices. Despite these inherent problems, all commercial light emitting devices utilize a p-contact and a material other than p-GaN for current spreading, typically transparent conducting oxides (TCO).

There is a need to improve the performance of III-nitride light-emitting devices. The present invention satisfies this need.

SUMMARY OF THE INVENTION

To overcome the limitations described above, and to overcome other limitations that will become apparent upon reading and understanding this specification, one or more embodiments of the present invention disclose the use of a dielectric high reflectivity (HR) coating as a mirror to improve the light extraction of flip chip LEDs. Because n-GaN allows for effective lateral current spreading, the mirror in the flip chip device does not need to contact the p-type material directly. Instead, an HR dielectric coating backed by silver or aluminum can increase the reflectivity of a mirror, dramatically allowing for improved performance.

In other embodiments, the present invention discloses and demonstrate low resistance contacts to n-GaN using pure aluminum which gave a reflectivity of approximately 85% for light having a wavelength of 450 nm. While this reflectivity is too low for a large area contact, only a small coverage area is needed due to the low contact resistivity. In addition, the low temperature anneals required for these contacts are compatible with many p-contact materials. III-Nitride devices can also have different crystal orientations which display different contact resistivities. This work cover demonstrates contacts to c-plane and (20-2-1) orientations.

In yet further embodiments, the present invention discloses the use of a n-type III-Nitride spreading layer to improve the electrostatic discharge (ESD) performance of Gallium Nitride (GaN) LEDs. Because n-type III-Nitride allows for effective lateral current spreading, the electric field is spread evenly and hence the peak voltage to resist catastrophic electrostatic discharge is dramatically increased, thereby allowing for improved performance.

In yet further embodiments, the light emitting output power of nitride light emitting devices, such as LEDs is enhanced. Improving the light emission efficiency leads to an improvement in the electronic efficiency characteristics of the nitride light emitting semiconductor, and in turn can lead to the expansion of nitride semiconductor device applications into various commercial products.

A nitride semiconductor device according to another embodiment of the present invention comprises an n-type region, a p-type region, at least one active region, at least one second n-type region, at least one spacer region, at least one mirror region, and at least one second contact region.

Furthermore, the second n-type region is electrically connected to the p-type region which forms a tunnel junction. In addition, the spacer region above the second n-type region is of higher resistance compared to that of the second n-type region and partially covers the second n-type region. This leaves part of the second n-type region uncovered. Leaving parts of the second n-type region uncovered allows for the ability to form an electrical contact to this region in subsequent metal depositions steps.

Furthermore, a mirror region is then deposited on top or above the spacer region. The mirror region can be fabricated by the use of a highly reflective metal such as silver or aluminum. Additionally, the mirror region can also be composed of dielectric materials. A dielectric mirror is a type of mirror composed of multiple thin regions of dielectric material. By careful choice of the type and thickness of the dielectric regions, one can design an optical mirror with specified reflectivity at different wavelengths of light. Dielectric mirrors can produce ultra-high reflectivity mirrors with values of 99.999% or better over a narrow range of wavelengths or over a large range of wavelengths dependent on the design and material parameters. This creates a highly reflective surface in which the light emitted from the active region of the device can be directed in a desired direction. Thus, the mirror region can be used to enhance the light extraction of the said optical device.

Furthermore, the second contact region is formed on or above the mirror region and the second n-type contact. This metal region then forms an electrical contact to the second n-type region of the device. The metal region can be composed of regions with at least some aluminum, or platinum, or titanium, or nickel, and/or gold.

Further, in the nitride semiconductor device according to the first embodiment of the present invention, the spacer region is doped with an impurity, preferably silicon. However, the region may also be undoped. The term of "undoped" represents the status of not being doped intentionally, including where the impurity diffuses from the adjacent nitride semiconductor regions according to the present invention. The impurity concentration due to such diffused impurity often has a gradient concentration in the regions.

The spacer region may comprise multiple regions having varying or graded compositions, a heterostructure comprising regions of dissimilar (Al, Ga, In, B)N composition, or one or more regions of dissimilar (Al, Ga, In, B)N composition. The spacer may comprise of unintentionally doped or intentionally doped regions, with elements such as iron, magnesium, silicon, oxygen, carbon, and/or zinc. The spacer region may be grown using deposition methods comprising HYPE, MOCVD or MBE.

The structure may further comprise the optical device grown in any crystallographic nitride direction, such as on a conventional c-plane oriented nitride semiconductor crystal, or on a nonpolar plane such as a-plane or m-plane, or on any semipolar plane.

The present invention also discloses a device having enhanced properties using the above described structures.

In yet further embodiments, the present invention discloses a method of fabricating an LED, comprising providing a carrier (submount) having pre-made contact pads for bonding; aligning each processed LED with the carrier wafer pattern and bonding each processed LED to the carrier; and removing the growth substrate (e.g., SiC) such that the N-Face side of the buffer layer is the top most layer.

The devices' mesas are defined prior to the devices being flip chipped onto the carrier comprising an insulative/insulating sub-mount and the N-face of the buffer layer can be processed to access n-pads and p-pads. The mesas are processed from the N-face side to isolate the mesas from the N-Face side.

In one or more embodiments, reflective n-contacts and p-contacts are deposited on a Ga-side of the LEDs.

A tunnel junction can be used as a transparent or semi-transparent current spreading layer on top of the p-doped layer of LED. The use of a transparent current spreading layer allows the use of very high reflective omnidirectional mirrors (for example MgF2/Srf/Al in the deep range (210 nm-300 nm).

Several methods to enhance tunneling across the wide bandgap p-side and tunnel junction are described.

The substrate can be removed mechanically (e.g., by polishing, lapping), by a highly selective dry etch, or by lift-off though an undercut etch of a sacrificial layer.

In one or more embodiments, a surface of the LED (surface of the buffer layer) is roughened or patterned. A patterning example includes creating a photonic crystal. Roughening can also be done by natural roughening by in KOH of the N-face AlN in the buffer layer or by plasma etching.

In one or more embodiments, the LED is an ultraviolet light emitting diode (UV LED). However, one or more embodiments of the present invention (or parts thereof) are also applicable to other types of photonics devices with different layer arrangements. In one or more embodiments, the device area ranges from 1 cm² to 10 µm².

In yet further embodiments, the present invention disclose a III-nitride VCSEL that has a buried tunnel junction (BTJ) aperture on the p-side. The key steps to create this device are growth of a III-nitride p-n junction with an active optical gain medium, growth of an n-type III-nitride tunnel junction (TJ) to the p-side of the device, vertical etch to expose the sidewall of the TJ, deposition of a capping current spreading layer to surround the TJ, and standard processing to create an optical cavity. The capping layer can be chosen to have a lower refractive index than the core of the device, which increases the lateral optical confinement. Reported electrically-injected III-nitride VCSELs have mostly used dielectric, p-GaN passivation, and ion implanted apertures; however, these designs do not have effective lateral optical confinement. The novel BTJ aperture for III-nitride VCSELs, according to one or more embodiments of the present invention, offers a solution for both current and optical confinement, which will lead to improved VCSEL performance.

BRIEF DESCRIPTION OF THE DRAWINGS

Referring now to the drawings in which like reference numbers represent corresponding parts throughout:

FIG. 11(c) shows the set up for measuring reflectivity.

FIG. 16 is a cross-sectional schematic of a nitride semiconductor device according to a first embodiment of the present invention, comprising of an n-type region, a p-type region, at least one active region, at least one second n-type region, at least one spacer region, at least one mirror region, and at least one second contact region.

FIG. 18(a)-18(c) illustrate device structures according to different embodiments of the present invention, wherein FIG. 18c shows a structure wherein the growth substrate can be removed using substrate lift-off by undercutting the sacrificial layer.

FIG. 19(b)-19(f) illustrate a process fabrication flow and simplified sectional views according to one or more embodiments of the present invention, wherein the growth substrate is removed mechanically with a mechanical stop or by a highly) selective dry etch, and wherein a reflection p-mirror, n-contact, n-contact bond, and passivation of device mesa sidewalls are also shown and wherein FIG. 19f shows an embodiment where a wide bandgap tunnel junction with a transparent n-type current spreading layer (1805, 1806) is deposited.

FIG. 20(*c*)-20(*d*): MQW PL emission from a flip-chip Sub-mount substrate/Au—Au bond/p-mirror/n-AlGaN/MQW/n-AlGaN/AlN (600 nm) structure with Si doping density $10^{20}$ cm$^{-3}$ is enhanced with KOH roughening and non-annealed Al based p-contact (Pt/Al/Ni/Au). FIG. 20(*c*) 310 nm MQW; 2.6 nm of Pt, and reflectivity of ~87% at 310 nm. FIG. 20(*d*) 285 nm MQW; 0.26 nm of Pt, and reflectivity of ·91% at 285 nm. AOI=12°.

FIG. 20(*e*)-20(*f*) show the set up used to obtain the data in FIGS. 20(*c*) and 20(*d*).

FIG. 22 shows (a) illustrated schematic of the IIA VCSEL structure, (b) scanning electron microscope (SEM) image of a focused ion beam (FIB) cross-section at the aperture of a IIA VCSEL, and (c) electroluminescence of a BTJ VCSEL prior to n-DBR deposition, according to one or more embodiments of the present invention.

DETAILED DESCRIPTION OF THE INVENTION

In the following description of the preferred embodiment, reference is made to the accompanying drawings that form a part hereof, and in which is shown by way of illustration a specific embodiment in which the invention may be practiced. It is to be understood that other embodiments may be utilized and structural changes may be made without departing from the scope of the present invention.

Technical Description

A. III-Nitride Flip Chip Light Emitting Diode with Dielectric Based Mirror

A very highly doped (n$^+$/p$^+$) interface can allow for electrons to tunnel between the valence band and conduction band. This was first demonstrated by Esaki in highly doped Ge homojunctions [1] with very thin depletion regions (this type of diode is also known as a tunnel junction).

A low resistance tunnel junction can expand the design space of III-Nitride based LEDs, Edge Emitting Laser Diodes (EELDs), Vertical Cavity Surface Emitting Lasers (VCSELs), and multi junction solar cells, because a tunnel junction incorporated into these optoelectronic devices allows for the epitaxial structure of the device to use n-GaN on both sides, which could eliminate p-contacts and replace them with lower resistance n-contacts. In addition, n-GaN can be used as an effective current spreading layer. The use of n-GaN for current spreading would also allow for the elimination of a transparent conducting oxide (TCO) or silver mirror in an optoelectronic device design.

However, there have been a number of difficulties in achieving high quality tunnel junctions in the GaN system. GaN is a wide bandgap semiconductor, so the barrier for tunneling is high. Several approaches to reducing the tunneling barrier have been attempted, including bandgap engineering via polarization (AlN interlayers) [2], reducing the bandgap with an InGaN interlayer [3], and introducing defect states via interfacial GdN nanoparticles [4]. However, all of these approaches are associated with losses, either in terms of voltage or resistance increases, or optical losses in the final device performance. In principle, a highly doped Esaki type homojunction diode should provide the lowest-loss tunnel junction. However, magnesium doped p-GaN grown by Metal Organic Chemical Vapor Deposition (MOCVD) is compensated by hydrogen as grown, and it must be annealed after growth to remove hydrogen. This anneal can only work if the p-GaN is not covered by n-GaN as hydrogen cannot easily diffuse through n-GaN. This limits the effectiveness of tunnel junctions and prevents their widespread use. Unlike MOCVD grown p-GaN, MBE p-GaN is conductive as grown, which would allow for its use in a tunnel junction. Additionally, the doping limits of MBE materials are higher which could allow for better tunnel junctions. In a previous disclosure, [5] it was shown that by combining MOCVD grown light emitters and MBE grown tunnel junctions, one could reduce the operating voltage devices and increase the efficiency.

Figure 1A:
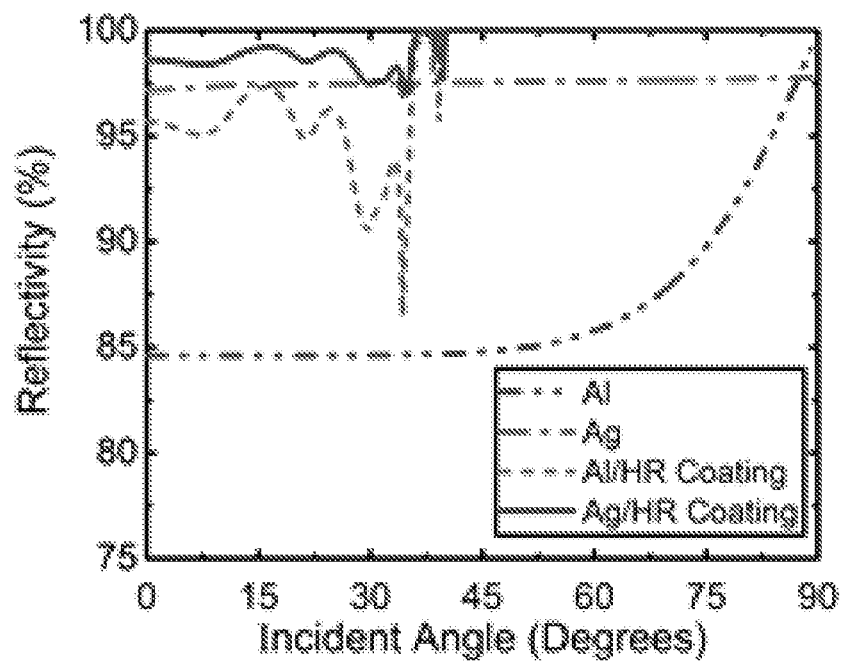
FIG. 1(a) plots the calculated reflectivity versus (vs.) incidence angle, at a wavelength of 450 nanometers (nm) and for different mirrors with a GaN layer, wherein both aluminum and silver have the reflectivity increased when an HR dielectric coating is added in between the metal and the GaN. At an angle greater than approximately 40 degrees, the reflectivity of the mirrors with the coating goes to 100% due to total internal reflection.
Figure 1B:
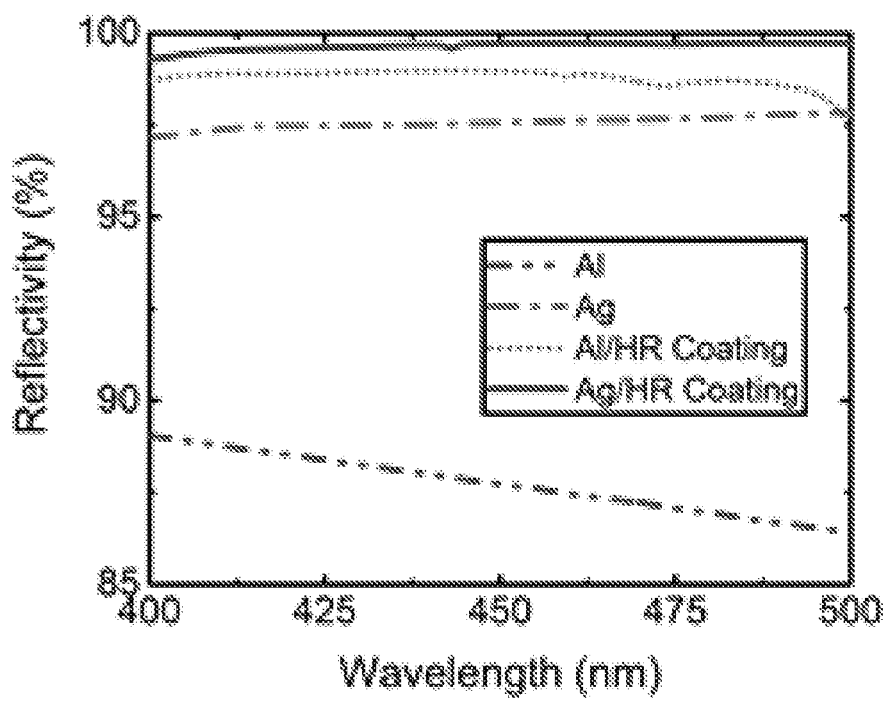
FIG. 1(b) plots the average reflectance integrated over all solid angles assuming uniform emission, wherein the aluminum/HR coating mirror has a higher reflectivity than pure silver which allows for improved performance over a traditional mirror.

Moreover, flip chip LED light extraction is limited by the reflectivity of the mirror used. Due to the high resistivity of p-GaN, the mirror must make electrical contact to the device everywhere as there is no effective current spreading—limiting choices to a conductive mirror that makes contact to the LED. For blue and green III-Nitride LEDs, a silver mirror is used as it has the highest reflectivity of any metal at these wavelengths (for a perfect silver/GaN interface, a reflectivity of about 97% is calculated). However, the silver does not adhere to GaN (or make a good electrical contact by itself) so a thin contact layer such as nickel is used which reduces the mirror reflectivity. The ideal mirror for III-Nitride LEDs would be a multi layer dielectric HR coating backed by a metallic reflector. The dielectric layers are designed to reflect light at the LED emission wavelength and the metallic layer reflects light that makes it through the coating. While silver is still the best metal, aluminum can provide a higher reflectivity and is easier to implement in an LED design. The calculated reflectivity of various mirror configurations is shown in FIG. 1(*a*) as a function of angle and wavelength. The HR coating with an aluminum reflector is demonstrated in the present disclosure and is calculated to have a higher reflectivity than pure silver. FIG. 1(*b*) plots the average reflectance integrated over all solid angles assuming uniform emission, wherein the aluminum/HR coating mirror has a higher reflectivity than pure silver which allows for improved performance over a traditional mirror.

Thus, one or more embodiments of the present invention demonstrate the use of a multilayer dielectric high reflectivity (HR) coating combined with an aluminum reflector to form a mirror for a flip chip LED. This mirror does not form an electrical contact to the LED and can only be used because the regrown n-GaN layer can provide lateral current spreading.

Epitaxial Structure

The epitaxial structure for the LEDs and device design is shown in FIGS. 2(*a*)-2(*c*). FIG. 2(*a*) shows an epitaxial structure 200 comprising an MBE regrowth 202 carried out on a standard/industrial MOCVD LED epitaxial structure 204 grown on a patterned sapphire substrate (PSS) 206 to produce a tunnel junction contact. The MBE regrowth 202 comprises n-type GaN (n-GaN) layer 208 (400 nanometers (nm) thick $2.9\times10^{19}$ Si doped GaN (Si:GaN)) between n+-type GaN layers 210 (5 nm thick $2\times10^{20}$ Si:GaN) and 212 (10 nm thick $2\times10^{20}$ Si:GaN). The MOCVD structure 204 comprises an n-GaN layer 214 on the PSS, an active region 216 (e.g., InGaN layer) on the n-GaN 214, a p-type GaN layer 218 on the active region 216, and a p+-type GaN layer 220 on the p-GaN layer 218 and contacting n+-type layer 212. As used herein, n+-type means higher n-type dopant concentration than n-type, and p+-type means higher p-type dopant concentration than p-type. The GaN layers 208-212 and 214 and 218-220 can be III-nitride layers instead of GaN layers.

Figure 2A:
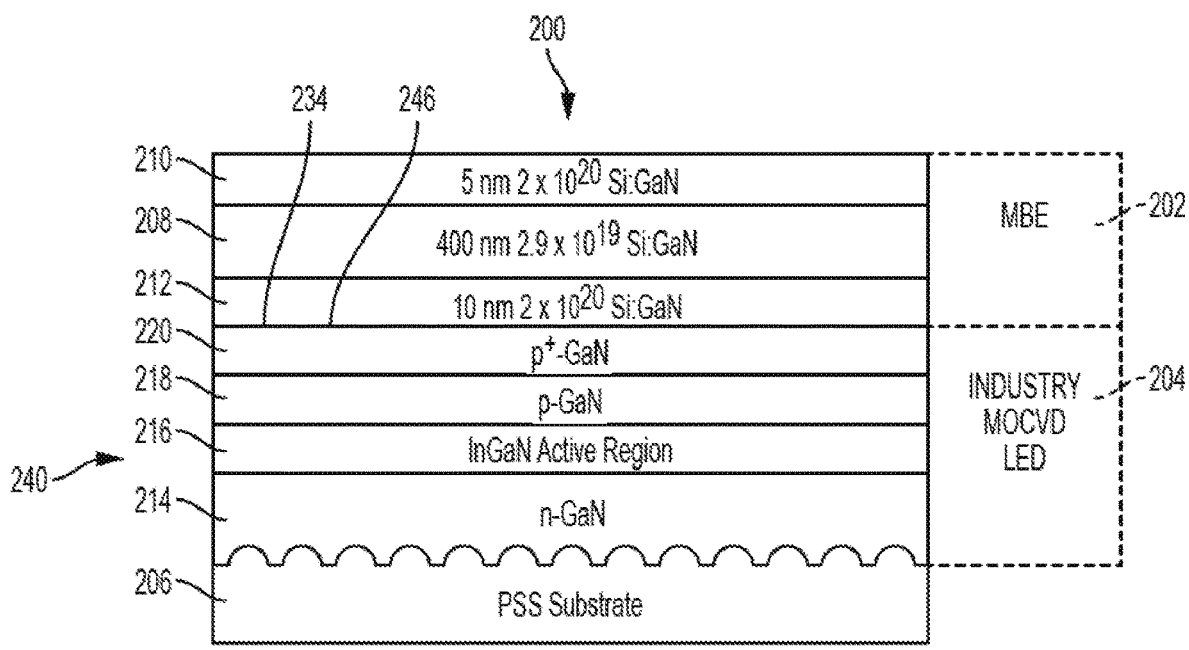
FIG. 2(a) illustrates the epi schematic utilized for the flip chip tunnel junction LEDs, wherein Molecular Beam Epitaxy (MBE) regrowth was carried out to form a low voltage GaN tunnel junction.
Figure 2B:
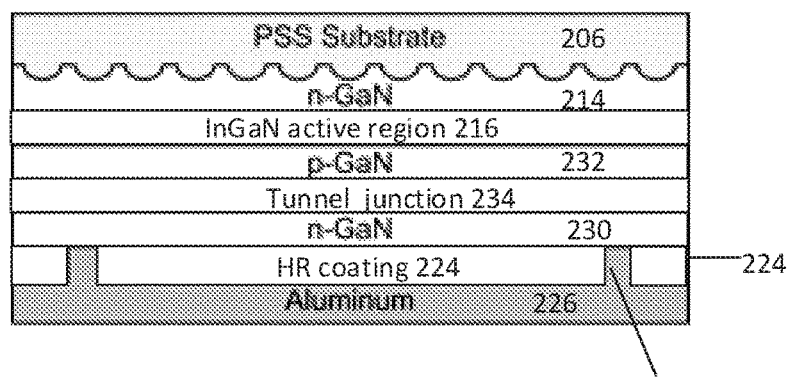
FIG. 2(b) is an illustration of the device including the mirror (an aluminum backed HR dielectric coating produced a high reflectivity over the LED emission range).

FIG. 2(b) shows an LED structure 222 comprising a high reflectivity (HR) coating 224 backed by metal (e.g., aluminum) 226 on the epitaxial structure 200 and used as the mirror. The coating 224 has small vias 228 in it to allow for contact to the n-type GaN layer 230 in the device 222. In FIG. 2(b), the n-GaN layer 230 comprises layers 208, 210, 212 and the metal 226 is in the via 228 so as to contact layer 210 through the via 228. P-type layer 232 comprises layers 218-220, wherein layer p-type layer 220 contacts layer n-type layer 212 so as to form a tunnel junction 234.

Figure 2C:
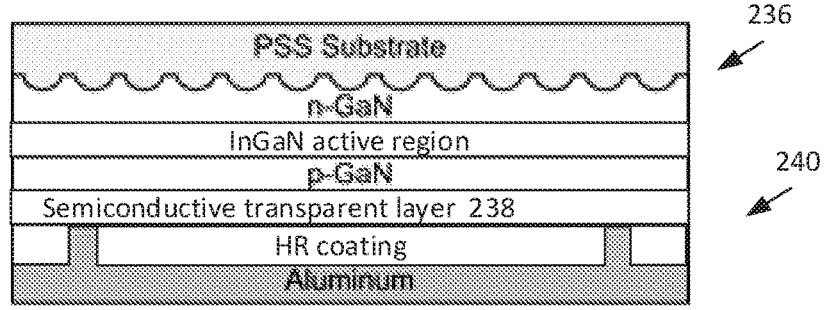
FIG. 2(c) illustrates an alternative design where a semi-transparent conducting layer such as indium tin oxide or zinc oxide is used.

FIG. 2(c) illustrates an LED structure 236 further including a semi-transparent conducting layer 238 between the p-GaN layer 232 and HR coating 224.

The LEDs were packaged on headers and measured in an integrating sphere. Thus, FIGS. 2(b) and 2(c) illustrate an optoelectronic device, comprising a flip chip III-Nitride LED 222, a dielectric coating 224 (e.g., but not limited to a multi-layer stack of alternating dielectrics) on the LED 222; and a metallic reflector 226 (e.g., comprising or consisting essentially of silver and/or aluminum, but not limited to these materials) backing the dielectric coating 224. The device 222 comprises at least one n-type III-Nitride layer 214, 230 for current spreading on at least one side (or both sides) of the LED 222. In one or more embodiments, vias 228 through the dielectric coating 224 to allow for contact metallization (e.g., part of the metallic reflector) to the LED 222. In one or more embodiments, a semi-transparent conducting layer 238 (e.g., ITO, ZnO) as current spreading is on the p-side 240 of the LED.

Example Fabrication Details

Standard industry LED wafers emitting at approximately 450 nm were used. Before the MBE regrowth the wafers were diced into small pieces and solvent cleaned. A 15 minute anneal in an $N_2/O_2$ atmosphere at 550° C. was carried out to activate the samples and a 1 minute dip in 49% acid dips were done to clean the surface 246. An HF dip was found to produce the lowest voltage for the tunnel junction 234 formed by regrowth 202. The samples were then indium bonded and loaded into a VEEECO 930 III-nitride MBE system equipped with an ammonia source. An in situ ammonia anneal was done at 600° C. to clean the surface 246. After heating to a growth temperature of 750° C., a 10 nm n+-GaN layer ([Si]: $2\times10^{20}$) was grown to form the tunnel junction 234. The ammonia overpressure under the MBE growth conditions was low enough to prevent passivation of the p-GaN with hydrogen. For the transparent design, a 400 nm layer of n-GaN ([Si]: $2.9\times10^{19}$) was then grown to act as a current spreading layer and an additional 5 nm n+-GaN layer was grown for n-contacts. The flip chip sample had a 20/35 nm n+-GaN/n-GaN layer regrown on it. FIG. 2(a) shows the epitaxial structure of the transparent LED and FIG. 2(b) shows the mirror and epistructure of the flip chip LED.

For the flip chip LED, a mesa etch was first done using reactive ion etching (RIE) with $SiCl_4$. A dielectric coating was then deposited to reduce optical loss of the wire bond pads. A seven-layer dielectric stack consisting of $Al_2O_3/Ta_2O_5/SOi_2$ was designed using TFCalc which increased the reflectivity of the wire bond pads to over 98% at 450 nm. The topside wire bond pad was also moved off the mesa to prevent it from reflecting light emitted under it back into the chip. A 600/200/1000 nm Al/Ni/Au metal stack was deposited by electron beam evaporation to form contacts on the top and bottom n-GaN layers. A specific contact resistance of $4.4\times10$-7 $\Omega cm^2$ for unannealed aluminum contacts was achieved and a reflectivity of 85% at 450 nm helped increase light extraction. The LEDs were then diced and packaged before measuring in an integrating sphere. Each LED was mounted on a silver header using a clear silicone epoxy. The leads were then wire bonded and the LEDs were peeled off the header and suspended using the tension of the bond wires to hold them in the air. A high reflectivity $BaSO_4$ powder was applied to the header to reduce optical absorption. The headers were then encapsulated into an inverted cone using a silicone epoxy with a refractive index of 1.406 and were characterized in an integrating sphere using CW measurements. Note the dielectric coating was deposited over most of the LED with small holes in it for the top and bottom n-contacts. The total area of the holes was about 2% of the total LED area to prevent excess absorption. The holes were spaced 100 um apart to achieve adequate current spreading. A 900/100 nm layer of Al/Ni was deposited on the sample. A small gap was left between the top and bottom contacts to provide electrical isolation without significantly reducing reflectivity. An $Al_2O_3$ dielectric layer was then deposited over most of the contact area and Ti/Ni/Au pads were deposited for flip chip bonding. The submount was designed using an aluminum layer with a similar seven layer optical coating deposited on a SiC wafer. A Ti/Au pattern was deposited and the submounts was diced into individual pieces. A Dexerials flip chip bonder utilizing LEP bonding paste was used to mount the LEDs. The SiC mounts were mounted onto headers using silver epoxy, encapsulated in an inverted cone of silicone, and measured in an integrating sphere. While there was silver in the header and mounting paste this was not part of the chip and was only used as a mount to hold the LEDs for testing.

Characterization

Figure 3A:
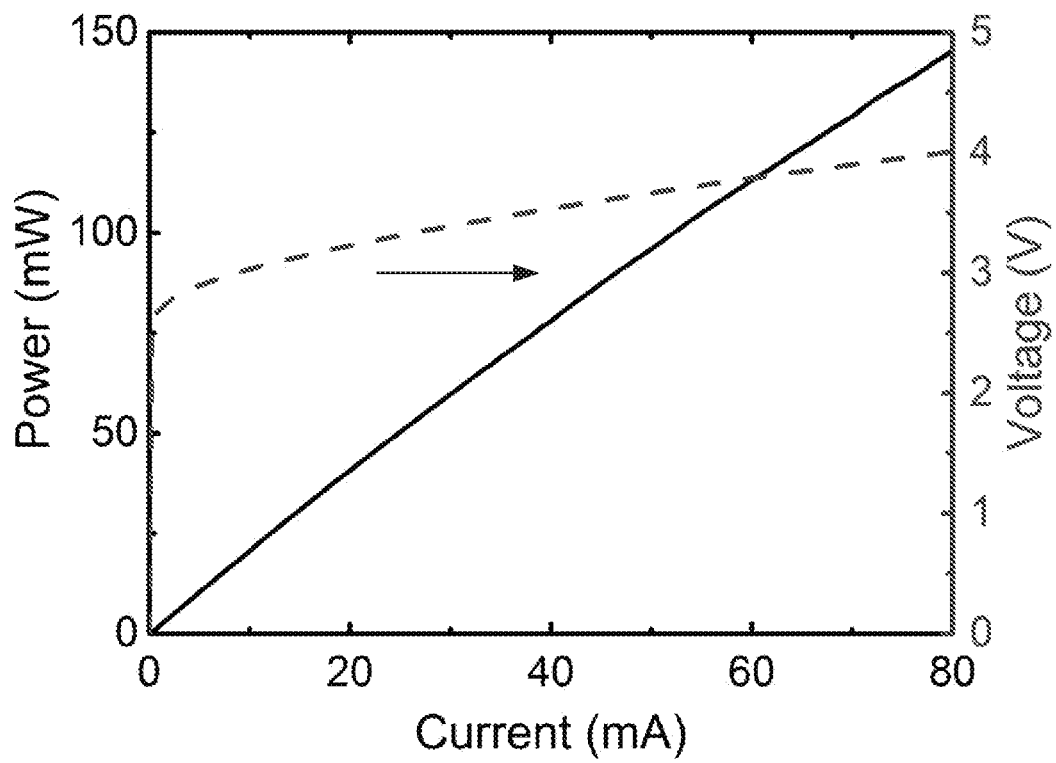
FIG. 3(a) is a LIV plot for the flip chip tunnel junction LED, plotting light output power (in milliwatts, mW) and voltage as a function of current in milliamps (mA).
Figure 3B:
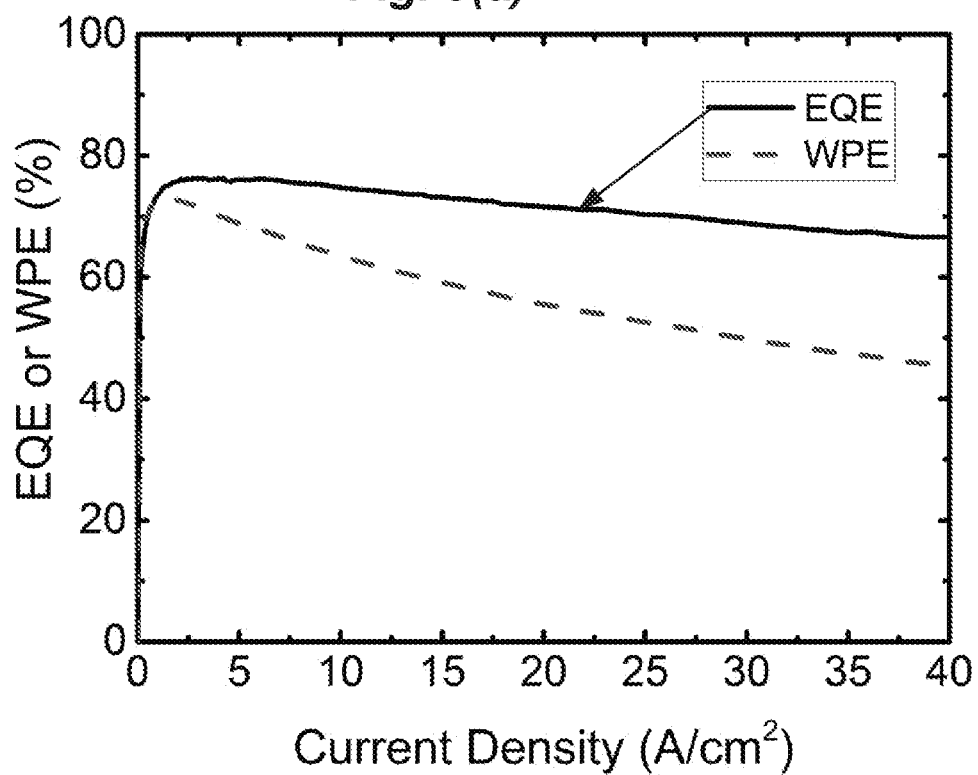
FIG. 3(b) plots the External Quantum Efficiency (EQE) and Wall Plug Efficiency (WPE) vs. current density for the flip chip tunnel junction LED.

FIG. 3(a) shows the LIV characteristics of the device of FIG. 2(b) fabricated using the process in the Example fabrication details. Based on the emission spectra which had a peak at 450 nm, the external quantum efficiency (EQE) and wall plug efficiency (WPE) were calculated and are shown in FIG. 3(b). The peak EQE was 76% which demonstrates the effectiveness of the mirror. Although the devices fabricated used a n-GaN layer 214, 230 for current spreading on both sides of the device 222, FIG. 2(c) illustrates the semi-transparent conducting layer 238 comprising an alternative material as indium tin oxide or zinc oxide) which can be used for current spreading on the p-side.

Process Steps

Figure 4:
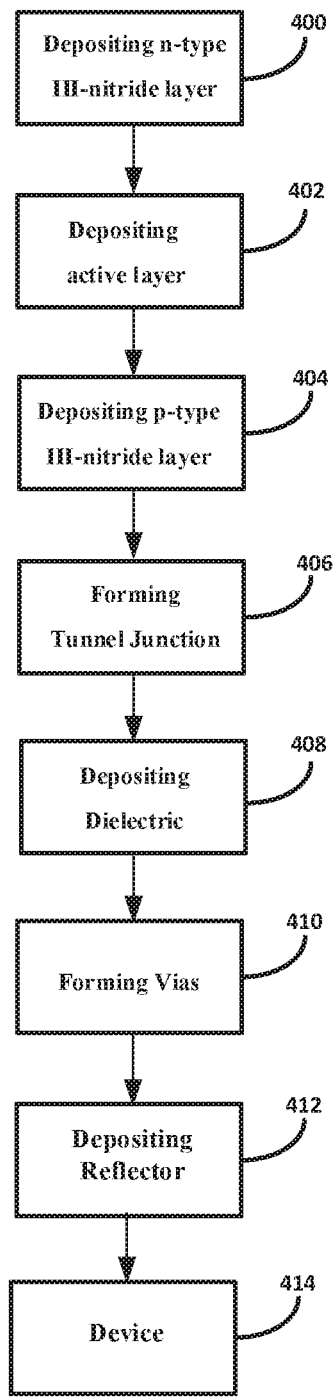
FIG. 4 is a flowchart illustrating a method of fabricating a device.

FIG. 4 (referring to FIG. 2(a)-2(c)) is a flowchart illustrating a method of fabricating an optoelectronic device.

The method can comprise the following steps.

Block 400 represents depositing a first n-type III-nitride layer 214 (e.g., n-GaN) on or above a substrate 206. The substrate can comprise a foreign substrate supporting heteroepitaxial growth of III-nitride, including, but not limited to sapphire or spinel, or a homoepitaxial III-nitride substrate, including, but not limited to GaN, AlN, or InGaN, or a submount. The first n-type III-nitride layer can be deposited on a patterned surface of the foreign or homoepitaxial substrate. C-plane polar, semipolar, or nonpolar III-nitride substrates can be used to form polar, semipolar or nonpolar III-nitride device layers on the substrates.

Block 402 represents depositing a III-nitride active layer 216 (e.g., InGaN quantum wells) on or above the first n-type III-nitride layer.

Block 404 represents depositing a p-type III-nitride layer 218/232 (e.g., p-GaN) on or above the III-nitride active layer. Layers 400-404 can be deposited by MOCVD, for example.

Thus, Blocks 400-404 illustrate an example of fabricating or obtaining a p-n junction structure 240 comprising a p-type layer 218 or material on or above an n-type layer 214 or material (active region 216 between the p-type layer 218 and the n-type layer 214).

Block 406 represents depositing a second n-type III-nitride structure/layer 230 on the p-type III-nitride layer 232, forming a tunnel junction 234 between the second n-type III-nitride layer 230 and the p-type III-nitride layer 232. The second n-type III-nitride structure 230 can comprise a thicker n-type (e.g., Si) doped GaN layer ($n^-$ GaN) 208 between two thinner and more highly doped (e.g., Si) n-type GaN layers 210, 212 (first and second $n^+$ GaN). The first $n^+$-GaN layer 212 closest to the p-type III-nitride layer 232 can form the tunnel junction 234, the thicker $n^+$-GaN layer 208 can provide current spreading, and the second topmost $n^+$-GaN layer 210 can provide n-contact to the n-contact metallization 226. These layers can be deposited by MBE, for example. In other embodiments, III-nitride is used instead of GaN.

Block 408 represents depositing a dielectric coating 224 on the second n-type III-nitride structure 230. The dielectric coating 224 can be a multi-layer stack of alternating dielectrics. In one or more embodiments, vias 228 through the dielectric layer 224 (to allow for contact metallization) were fabricated using a photoresist mask during deposition of the dielectric coating 224.

Block 410 represents optionally forming one or more vias 228 through the dielectric coating 224 if vias were not formed during deposition. Both techniques (formation during or after dielectric deposition) are viable. The vias can go through the dielectric layer 224 to allow for contact metallization to the topmost or second $n^+$-GaN layer 210).

Block 412 represents depositing a metallic reflector 226 on the dielectric coating and in the vias. In one or more embodiments, the contact metallization is the same as the backside metallic reflector 226. The device can also be patterned to allow contact metallization to the first n-type III-nitride layer 214. In one or more embodiments, aluminum or silver are used as the metallic reflector 226.

Figure 5:
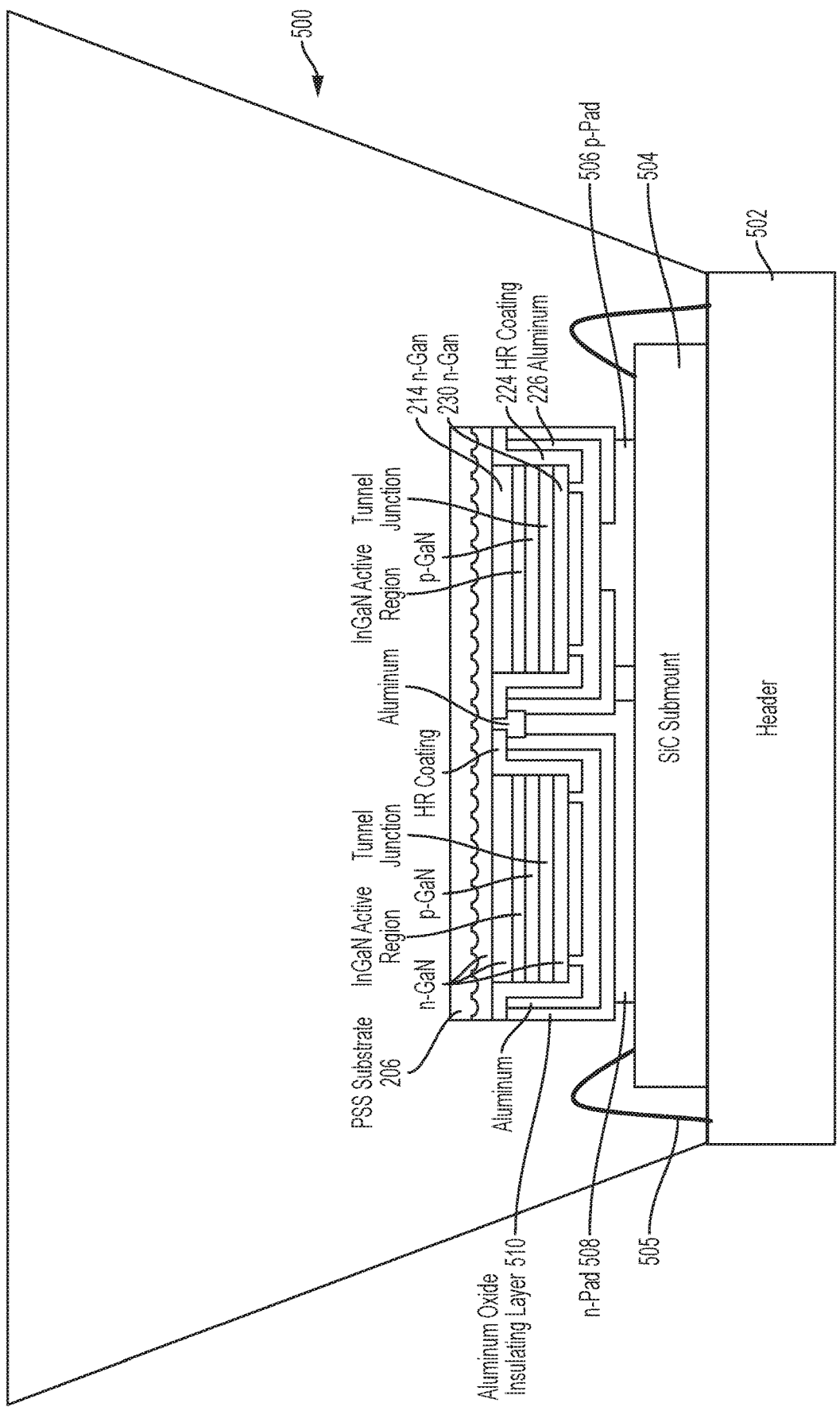
FIG. 5 is a schematic cross-section of a flip chip device according to one or more embodiments of the invention (used to obtain the results in FIGS. 3(a)-3(b)).

Block 414 represents the end result, an optoelectronic device, e.g., as illustrated in FIG. 5. The device 500 in FIG. 5 comprises a first n-type III-nitride layer (n-GaN) 214 on or above a substrate 206; a III-nitride (InGaN) active layer 216 on or above the n-type III-nitride layer 214; a p-type III-nitride layer 232 (p-GaN) on or above the III-nitride active layer 216; a second n-type III-nitride structure (Si:GaN) 230 on the p-type III-nitride layer 232, forming a tunnel junction 234 between the second n-type III-nitride layer 230 and the p-type III-nitride layer 232; a dielectric coating (HR coating) 224 on the second n-type III-nitride structure 230; one or more vias 228 through the dielectric coating 224; and a metallic reflector 226 on or backing the dielectric coating 224 and in the vias 228. The n-type III-nitride layers (first n-type III-nitride layer 214 and one or more layers of the second n-type III-nitride structure 230) can be used for current spreading on at least one side of the device 222, 500 (e.g., on one or both sides).

In one or more embodiments, a semi-transparent conducting layer 238 (e.g., ITO or ZnO) is used as current spreading on the p-side of the LED 236.

The flip chip LED 500 can be placed, metallic reflector side down, on a header 502 and submount 504 (e.g., SiC submount) and in a silicone inverted cone 506, as illustrated in FIG. 5. The embodiment of FIG. 5 was used to obtain the data in FIGS. 3(a)-3(b). Also shown are p-pad 506, n-pad 508 and aluminum oxide insulating layer 510 between the n-pad 508 and metal backing 226. Also shown is wire bond 505.

Examples of devices include, but are not limited to, laser diodes and LEDs. In the case where the device is a laser diode (VCSEL or EELD), additional layers (e.g., waveguiding layers) can be added. One or more embodiments of the present invention could be applied to the device structures in [6] and [7].

Advantages and Improvements

The present invention uses a very highly doped ($n^+/p^+$) interface (called a tunnel junction (TJ)) allowing electrons to tunnel between the valence band and conduction hand. This low resistance tunnel junction on top of the p-GaN allows for current spreading in the n-GaN on both sides of the device as well as the use of low resistance n-type contacts on both sides. Moreover, in one or more embodiments, the use of n-GaN for current spreading allows for the elimination of a TCO or silver mirror in an LED design.

Thus, one or more embodiments of the present invention improve the performance of III-nitride light-emitting devices. For example, the present invention could improve the efficiency of III-Nitride LEDs by improving the light extraction out of the chip. This would reduce the energy use of LEDs and allow for more power out of a single chip.

References for part A

The following references are incorporated by reference herein:

[1] L. Esaki, Physical Review 109, (1958)

[2] J. Simon et al. Science 327 (5961): 60-64

[3] S. Krishnamoorthy et al, Appl. Phys. Lett. 105, 141104 (2014).

[4] S. Krishnamoorth et al, Nano Lett. 13, 2570-2575 (2013).

[5] PCT International Utility Patent Application Serial No. PCT/US16/41744, filed on Jul. 11, 2016, by Erin C. Young, Benjamin P. Yonkee, John T. Leonard, Tal Margalith, James S. Speck, Steven P. DenBaars, and Shuji Nakamura, entitled "HYBRID GROWTH METHOD FOR III-NITRIDE TUNNEL JUNCTION DEVICES," (2003-224), which application claims the benefit under 35 U.S.C. § 119 of U.S. Provisional Application Ser. No. 62/190,929, filed on Jul. 10, 2015. by Erin C. Young, Benjamin P. Yonkee, John T. Leonard, Tal Margalith, James S. Speck, Steven P. DenBaars, and Shuji Nakamura, entitled "HYBRID GROWTH METHOD FOR III-NITRIDE TUNNEL JUNCTION DEVICES," (2015-904-1).

[6] E. C. Young, B. P. Yonkee, F. Wu, S. H. Oh, S. P. Den Baars, S. Nakamura, et al., Appl. Phys. Express. 9, 022102 (2016).

[7] John T. Leonard, Steven P. DenBaars, James S. Speck, and Shuji Nakamura, entitled "Demonstration of a III-nitride edge-emitting laser diode utilizing a GaN tunnel junction Contact," vol. 24, No. 7 | DOI:10.1364/OE.24.007816 | OPTICS EXPRESS 7816.

B. High Reflectivity Ohmic Contacts to N-type Gallium Nitride Utilizing Vacuum Annealed Aluminum High reflectivity contacts are especially important for high junction LEDs where n-GaN contacts will be used on the top and bottom of the device. Silver has the highest reflectivity but forms poor n-contacts. Alloyed aluminum contacts have low contact resistance but reflectivity is degraded.

One or more embodiments of the present invention disclose low resistance contacts to n-GaN using pure aluminum, which gave a reflectivity of approximately 85% for light having a wavelength of 450 nanometers (nm). Vacuum annealing without contact pads prevents mixing between aluminum and other metals that might be used for wire-bonding. Alternatively, the entire metal stack could be aluminum to save on cost. Using these contacts, only a small coverage area is needed due to the low resistivity. For an LED operating at 20 A/cm$^2$ and 3 V, a coverage as small as 1% of the LED area would reduce the efficiency by less than 0.01%. In addition, the low temperature anneals required for these contacts are compatible with many p-contact materials. III-Nitride devices can also have different crystal orientations which display different contact resistivities. Examples of the present invention demonstrate contacts to c-plane and (20-2-1) devices.

Example Structures

Figure 6A:
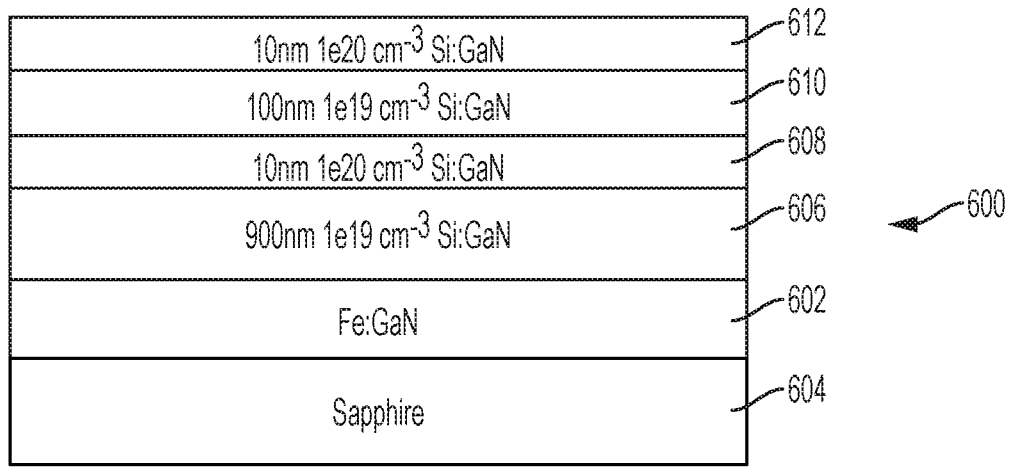
FIG. 6(a) shows the epitaxial structure for a c-plane sample, wherein an iron (Fe) doped layer is used as an insulating buffer.
Figure 6B:
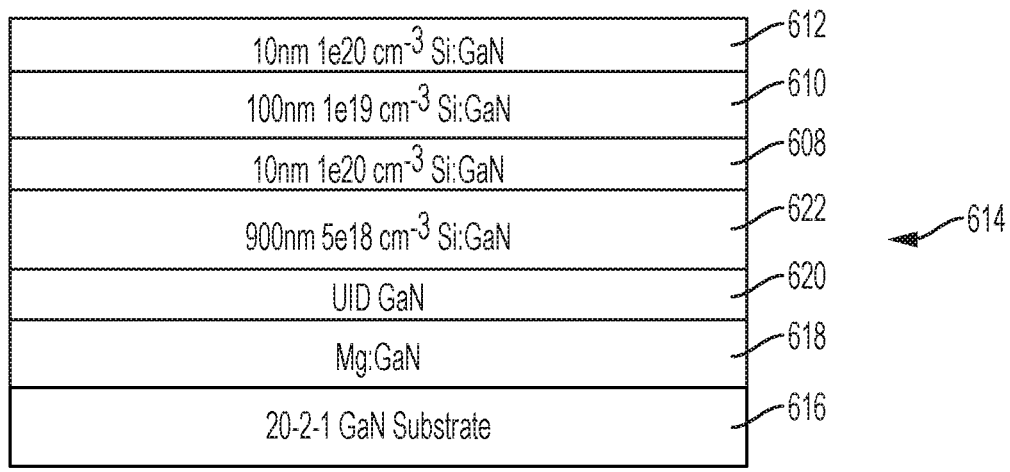
FIG. 6(b) shows the epitaxial structure for a (20-2-1) sample, wherein a magnesium (Mg) doped layer followed by an unintentionally doped (UID) layer is used as an insulating buffer and hydrogen was not annealed out of the Mg:GaN so the layer remains insulating.

The epitaxial structures for both samples are shown in FIG. 6(a) and FIG. 6(b).

C-plane epitaxial structure 600: For the c-plane samples, insulating Fe:GaN templates 602 on sapphire 604 were obtained from Saint-Gobain. A 900 nm thick layer of Si:GaN ([Si]: $1\times10^{19}$ cm$^3$) 606 was grown by ammonia Molecular Beam Epitaxy (MBE) on the substrate. A n$^+$-GaN/n-GaN/n$^+$-GaN ([Si]: $1\times10^{20}/1\times10^{19}/1\times10^{20}$ cm$^{-3}$) structure was then grown which simulated recent tunnel junction LED regrowths [1], forming layers 608, 610, 612. Contacts could then be deposited on the as grown n$^+$-GaN or the n$^+$ structure could be etched away to deposit contacts on the n-GaN layer beneath. This allows for both types of contacts that would be utilized in a tunnel junction LED to be studied.

Semipolar epitaxial structure 614: For the (20-2-1) samples, bulk GaN substrates 616 were obtained from Mitsubishi Chemical Corporation with a threading dislocation density of approximately $5\times10^6$ cm$^{-2}$. Using Metal Organic Chemical Vapor Deposition (MOCVD), a buried Mg doped layer 618 was grown as an isolation layer allowing for CTLM measurements to be made on the n-GaN. An unintentionally doped (UID layer) was then formed 620. A 900 nm thick layer of Si:GaN ([Si]: $5\times10^{18}$ cm$^{-3}$) 622 was then grown under the similar conditions as the standard template used in previous LED growths. After MOCVD growth, the same n+-GaN/n-GaN/n+-GaN structure of layers 608, 610, and 612 was then grown on top by ammonia MBE to allow for similar contact studies to be carried out.

Circular Transmission Line Method (CTLM) Structures

Figure 7:
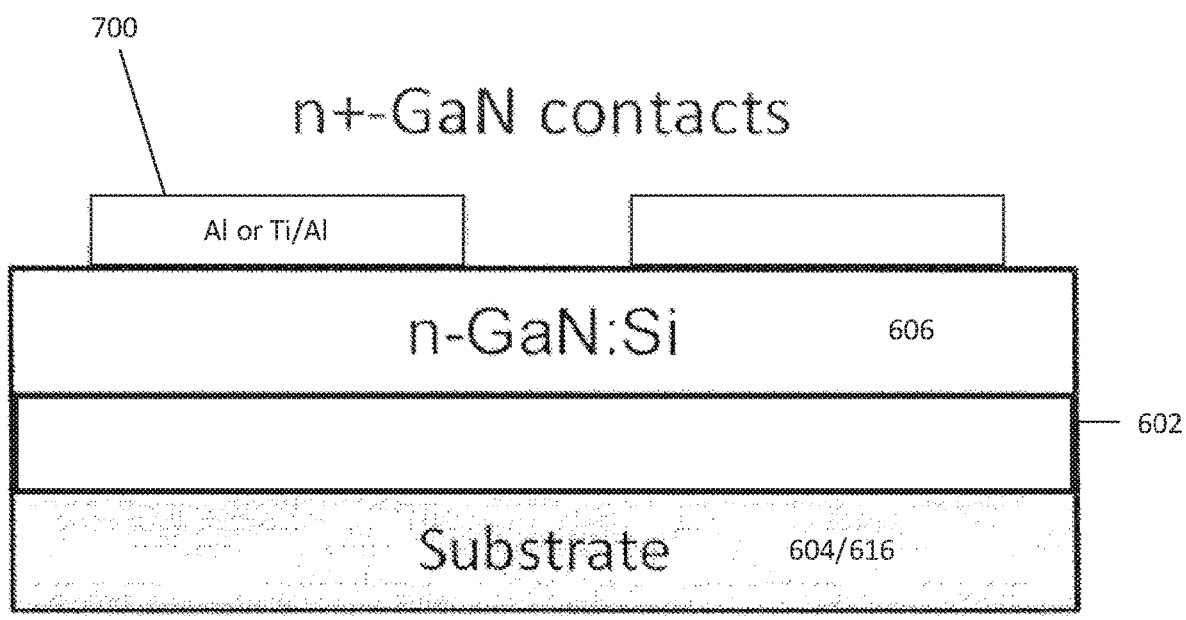
FIG. 7 shows the structure for measuring resistivity of the contacts.

The effects of SiCl$_4$ Reactive Ion Etching (RIE) or Cl$_2$/Ar Inductively Coupled Plasma (ICP) etching on the contact performance were investigated. For both chemistries, 300 nm of material was etched, which removed all n$^+$-GaN layers but left a thick layer of n-GaN 606 for CTLM measurements, as illustrated in FIG. 7. The SiCl$_4$ etch was carried out using a pressure of 10 mTorr, a power of 200 W, and a DC bias of 375V which gave an etch rate of 30 nm/min. The Cl$_2$/Ar etch was carried out using a pressure of 7.5 mTorr, an ICP power of 500 W and forward power of 200 W which gave an etch rate of 400 nanometers per minute (nm/min). All samples were then dipped in buffered hydrogen fluoride (BHF) for 30 seconds (s) to clean the surfaces. A CTLM structure was then patterned using photolithography and a 30 HCl dip was carried out before contact deposition. Using electron beam evaporation, a contact 700 comprising a 1000 nm thick layer of aluminum or a 1/1000 nm Ti/Al stack was deposited on the samples. Annealing was then carried out in a vacuum chamber with a base pressure $5\times10^{-8}$ Torr and with a temperature controlled by an in situ thermocouple. Samples were first annealed at 150° C. for 5 min to bake off atmospheric contaminants. The final anneal temperature was then ramped to and held for 10 minutes. The system took approximately 3-5 minutes (min) to ramp up to temperature and 15-30 minutes to cool down. The CTLM patterns were then measured using 4-point probes and the data was fit using equation (1), where R is the resistance measured, $R_{sh}$ is the semiconductor sheet resistance, r in the inner TLM circle radius, s is the gap spacing, and $\rho_c$ is the specific contact resistivity.

$$R=R_{sh}/2\pi(\ln(r+s/r)+\rho_c/R_{sh}(1/r+1/r+s)) \quad (1)$$

Figure 8A:
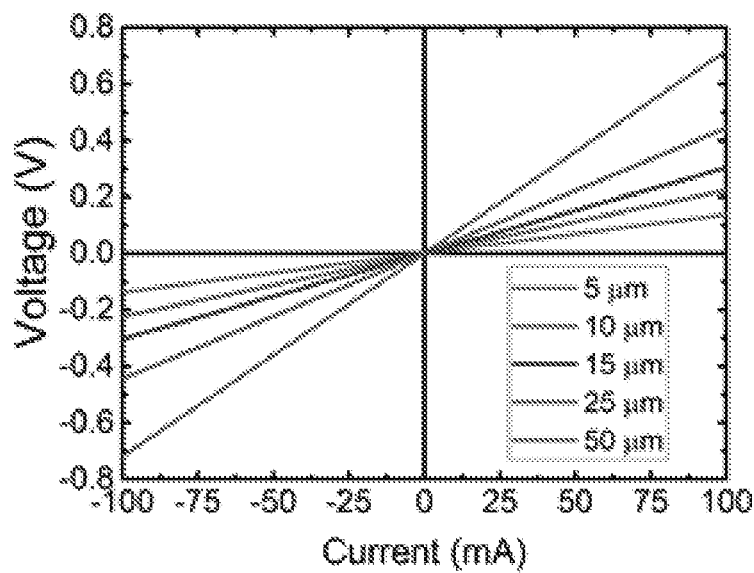
FIG. 8(a) show the current-voltage (IV) curves measured for the c-plane sample etched by SiCl₄ without annealing, wherein the curves are linear which indicates the contacts are Ohmic.
Figure 8B:
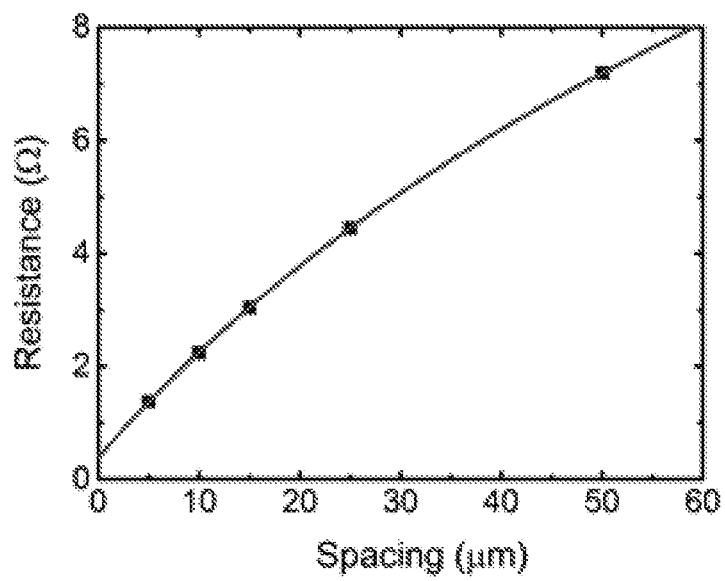
FIG. 8(b) plots the resistances measured for different Transmission Line Method (TLM) spacings and fitted with equation 1 (fit shown in blue), wherein the contact resistivity from this fit was found to be $4.4 \times 10^{-7}$ $\Omega cm^2$.

All contacts measured in this study displayed ohmic behavior which is required for the equation to be valid. FIG. 8(a) shows a sample CTLM plot for an as deposited Al contact to a c-plane sample.

Figure 9A:
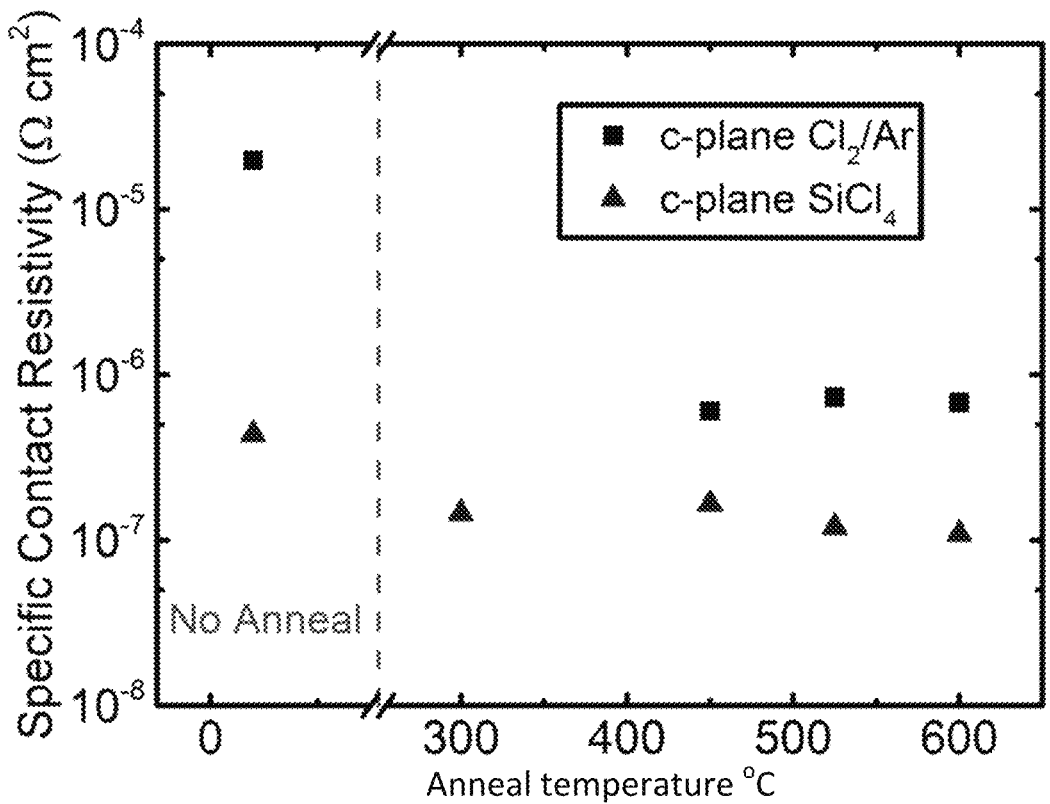
FIG. 9(a) shows specific contact resistivity of Aluminum (Al) contacts deposited on c-plane n-type GaN (n-GaN) etched with SiCl₄ or Cl₂/Ar, as a function of annealing temperature.

The effect of annealing temperature on aluminum contacts to c-plane samples with SiCl$_4$ and Cl$_2$/Ar etching is shown in FIG. 9(a). The specific contact resistivity for the Cl$_2$/Ar sample decreased from $2\times10^{-5}$ to $6.8\times10^{-7}$ Ωcm$^2$ as the annealing temperature was increased to 600° C. The samples etched in SiCl$_4$ had specific contact resistivities that decreased from $4.4\times10^{-7}$ to $1.1\times10^{-7}$ Ωcm$^2$ as the annealing temperature increased to 600° C.

Figure 9B:
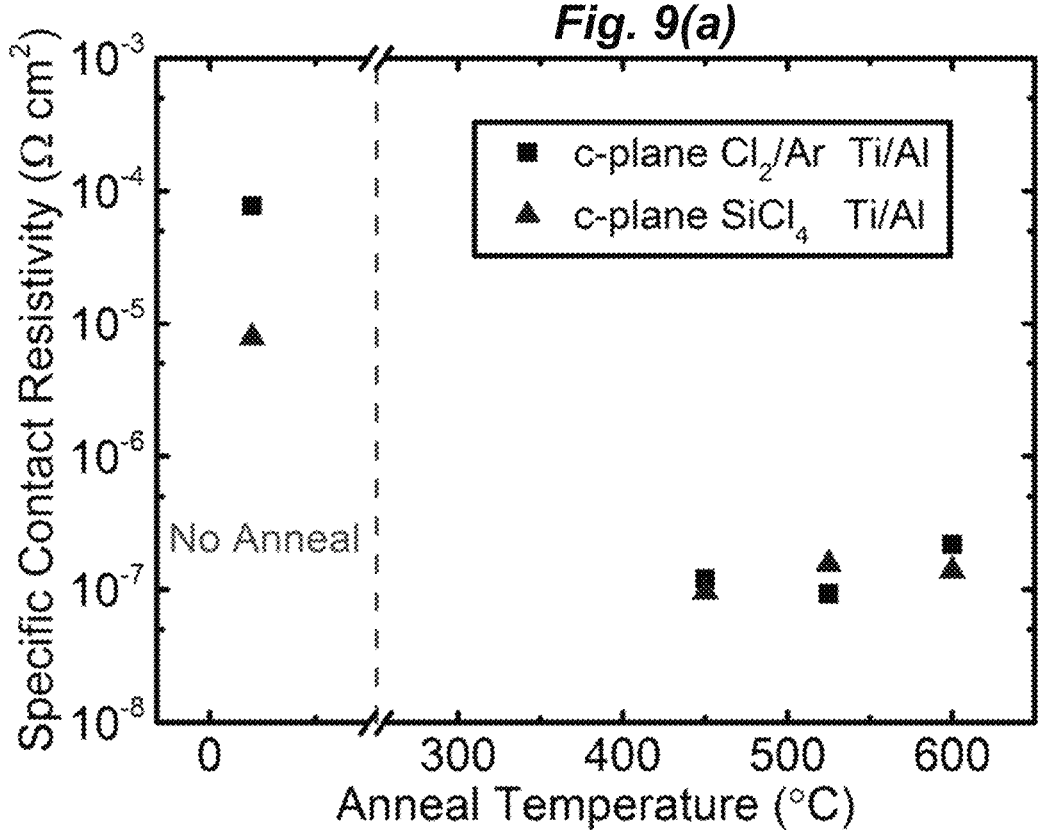
FIG. 9(b) shows specific contact resistivity of Ti/Al contacts deposited on c-plane n-GaN etched with SiCl₄ or Cl₂/Ar, as a function of annealing temperature.

Results for the same etch and anneal experiments with the Ti/Al contacts are shown in FIG. 9(b). The specific contact resistivities for as deposited contacts were $8\times10^{-5}$ and $8\times10^{-6}$ Ωcm$^2$ for the Cl$_2$/Ar and SiCl$_4$ samples, respectively. The annealed samples had specific contact resistivities ranging from approximately $1\text{-}2\times10^{-7}$ Ωcm$^2$ for anneals from 450 to 600° C., for both the Cl$_2$/Ar and SiCl$_4$ etching.

Figure 10A:
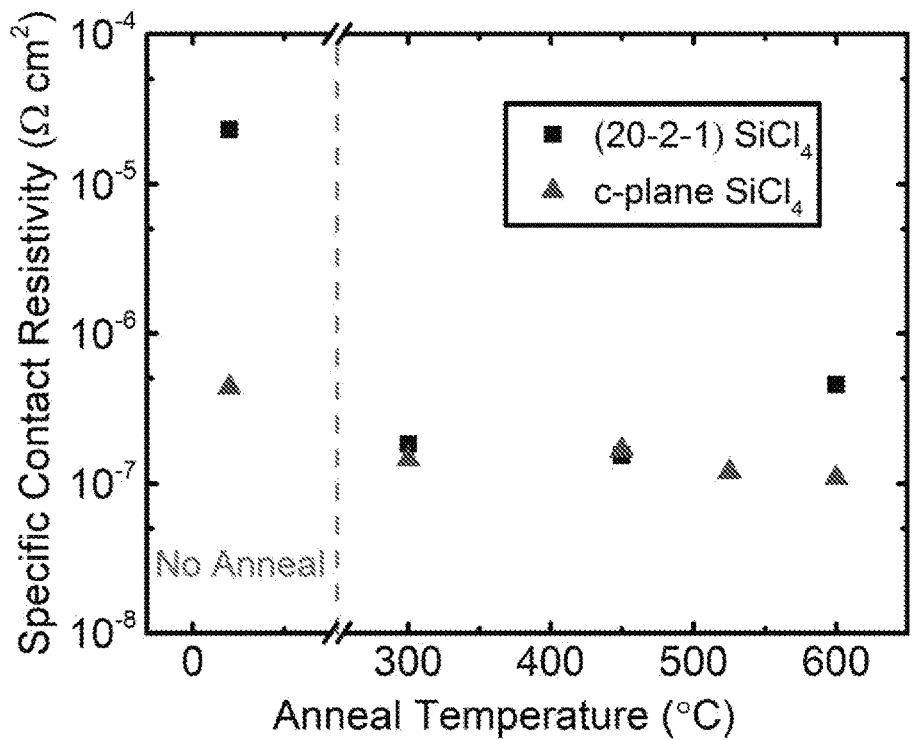
FIG. 10(a) shows specific contact resistivity of Al contacts deposited on c-plane or (20-2-1) n-GaN etched with SiCl₄, as a function of annealing temperature.

FIG. 10(a) shows a comparison of the aluminum contacts (to SiCl$_4$ etched n-GaN) for (20-2-1) and c-plane crystal orientations. As deposited, the c-plane sample showed a much lower contact resistivity than the (20-2-1) samples, but after annealing at 300° C. and 450° C. the two samples displayed similar resistivities. However, after annealing at 600° C. the (20-2-1) contact resistivity started to degrade while the c-plane sample continued to improve.

Figure 10B:
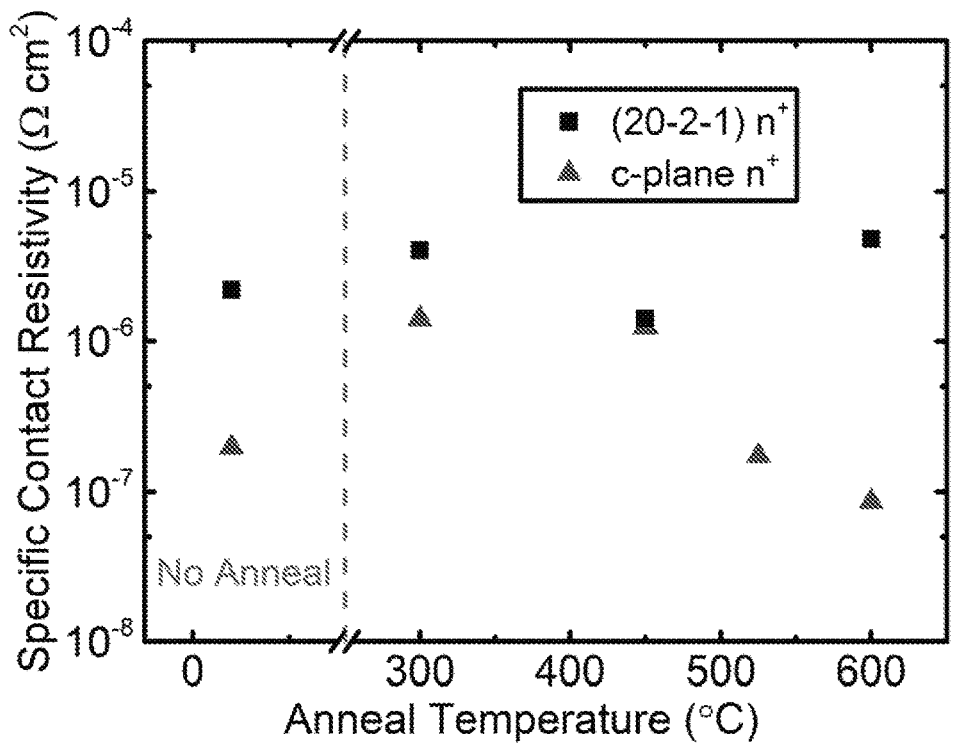
FIG. 10(b) shows specific contact resistivity of Al contacts deposited on c-plane or (20-2-1) n⁺-type GaN (n⁺-GaN), as a function of annealing temperature.

FIG. 10(b) shows a comparison of aluminum contacts deposited on n+-GaN ([Si]: $1\times10^{20}$) layers with no plasma treatment. The contact resistivity of the c-plane samples degrades in performance slightly after annealing at 300° C. and 450° C. before improving when annealed at 525° C. and 600° C. The (20-2-1) samples exhibited a similar trend for annealing temperatures up to 450° C. but showed a slight degradation when annealed at 600° C., similar to the SiCl$_4$ etched contacts.

Reflectivity Measurements

The data was measured using a Cary 500 spectrophotometer. The reflectivity data was normalized using a New Focus 5100 broadband dielectric mirror with a reflectivity over 99% over the range measured. Using measured transmission data and the transmission matrix method, the absorption coefficients of the substrates were calculated based on literature values for the real part of the refractive index [2,3].

Reflectivity data was measured for contacts deposited on as received DSP substrates 800, e.g., as illustrated in FIG.

Figure 11A:
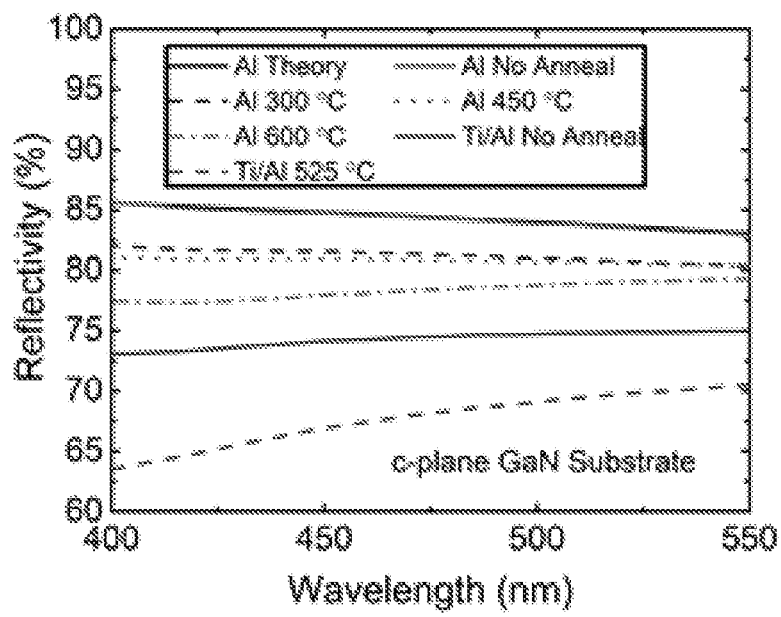
FIG. 11(a) shows reflectivity of Al or Ti/Al contacts deposited on a Double Side Polished (DSP) c-plane GaN substrate, as a function of annealing temperature.
Figure 11B:
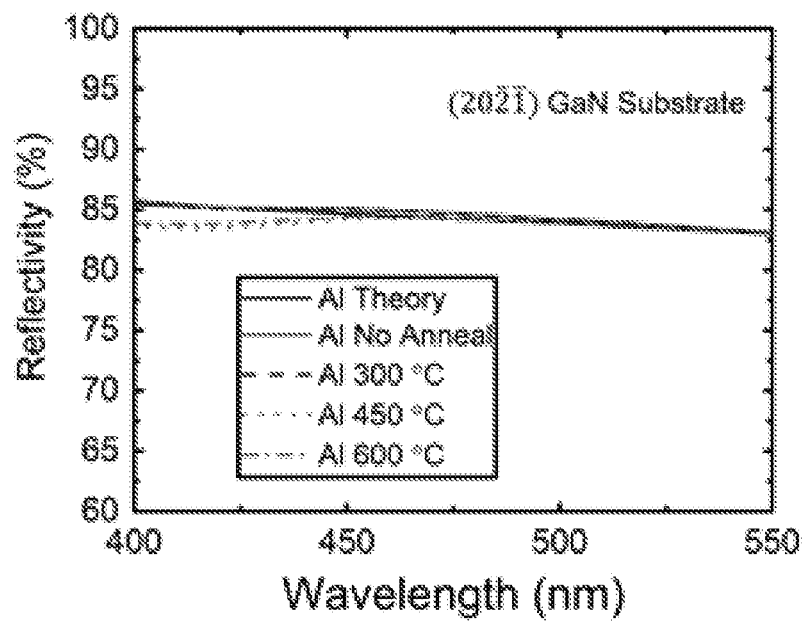
FIG. 11(b) shows reflectivity of Al contacts deposited on a DSP (20-2-1) GaN substrate, as a function of annealing temperature.

11(a). Contacts were deposited on the top side of the substrates and the reflectivity was measured through the backside. Using the refractive index and absorption data found from the bare substrates, the transmission matrix method was used to calculate the aluminum/GaN interface reflectivity. The results are shown in FIG. 11(a) for the c-plane sample and in FIG. 11(b) for the (20-2-1) sample, and are compared to theoretical values for the aluminum/GaN interface. FIG. 11(c) shows the set up for measuring reflectivity.

Both samples showed near theoretical reflectivities of approximately 85% for as deposited aluminum contacts. After annealing, the c-plane samples showed a slight reflectivity degradation with increasing annealing temperature. However, the (20-2-1) samples maintained high reflectivity even after a 600° C. anneal. The Ti/Al contacts showed a lower reflectivity than the Al contacts both before and after annealing.

LED Contacting

The combination of high reflectivity and low resistance for the contacts has the potential to increase LED efficiency by lowering operating voltage and increasing light extraction. After contact annealing, a Ni/Au gold pad or similar metal stack could be deposited for incorporation into a standard optoelectronic device process. Alternatively, pure aluminum electrodes and aluminum wire bonding could be used. By annealing before a pad deposition, the aluminum maintains its high reflectivity without mixing with other metals.

Process Steps

Figure 12:
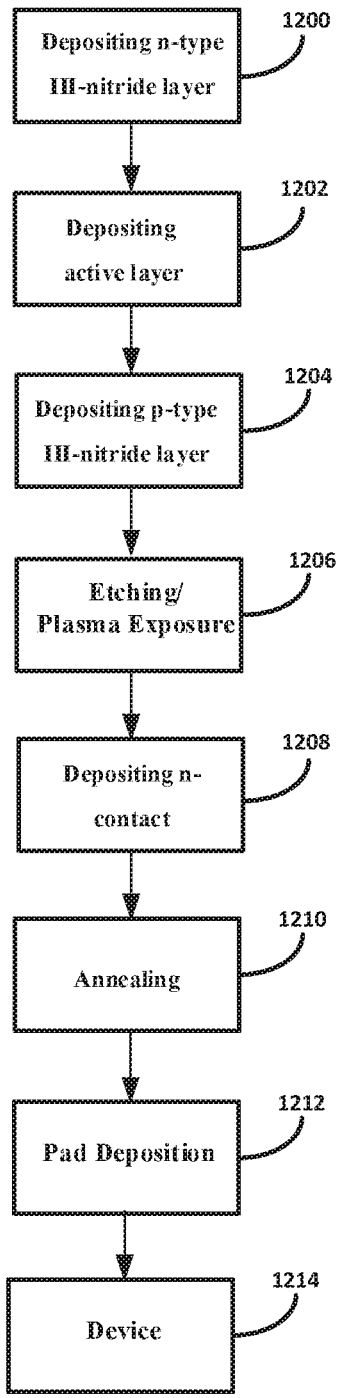
FIG. 12 is a flowchart illustrating a method of fabricating a device.

FIG. 12 is a flowchart illustrating a method of fabricating an optoelectronic device.

The method can comprise the following steps (referring also to FIGS. 2(a)-2(c) and FIG. 13).

Block 1200 represents depositing a first n-type III-nitride layer 214 (e.g., n-GaN) on or above a substrate 206. The substrate can comprise a foreign substrate supporting heteroepitaxial growth of III-nitride, including, but not limited to sapphire or spinel, or a homoepitaxial III-nitride substrate, including, but not limited to GaN, AlN, or InGaN, or a submount. The first n-type III-nitride layer can be deposited on a patterned surface of the foreign or homoepitaxial substrate. C-plane polar, semipolar, or nonpolar III-nitride substrates can be used to form polar, semipolar or nonpolar III-nitride device layers on the substrates.

Block 1202 represents depositing a III-nitride active layer 216 (e.g., InGaN quantum wells) on or above the first n-type III-nitride layer.

Block 1204 represents depositing a p-type III-nitride layer 218/232 (e.g., p-GaN) on or above the III-nitride active layer. Layers 400-404 can be deposited by MOCVD, for example.

Thus, blocks 1200-1204 illustrate an example of fabricating or obtaining a p-n junction structure 240 comprising a p-type layer 218 or material on or above an n-type layer 214 or material.

In one or more further embodiments, a second n-type III-nitride structure/layer 230 can be deposited on the p-type III-nitride layer 232 (as illustrated in block 406), forming a tunnel junction 234 between the second n-type III-nitride layer 230 and the p-type III-nitride layer 232. The second n-type III-nitride structure 230 can comprise a thicker n-type (e.g., Si) doped GaN layer (n$^+$ GaN) 208 between two thinner and more highly doped (e.g., Si) n-type GaN layers 210, 212 (first and second n$^+$ GaN). The first n$^+$-GaN layer 212 closest to the p-type III-nitride layer 232 can form the tunnel junction 234, the thicker n$^+$-GaN layer 208 can provide current spreading, and the second topmost n$^+$-GaN layer 210 can provide n-contact to the n-contact metallization 226. These layers can be deposited by MBE, for example. In other embodiments, III-nitride is used instead of GaN.

Block 1206 represents patterning or etching down to the first n-type III-nitride layer 214 and depositing metal 702 (aluminum) on the first n-type III-nitride layer 214. The step can comprise exposing the GaN/III-Nitride surface to SiCl$_4$ plasma to reduce the contact resistance of the aluminum deposited in Block 608.

Block 1208 represents depositing metal (aluminum), as an n-contact 1302, on the first n-type III-nitride layer 214. In an embodiment with a tunnel junction 234, metal (aluminum) can also be deposited on the topmost highly Si doped GaN layer 232 (second n$^+$GaN). The metal n-contacts formed can comprise at least 99% aluminum, Block 1210 represents annealing the metal (aluminum in contact 1302) in vacuum and/or in a low oxygen environment with a partial pressure of oxygen of less than $10^{-4}$ torr. In one or more embodiments, an annealing temperature less than 660° C. is used.

Block 1212 represents depositing a subsequent metal stack (e.g., pads 1304) on the aluminum for wire bonding or die attachment.

Block 1214 represents the end result, an electronic or optoelectronic device 1300 such as a laser diode or LED.

Figure 13:
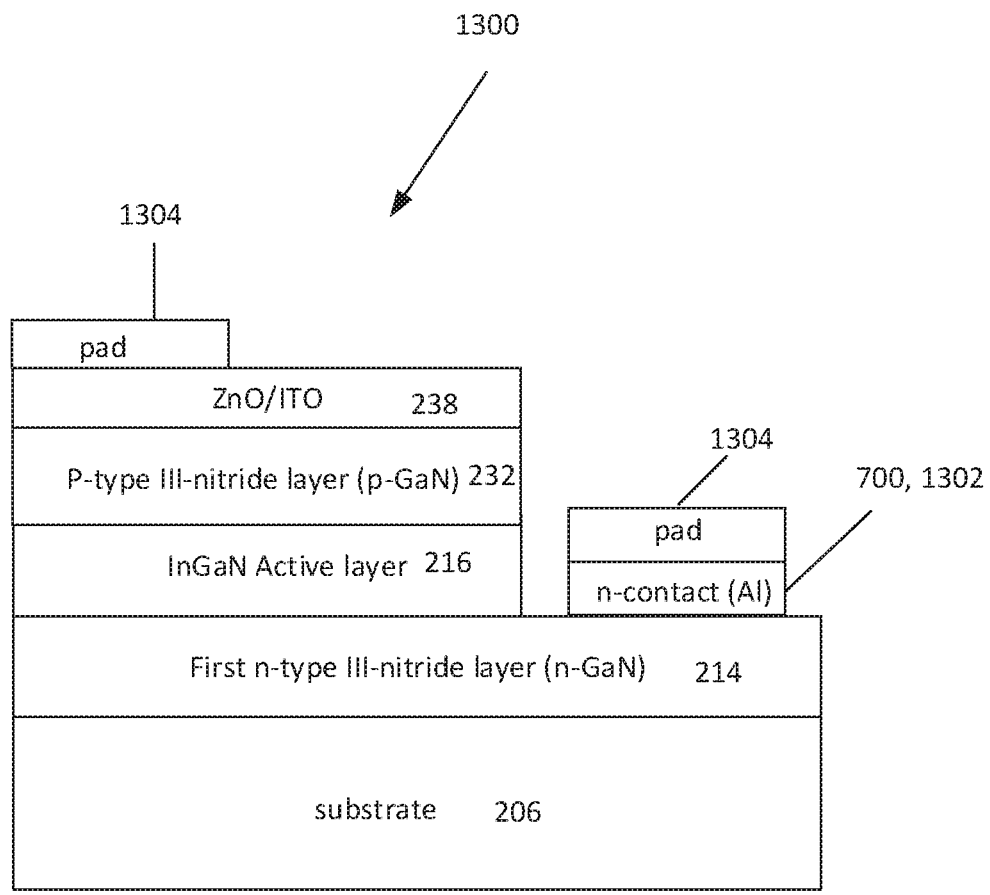
FIG. 13 is a schematic cross-section of a device fabricated according to one or more embodiments of the invention.

The present invention is not limited to the use of a tunnel junction devices. For example, the vacuum annealed aluminum contacts can be used in traditional LEDs (e.g., as illustrated in FIG. 13), lasers, and other electronic devices.

One example of a TJ device 222, 500 comprises a first n-type III-nitride layer (n-GaN) 214 on or above a substrate 206; a III-nitride (e.g., InGaN) active layer 216 on or above the n-type III-nitride layer 214; a p-type III-nitride layer 232 (e.g., p-GaN) on or above the III-nitride active layer 216; a second n-type ill-nitride structure 230 (e.g., Si:GaN) on the p-type III-nitride layer 232, forming a tunnel junction 234 between the second n-type III-nitride layer 230 and the p-type III-nitride layer 232, the second n-type III-nitride structure comprising, e.g., an n-type doped III-nitride 208 (e.g., GaN) layer between two more highly n-type doped layers 210, 212 (e.g., first and second n+ GaN layers), n-contact 1202, 226 to the first n-type III-nitride layer 214, and n-contact 1202, 508 to the topmost more highly n-type doped III-nitride layer 210 (e.g., n$^+$-type GaN). Examples of TJ devices that can use the n-contacts 1202, 226, 508 fabricated according to one or more embodiments of the present invention include other devices described herein.

In the case where the device is a laser diode (edge emitting laser diode or vertical cavity surface emitting laser), additional layers (e.g., waveguiding layers) can be added. One or more embodiments of the present invention could be applied to the device structures in [1] and [4]. Device layers can be modified to fabricate electronic devices, such as transistors, or solar cells.

In one or more embodiments, the III-nitride optoelectronic or electronic device 1300, comprises an n-type contact (n-contact) 700, 1302 to the device, the n-contact 700, 1302 including at least aluminum and the n-contact 700, 1302 having a specific contact resistivity below $1 \times 10^{-6}$ $\Omega$cm$^2$. In one or more embodiments, a reflectivity of the contact 700, 1302 is higher than 80% for light having a wavelength of 450 nm. In one or more embodiments, SiCl$_4$ plasma exposure is used to reduce the contact resistance of the aluminum. In one or more embodiments, the majority (e.g., at least 99%) of the metal deposited during processing steps is aluminum.

In one or more embodiments, the optoelectronic or electronic device comprises a p-n junction structure comprising a p-type III-nitride layer 232 on or above an n-type III-nitride layer 214 or an active region between the p-type layer 232 and the n-type layer 214); an n-contact 700, 1302 on the n-type III-nitride layer 214, the n-contact 1302 comprising or consisting essentially of aluminum; and pad metal 1304 on the n-contacts 1302, wherein the n-contact 1302 has a specific contact resistivity below $1 \times 10^{-6}$ $\Omega cm^2$ and/or a reflectivity higher than 80% for light having a wavelength of 450 nm.

Advantages and Improvements

The present invention describes a method for improving the performance of III-nitride devices.

High power III-Nitride LEDs have gained widespread use in high efficiency white lighting. Modern LEDs can have wall plug efficiencies of over 80% but to achieve these efficiencies, the internal quantum efficiency (IQE), light extraction, and electrical must be near unity. Much work has been done on the IQE which can have peak values of over 90% for optimized c-plane structures. The forward voltage is also important, but light extraction must not be sacrificed for lower voltage. This has led to research on transparent conducting oxide or silver based p-contacts. The previous literature on n-GaN contacts is focused on producing low resistance contacts with little work focusing on the reflectivity.

Embodiments of the present invention achieve high reflectivity ohmic contacts to n-GaN ($SiCl_4$ etched n-GaN and n+-GaN) with no plasma treatment. By annealing c-plane n-GaN samples at 600° C. the contact resistivities were reduced to $1.09 \times 10^{-7}$ and $8.6 \times 10^{-8}$ $\Omega cm^2$ for n-GaN and n+-GaN, respectively. By using a 1 nm thick layer of titanium on the aluminum, the contact resistivities for both $SiCl_4$ and $Cl_2/Ar$ etched n-GaN were reduced below $1 \times 10^{-7}$ $\Omega/cm^2$ on c-plane samples. On (20-2-1) GaN, the optimum annealing temperature was found to be 450° C. which gave resistivities of $1.5 \times 10^{-7}$ and $1.4 \times 10^{-6}$ $\Omega cm^2$ for n-GaN and n+-GaN, respectively.

The reflectivity of unannealed aluminum on DSP bulk GaN substrates shows near theoretical reflectivity. For c-plane samples, the reflectivity decreases with increasing annealing temperature, while for (20-2-1) samples the reflectivity stays nearly constant for all annealing conditions used. The low contact resistivity combined with high reflectivity is promising for use in LEDs which could reduce optical and electrical loss associated with n-GaN contacts. The contacts' resistivities are also low enough to be incorporated into high efficiency laser diodes without the need for high temperature annealing.

This present invention could improve the efficiency of III-Nitride LEDs by improving the light extraction out of the chip. This would reduce the energy use of LEDs and allow for more power out of a single chip.

References for Part B (Incorporated by Reference Herein)

[1] E. C. Young, B. P. Yonkee, F. Wu, S. H. Oh, S. P. Den Baars, S. Nakamura, et al., Appl. Phys. Express. 9, 022102 (2016).

[2] C. X. Lian, X. Y. Li, I Liu, Semicond, Sci. Technol. 19, 417-420 (2003).

[3] K. M. McPeak, S. V. Jayanti, S. J. P. Kress, S. Meyer, S. Iotti, A. Rossinelli, et al., ACS Photonics. 2, 326-333 (2015).

[4] John T. Leonard, Steven P. DenBaars, James S. Speck, and Shuji Nakamura, entitled "Demonstration of a III-nitride edge-emitting laser diode utilizing a GaN tunnel junction Contact," vol. 24, No. 7|DOI:10.1364/OE24.007816|OPTICS EXPRESS 7816.

[5] Yonkee et. al., "Silver free III-nitride flip chip light emitting diode with wall plug efficiency over 70% utilizing a GaN tunnel junction," Applied Physics Letters, Volume 109, Issue 19, id.191104.

C. III-Nitride Tunnel Junction Light Emitting Diode with High Electrostatic Discharge (ESD) Rating A very highly doped ($n^+/p^+$) interface can allow for electrons to tunnel between the valence band and conduction band. This was first demonstrated by Esaki in highly doped Ge homojunctions [1] with very thin depletion regions (this type of diode is also known as a tunnel junction).

A low resistance tunnel junction could expand the design space of III-Nitride based LEDs, Edge Emitting Laser Diodes (EELDs), Vertical Cavity Surface Emitting Lasers (VCSELs), and multi junction solar cells. A tunnel junction incorporated into these optoelectronic devices allows for the epitaxial structure of the device to use n-(Al,In,Ga)N on both sides, which could eliminate p-contacts and replace them with lower resistance n-contacts.

In addition, n-(Al,In,Ga)N can be used as an effective current spreading layer. The use of n-(Al,In,Ga)N for current spreading would allow for the elimination of a transparent conducting oxide (TCO) or a silver mirror in an optoelectronic device design.

There have been a number of difficulties in achieving high quality tunnel junctions in the GaN system. GaN is a wide bandgap semiconductor, so the barrier for tunneling is high. Several approaches to reducing the tunneling barrier have been attempted, including bandgap engineering via polarization (AlN interlayers) [2], reducing the bandgap with an InGaN interlayer [3], and introducing defect states via interfacial GdN nanoparticles [4]. However, all of these approaches are associated with losses (either in terms of voltage or resistance increases, or optical losses) in the final device performance. In principle, a highly doped Esaki type homojunction diode should provide the lowest-loss tunnel junction. However, magnesium doped p-GaN grown by Metal Organic Chemical Vapor Deposition (MOCVD) is compensated by hydrogen as grown, and it must be annealed after growth to remove hydrogen. This anneal can only work if the p-GaN is not covered by n-GaN, as hydrogen cannot easily diffuse through n-GaN. This limits the effectiveness of tunnel junctions and prevents their widespread use. Unlike MOCVD grown p-GaN, MBE p-GaN is conductive as grown, which would allow for its use in a tunnel junction. Additionally, the doping limits of MBE materials are higher than MOCVD which means that MBE could allow for better tunnel junctions. In a previous disclosure, [5] it was shown that, by combining MOCVD grown light emitters and MBE grown tunnel junctions, one could reduce the operating voltage devices and increase the efficiency.

One or more embodiments of the present invention demonstrate the use of an n-type III-Nitride layer in combination with a tunnel junction to effectively eliminate current crowding and therefore achieve a higher ESD rating.

Example Structure

Figure 14:
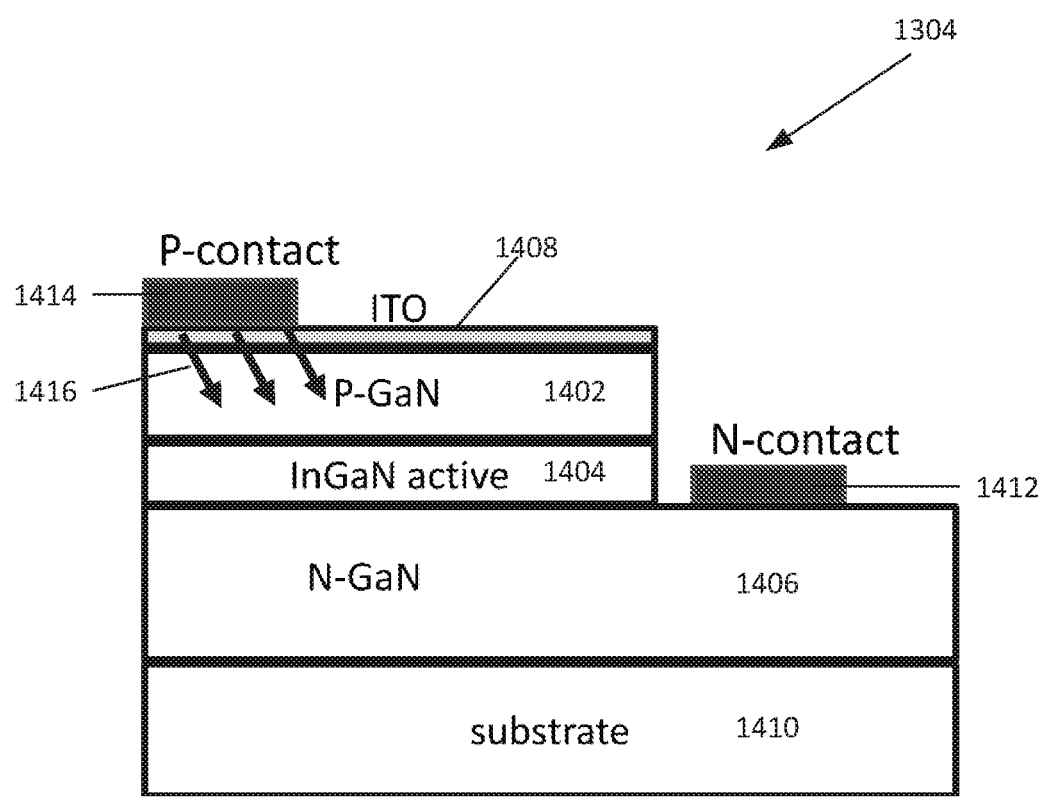
FIG. 14 is a cross-sectional schematic illustrating current crowding in a conventional LED.

FIG. 2(a) illustrates the epitaxial structure and the device design for the TJ LEDs. An Molecular Beam Epitaxy (MBE) regrowth is carried out on a standard Metal Organic Chemical Vapor Deposition (MOCVD) LED epitaxial structure grown on a patterned sapphire substrate to produce a tunnel junction contact. In a conventional LED 1400 (comprising e.g., p-GaN 1402, InGaN active layer 1404, n-GaN layer 1406, ITO 1408, substrate 1410, n-contact 1412, and p-contact 1414), current crowding (as illustrated by the arrows 1416 representing current flow) occurs under the p-contact 1414 in the p-GaN region 1402, as shown in FIG. 14. The semi-transparent Indium Tin Oxide (ITO) 1408 is typically less than 150 nanometers (nm) thick due to optical absorption and has a sheet resistance typically greater than 10 ohm/square, so it does not eliminate the current crowding 1416 under the contact 1414.

Figure 15:
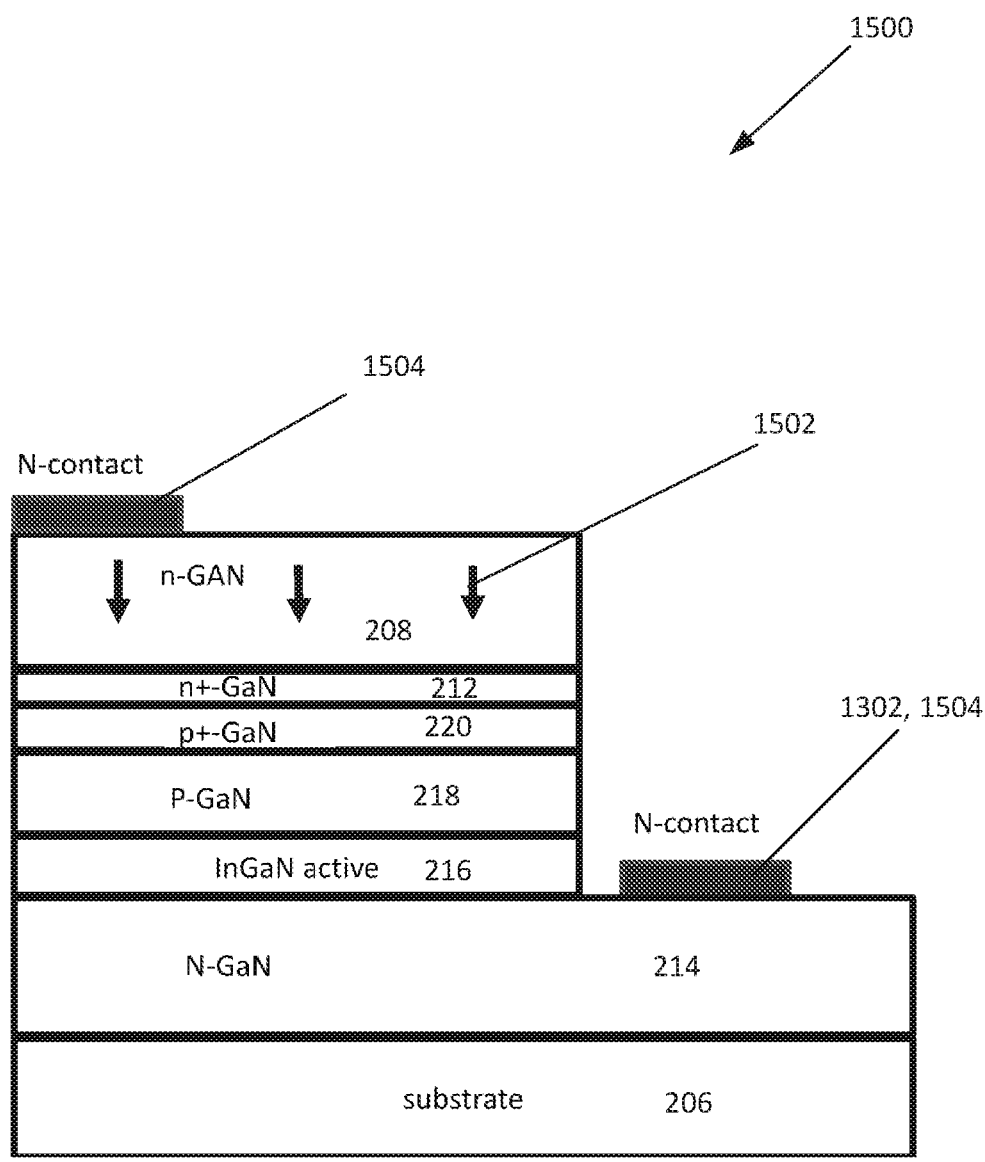
FIG. 15 is a cross-sectional schematic illustrating an n-type III-Nitride layer in a Tunnel Junction LED according to an embodiment of the present invention, wherein the n-type III-Nitride layer allows for uniform current spreading and less current crowding.

FIG. 15 illustrates an LED 1500 according to one or more embodiments of the present invention and the use of the n-type III-Nitride layer 208, 212 in combination with a tunnel junction 234 to effectively eliminate current crowding (current flow 1502 in FIG. 15 is less crowded as compared to the LED in FIG. 14 without the TJ) and therefore achieve a higher ESD rating. N-contacts 1504 are also shown. The ESD rating for conventional GaN LEDs, as illustrated in FIG. 13, is typically around 500 Volts (V) to 1000 V. This is primarily due to the poor current spreading from the p-contacts 1414 and n-contacts 1412 in the device [6]. By using the tunnel junction in combination with the n-type III-Nitride layers, as illustrated in FIG. 15, for example, an ESD rating greater than Class 1C (>1000 V) is expected [7].

Working TJ LEDs have been packaged and tested, demonstrating an External Quantum Efficiency of 76% (illustrating the effectiveness of the TJ LED).

Table illustrating ESD Ratings per ESD STM 5.1-1998 from (www.edsa.org/documents/esdfunds.5print.pdf).

| Class | Voltage Range |
| --- | --- |
| Class 0 | <250 volts |
| Class 1A | 250 volts to <500 volts |
| Class 1B | 500 volts to <1,000 volts |
| Class 1C | 1000 volts to <2,000 volts |
| Class 2 | 2000 volts to <4,000 volts |
| Class 3A | 4000 volts to <8000 volts |
| Class 3B | >=8000 volts |

Possible Modifications

FIG. 15 illustrates an embodiment comprising a III-Nitride optoelectronic device (e.g., laser, laser diode, solar cell, detector, or photodetector, or LED 1500) including a tunnel junction 236 on or above an active region 216 and utilizing n-type III-Nitride layers 208, 212 (e.g., n-type GaN or n-GaN) for current spreading (illustrated by the spaced arrows 1502 in FIG. 15) on at least one side (e.g., both sides) of the active region 216 (e.g., InGaN) and that is capable of achieving a high Electrostatic Discharge (ESD) rating (e.g., ESD over 1000 V). FIG. 15 further illustrates metal contacts (n-contacts 1204, 1504).

In one or more embodiments, the device utilizes an n-type III-Nitride layer 214, 208 for current spreading on one side of the device.

In one or more embodiments, the n-type III-Nitride layers 214, 208, 212 include an (Al,Ga,In)N superlattice structure.

In one or more embodiments, the n-type III-Nitride layers 214, 208, 212 include n-GaN and an (Al,Ga,In)N superlattice structure.

In one or more embodiments, the n-type layers 214, 208, 212 include an (Al,Ga,In)N superlattice structure.

In one or more embodiments, the device's 1500 substrate 206 is composed of GaN, sapphire, SiC, or silicon.

In one or more embodiments, a semi-transparent transparent conducting oxide layer 238 is included.

In one or more embodiments, the device 1500, 222 comprises a metallic reflector 226 and aluminum or silver are used as the metallic reflector 226.

In one or more embodiments, the device 1500, 222 includes a dielectric coating 224 and the dielectric coating 224 is a multi-layer stack of alternating dielectrics.

In one or more embodiments, via metal contacts 226 go through the dielectric coating 224 to allow for contact metallization.

In one or more embodiments, one or more of the metal contacts (n-contact 1504) are replaced with a transparent conducting oxide.

Embodiments describing a metallic reflector and/or dielectric coating and/or transparent conducting layers are described herein (e.g., FIG. 5). In one or more embodiments, the optoelectronic device is a laser, a solar cell, or photodetector.

Advantages and Improvements

Current commercially-available III-nitride light-emitting diodes (LEDs) use an active region in a biased p-n junction to allow for electron and hole injection. The p-GaN is difficult to contact electrically and has low hole concentration and mobility. This means that p-GaN cannot be used as a current spreading layer and that traditional p-contacts will add significant voltage to devices. Despite these inherent problems, all commercial light emitting devices utilize a p-contact and a material other than p-GaN for current spreading, typically transparent conducting oxides (TCO).

A very highly doped ($n^+/p^+$) interface can allow for electrons to tunnel between the valence band and conduction band and is called a tunnel junction (TJ). A low resistance tunnel junction on top of p-GaN allows for current spreading in n-type III-Nitride on one side or both sides of the device active layer, as well as the use of low resistance n-type metal contacts on both sides. The use of n-type III-Nitride for current spreading allows for the elimination of a transparent conducting oxide (TCO) or silver mirror in an LED design.

Furthermore, the present invention could improve the ESD strength of III-Nitride LEDs by improving the effective lateral current spreading—hence the peak voltage of electrostatic discharge is dramatically increased, allowing for improved performance and higher LED device yield.

References for Part C (Incorporated by Reference Herein)

[1] L. Esaki, Physical Review 109, (1958)

[2] J. Simon et al. Science 327 (5961): 60-64

[3] S. Krishnamoorthy et al, Appl. Phys. Lett. 105, 141104 (2014).

[4] S. Krishnamoorth et al, Nano Lett. 13, 2570-2575 (2013).

[5] PCT International Utility Patent Application Serial No. PCT/US16/41744, filed on Jul. 11, 2016, by Erin C. Young, Benjamin P. Yonkee, John T. Leonard, Tal Margalith, James S. Speck, Steven P. DenBaars, and Shuji Nakamura, entitled "HYBRID GROWTH METHOD FOR HI-NITRIDE TUNNEL JUNCTION DEVICES," (2015-904), which application claims the benefit under 35 U.S.C. § 119 of U.S. Provisional Application Ser. No. 62/190,929, filed on Jul. 10, 2015, by Erin C. Young, Benjamin P. Yonkee, John T. Leonard, Tal Margalith, James S. Speck, Steven P. DenBaars, and Shuji Nakamura, entitled "HYBRID GROWTH METHOD FOR III-NITRIDE TUNNEL JUNCTION DEVICES," (2015-904-1);

[6] Jang, Chung-Hsun, Improved Performance of GaN-Based Blue LEDs With the InGaN Insertion Layer Between the MQW Active Layer and the n-GaN Cladding Layer IEEE Journal of Quantum Electronics [0018-9197] vol:46 iss:4 pg:513-517 (2010).

[7] ESD Ratings per ESD 5.1-1998 from www.edsa.org/documents/esdfunds5print.pdf.

D. (Al, In, Ga, B)N Device Structures

The usefulness of gallium nitride (GaN), and its ternary and quaternary compounds incorporating aluminum and indium (AlGaN, InGaN, AlInGaN), has been well established for fabrication of visible and ultraviolet optoelectronic devices and high-power electronic devices. These devices are typically grown epitaxially using growth techniques including molecular beam epitaxy (MBE), metalorganic chemical vapor deposition (MOCVD), and hydride vapor phase epitaxy (HVPE).

Nitride based optoelectronic devices began their quick ascent into commercialization with the advent of the use of a thin nucleation layer prior to the deposition of high quality GaN. This technique is employed due to the lack of a native substrate available for GaN growth. Later techniques such as the development of p-type GaN by magnesium doping followed by high temperature anneal also proved vital. However, the development of using InGaN as the active layer for short wavelength devices allowed nitride based Light Emitting Diodes (LEDs) and laser diodes (LDs) to overtake many other research ventures and has now become the dominant material system used for visible light semiconductor applications.

The external quantum efficiency or total efficiency ($\eta_L$) of LEDs can be defined by the following equation:

$$\eta_L = \eta_{int}\eta_{inj}\eta_{ext},$$

where the extraction efficiency, $\eta_{ext}$, is defined as the amount of photons extracted, the injection efficiency, $\eta_{inj}$, is defined as the amount of carriers injected into the active region of the device, and the internal quantum efficiency, $\eta_{int}$, is defined as the amount of photons generated in the active region of the device. The internal quantum efficiency of a device can be maximized by reducing the number of non-radiative centers, such as defects and impurities. The internal quantum and injection efficiency of nitride based LEDs have already been improved to a high level by optimizing the deposition conditions of the device layers. Therefore, further improvement in external efficiency of a device would require improvement in the extraction efficiency.

Ultraviolet LEDs (UVLED) have recently become of great interest due to the many commercial applications. However, there remain significant challenges to the realization of a high efficiency UVLED. Chiefly among these challenges is the lack of a transparent electrical contact. Lack of a transparent contact leads to a decrease in the external quantum efficiency by reducing the light extraction efficiency of these devices.

One approach to improve light extraction from UVLED nitride devices is to use a metal mirror as an electrical contact. The metal mirror aids in extracting the light emission from the active region of the device by allowing the emitted light to be reflected to a given direction. These metal mirrors are often made of silver and or aluminum. However, these mirrors often have to incorporate other metals in order to obtain a low resistance electrical contact to the semiconductor material. Because of this, metals such as nickel and gold are mixed or deposited prior to the deposition of the mirror in order to obtain a low resistance electrical contact to the semiconductor. While a low resistance contact can be obtained using the above method, the reflectivity of the mirror is greatly diminished by the addition of these metals. In addition to metal mirrors, dielectric mirrors have also been employed. However, due to their poor electrical contact and electrical properties, dielectric mirrors are not suitable for high efficiency devices. Thus, a mirror with high reflectivity and low electrical contact resistance is challenging to realize.

In addition, because of the very low conductivity of the Mg-doped AlGaN layer and Mg-doped GaN layers, p-type ohmic contacts are difficult to achieve. Additionally, due to the high lateral resistance of these layers, uniform current spreading is also difficult to achieve. One way to improve the contact resistance and current spreading problem in nitride based LEDs is to insert a tunnel junction. This is typically achieved by the deposition a highly doped n-type layer above the p-type nitride layer. Electrical contact and current spreading can then occur in the higher conductivity n-type layer. However, this technique does not address light being absorbed from the electrical contact whether a tunnel junction or a more standard structure is used. As a result, there is a need for improved device design structures on nitride based devices, wherein the device structure minimizes the deleterious effects present in conventional light emitting nitride device structures with tunnel junctions, an ohmic electrical contact, and a highly reflective mirror. The present invention satisfies this need.

The present section describes nitride light emitting device structures incorporating a spacer region on or above a second n-type region which forms a tunnel junction via MOCVD (Metal Organic Chemical Vapor Deposition) or other growth techniques. The use of a spacer region on or above a second n-type region which forms a tunnel junction incorporated into light emitting devices offers a means of improving the nitride light emitting device performance. The term nitrides refers to any alloy composition of the (Ga, Al, In, B)N semiconductors having the formula $Ga_nAl_xIn_yB_zN$ where:

$$0 \leq n \leq 1,\ 0 \leq x \leq 1,\ 0 \leq y \leq 1,\ 0 \leq z \leq 1,\ \text{and}\ n+x+y+z=1$$

Current nitride light emitting devices structures comprise structures without a spacer region on or above a second n-type region which forms a tunnel junction. Nitride light emitting device structures incorporating a spacer region on or above a second n-type region which forms a tunnel junction provide a means of enhancing the performance of nitride LEDs by greatly enhancing the device output power at constant current. The present invention provides a means of enhancing nitride device performance of nitride LEDs.

Embodiment 1

FIG. 16 is a schematic sectional view showing the structure of a nitride semiconductor device (an LED device) according to the first embodiment of the present invention. This LED comprises a first n-type region 1 (e.g., made of $Al_xIn_yGa_{1-x-y}N$ ($0 \leq x \leq 1$ and $0 \leq y \leq 1$) doped with silicon) which forms an electrical contact to a first n-electrode 8. The LED further comprises (deposited successively in the following order on the first n-type region 1): an active region 2 comprising a quantum well or multiple quantum well structure made of $Al_xIn_yGa_{1-x-y}N$ ($0 \leq x \leq 1$ and $0 \leq y \leq 1$)/$Al_xIn_yGa_{1-x-y}N$ ($0 \leq x'1$ and $0 \leq y \leq 1$) (closest to the first n-type region 1 surface), a p-type region 3 made of $Al_xIn_yGa_{1-x-y}N$ ($0 \leq x \leq 1$ and $0 \leq y \leq 1$) doped with magnesium), at least one second n-type region 4 (e.g., comprising/composed of $Al_xIn_yGa_{1-x-y}N$ ($0 \leq < x \leq 1$ and $0 \leq y \leq 1$)) on or above the p-type region 3, at least one spacer region 5 (e.g., comprising/composed of $Al_xIn_yGa_{1-x-y}N$ ($0 \leq x \leq 1$ and $0 \leq y \leq 1$) doped with silicon), at least one mirror region 6 (e.g., comprising/composed of silver or aluminum or a dielectric), and at least one second n-electrode/contact region 7 which makes electrical contact to the second n-type region 4 (furthest from the first n-type region 1 surface).

FIG. 16 shows the nitride semiconductor device according to the first embodiment includes the spacer region 5 deposited above the second n-type region 4 so as to only partially cover the second n-type region 4.

On the other hand, the spacer region may be deposited on or above the second n-type region, wherein the second n-type region is completely covered by said spacer region. Further steps may then be performed, such as etching, in order to expose the second n-type region. These steps may include properly masking said spacer region followed by reactive ion etching (RIE) to remove a portion of said spacer region in order to expose the second n-type region.

In a preferred embodiment, the at least one quantum well structure has a bandgap less than the bandgap of the spacer region. This allows for the said spacer region to not absorb any of the light emitted from the active region.

In another preferred embodiment, the spacer region 5 is doped with silicon or is unintentionally doped such that the resistance/resistivity of the spacer region is higher than that of the second n-type region 4. This allows for the current flowing through the device to preferentially flow through the second n-type region.

In another preferred embodiment, the active region 2 contains some aluminum and/or indium and/or gallium and/or boron such that the alloy composition of the (Ga, Al, In, B)N active region has the formula $Ga_nAl_xIn_yB_zN$ where: $0 \leq n \leq 1$, $0 \leq x \leq 1$, $0 \leq y \leq 1$, $0 \leq z \leq 1$, and $n+x+y+z=1$.

In one or more embodiments, the n-type region 1, p-type region 3, active region 2, second n-type region 4, and/or spacer region 5 are intentionally doped with magnesium, boron, silicon, carbon, zinc, and/or oxygen.

In another preferred embodiment, the second n-type region 4 forms a tunnel junction with the p-type region 3.

In another preferred embodiment, the second n-type region 4 has a larger bandgap than the active region 2. This allows for the second n-type region 4 to not absorb any of the light emitted from the active region 2.

In another preferred embodiment, the p-type region 3 has a larger bandgap than the active region 2. This allows for the p-type region 3 to not absorb any of the light emitted from the active region 2.

In another preferred embodiment, the spacer region 5 contains some aluminum and/or indium and/or gallium and/or boron such that the alloy composition of the (Ga, Al, In, B)N active region has the formula $Ga_nAl_xIn_yB_zN$ where: $0 \leq n \leq 1$, $0 \leq x \leq 1$, $0 \leq y \leq 1$, $0 \leq z \leq 1$, and $n+x+y+z=1$. In one or more embodiments, the spacer region has a larger bandgap than the active region.

In another preferred embodiment, the spacer region 5 is deposited on or above the second n-type region 4, and the second n-type region 4 is completely covered by said spacer region 5. Further steps may then be performed, such as etching, in order to expose/access the second n-type region 4. This etching can be performed by reactive ion etching (RIE) to remove a portion of said spacer region 5 in order to partially expose the second n-type region 4. Furthermore, the said spacer region 5 may be formed by etching periodic patterns into the spacer region 5 which are comprised of stripes, circles, hexagons, or other pattern(s).

In another preferred embodiment, the device is formed on a substrate which contains some silicon, gallium, indium, germanium, and/or aluminum. Additionally, the device may be formed on a patterned substrate. The substrate may be subsequently removed, such that the device can be flip-chip mounted to a carrier or other substrate. Said carrier may be separated into singulated portions to form light emitting devices separated from one another, with each of said light emitting devices mounted to a respective portion of said carrier. Furthermore, in one or more embodiments, the exposed region resulting from removing said substrate wafer from said light emitting device is patterned.

Figure 17A:
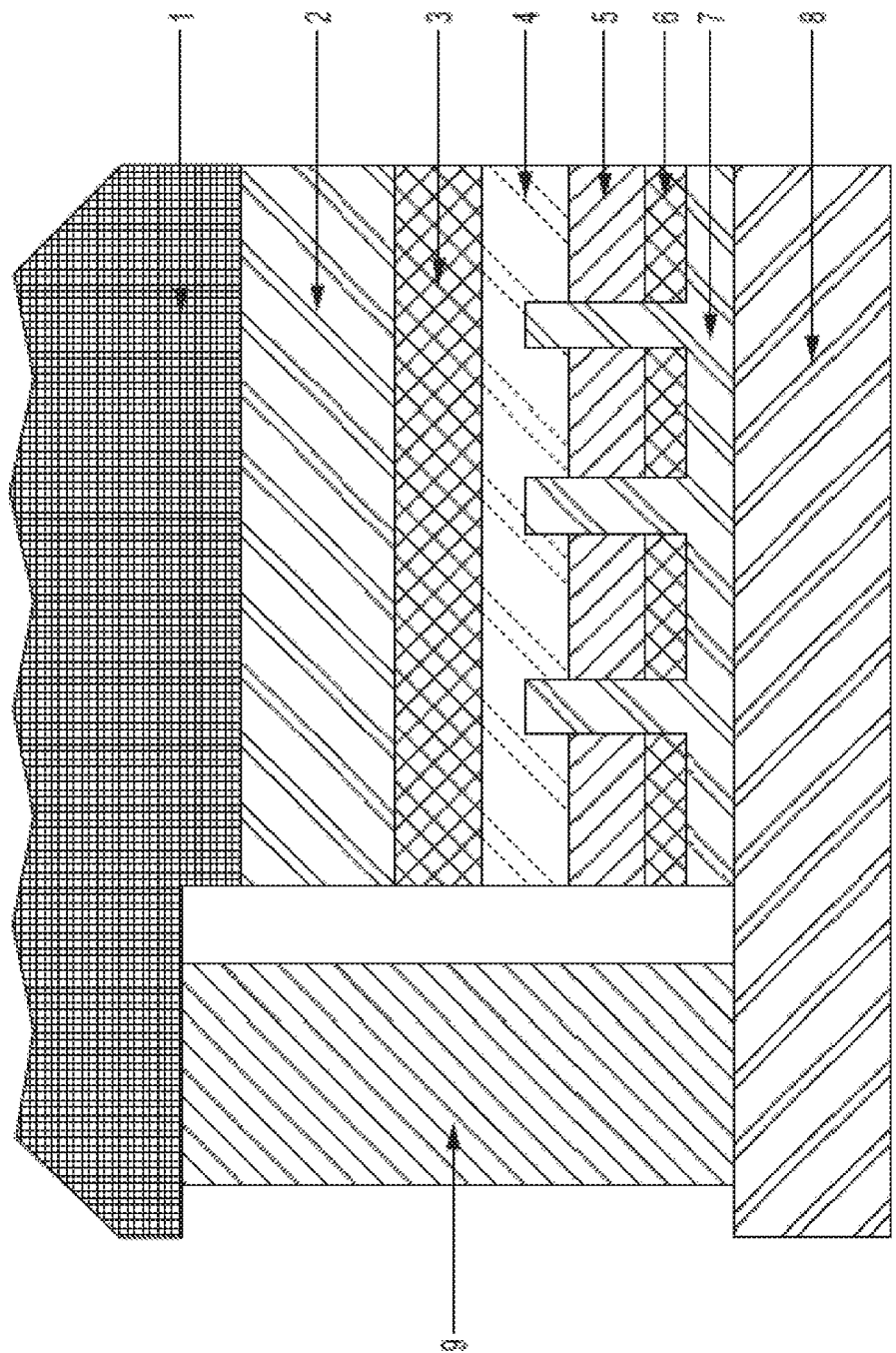
FIG. 17(a) is a cross-sectional schematic of a nitride semiconductor device according to the second embodiment of the present invention, comprising the n-type region, the p-type region, at least one active region, at least one second n-type region, at least one spacer region, at least one mirror region, and at least one second contact region all mounted to a substrate or submount.

FIG. 17(*a*) shows the device of FIG. 16 mounted on a submount 8 with an n-type electrode 9 which is connected electrically to the n-type electrode 7 and the first n-type region 1. The device can also be formed by having two separate n-type electrodes which are independently connected to the n-type electrode 7 and the first n-type region.

Process Steps

EXAMPLE 1

Example 1 describes a method for fabricating Embodiment 1 of the present invention.

First, a substrate is loaded in a reactor and cleaned. In Example 1, a c-face 4H silicon carbide (SiC) substrate was set in the Metal Organic Vapor Phase Epitaxy (MOVPE) reactor and the temperature of the substrate was increased to 1300° C. with hydrogen flow to clean the substrate. Instead of a c-face SiC substrate, the substrate may be a patterned substrate or a substrate having its principal surface represented by an R- or A-face, an insulating substrate of, for example, spinel ($MgAl_2O_4$), or sapphire ($Al_2O_3$), or a semiconductor substrate made of, for example, SiC (including 6H or 3C), silicon (Si), zinc oxide (ZnO), gallium arsenide (GaAs), or gallium nitride (GaN).

Subsequently, the temperature was decreased to 1250° C. and a first buffer region made of AlN which had a thickness of about 800 nanometers (nm) was grown on the substrate, using hydrogen as a carrier gas, and ammonia and TMAl (trimethylaluminum) as material gases. Such a buffer region may be omitted, depending on the kind of the substrate, the growing method, etc.

After growing the buffer region, only TMAl was stopped and the temperature was decreased to 1175° C. The first n-type region 1 (made of $Al_xGa_{1-x}N$ where x=0.5, doped with Si to $1\times10^{19}/cm^3$, and having a thickness of 300 nm) was grown using ammonia and TMAl as material gases in the same way as in the previous step, and disilane gas as an impurity gas. This first n-type region 1 may be made of $In_xAl_yGaN$ ($0 \leq x$, $0 \leq y$, $x+y<1$). However, the composition is not specifically limited to that composition. In such a case, the nitride semiconductor region having a minimized crystal defect can easily be obtained.

The thickness of the n-type region 1 is not specifically limited to any thickness. Moreover, the n-type impurity may be desirably doped in with a high concentration to the degree that the crystal quality of the nitride semiconductor is not deteriorated and preferably in the concentration between $1\times10^{18}/cm^3$ and $5\times10^{21}/cm^3$.

Next, a quantum barrier region made of undoped $Al_xGa_{1-x}N$ (with x=0.5 and having a thickness of 8 nm) was grown at 1175° C., and a well region (made of undoped $Al_xGa_{1-x}N$ with x=0.6 and having a thickness of 2.5 nm) was grown using TMG, TMAl and ammonia. As shown in FIG. 16, the active region 2 of the multiple quantum well structure having a total thickness of 30 nm was grown by laminating alternately (e.g., five) barrier regions and (e.g., three) well regions in the order of barrier region, well region, barrier region, etc., and finishing on a barrier region. The active region 2 was grown by laminating the barrier region first, but may be grown by laminating the well region first and also last, or the order may begin with the barrier region and end with the well region. Thus, the order of depositing the barrier and well regions is not specifically limited to a particular order.

The well region was set to have a thickness of not greater than 10 nm, preferably not greater than 7 nm, and more preferably not greater than 5 nm. A thickness of greater than 10 nm may make it difficult to increase the output of the device. On the other hand, the barrier region was set to have a thickness of not greater than 30 nm, preferably not greater than 25 nm, and most preferably not greater than 20 nm.

Subsequently, at 1075° C., using TMG, TMAl, ammonia, and $Cp_2Mg$, a p-region region 3 was grown, wherein the p-region was made of p-type $Al_xGa_{1-x}N$ with x=0.5, doped with Mg to $1×10^{20}/cm^3$, and grown to have a thickness of 100 nm. The p-region region 3 may also be made of $In_xAl_yGa_{1-x-y}N$ (0≤x, 0≤y, x+y<1). While the composition is not specifically limited to this composition, the composition of the p-region 3 preferably may be $Al_xGa_{1-x}N$ with x=0.5. In such a case, a nitride semiconductor region having minimized crystal defects can be obtained.

Once the reactor has cooled, the nitride device is removed and annealed in a hydrogen deficient atmosphere for 3 minutes at a temperature of 900° C. in order to activate the p-type region 3.

Subsequently, the device was loaded into a Molecular Beam Epitaxy (MBE) reactor, the temperature of the device was heated to 750° C., and, using gallium, aluminum, and silicon plasma sources, the second n-type region 4 was grown. The second n-type region 4 was made of n-type $Al_xGa_{1-x}N$ with x=0.5, doped with silicon to $1×10^{20}/cm^3$, and grown to have a thickness of 10 nm. The second n-type region 4 may also be made of $In_xAl_yGa_{1-x-y}N$ (0≤x, 0≤y, x+y<1). While the composition is not specifically limited to this composition, the composition of the second n-type region 4 preferably may be $Al_xGa_{1-x}N$ with x=0.5. The second n-type region 4 is thus deposited in such a case so as to form an electrical contact to the p-type region 3 by the formation of a tunnel junction. Although the second n-type region 4 was a single layer, multiple n-type regions may be formed. These multiple second n-type regions may vary in composition and/or doping concentrations. Thus, the number of second n-type regions is not limited to a single layer.

Subsequently, at 750° C., using gallium, aluminum, and silicon plasma sources, a spacer region 5 was grown, wherein the spacer region 5 was made of n-type $Al_xGa_{1-x}N$ with x=0.5, doped with silicon to $1×1.0^{18}/cm^3$ and grown to have a thickness of 10 nm. The spacer region 5 may also be made of $In_xAl_yGa_{1-x-y}N$ (0≤x, 0≤y, x+y<1). The composition is not specifically limited to this composition, but the composition of the spacer region 5 preferably may be $Al_xGa_{1-x}N$ with x=0.5. In such a case, a nitride semiconductor region having minimized crystal defects can be obtained. The spacer region may also be unintentionally doped to achieve a higher resistivity compared to the second n-type region. Although the spacer region was a single layer, multiple spacer regions may be formed. These multiple spacer regions may vary in composition and/or doping concentrations. Thus, the number of doping regions is not limited to a single layer.

Additionally, although the second n-type region and the spacer region were deposited by the use of an MBE reactor while the other device regions were deposited by use of an MOCVD reactor, the device regions could be deposited by the use of single MBE reactor or a single MOCVD reactor. Conversely, a mixture of differing deposition reactors may be used on any of the device layers described above. Thus, the reactor type used for the deposition of the device regions is not specifically limited to a particular reactor type.

Once the reactor has cooled, the nitride diode is removed. Subsequently, the device regions can then be divided into individual devices on the substrate preferably by known methods of mesa etching or by mechanical sawing, laser cutting, and water-jet cutting, all of which cut through the deposited layers while not cutting through the SiC substrate. The individual devices can have different sizes with the suitable range of sizes being 250-300 microns square. In alternative embodiments according to the present invention, the deposited regions can be left on the substrate as continuous layers, and then divided into individual devices after flip-chip mounting.

Subsequently, an etch can be performed on the device regions in order to expose the first n-type region 1 and second n-type region 4, wherein part of the spacer layer 5 is left intact and not etched. This etch can be performed preferably by known methods of mesa etching or by mechanical sawing, laser cutting, and/or water-jet cutting. A mirror region can then be deposited on top or above the remaining spacer layer. The mirror layer can be composed of metals such as gold, nickel, titanium, aluminum, or silver or a combination thereof. The mirror can also be composed of dielectrics such as tantalum oxide, silicon oxide, or a combination thereof. N-electrodes 7, 8 can then be deposited on the first n-type region 1 and second n-type region 4. N-electrodes can be composed of metals such as gold, nickel, titanium, aluminum, or silver or a combination thereof.

In addition to these previous steps, the substrate with its devices can be inverted and flip-chip mounted on a lateral surface of the carrier, and in a preferred embodiment the devices are bonded in place. The said carrier can then be singulated into portions to form light emitting devices separated from one another, with each of said light emitting devices mounted to a respective portion of said carrier.

Subsequently, the substrate can then be removed, wherein the exposed layer resulting by removing said substrate from said light emitting devices is patterned. The patterns can be comprised of circles, stripes, hexagons, or other patterns.

Figure 17B:
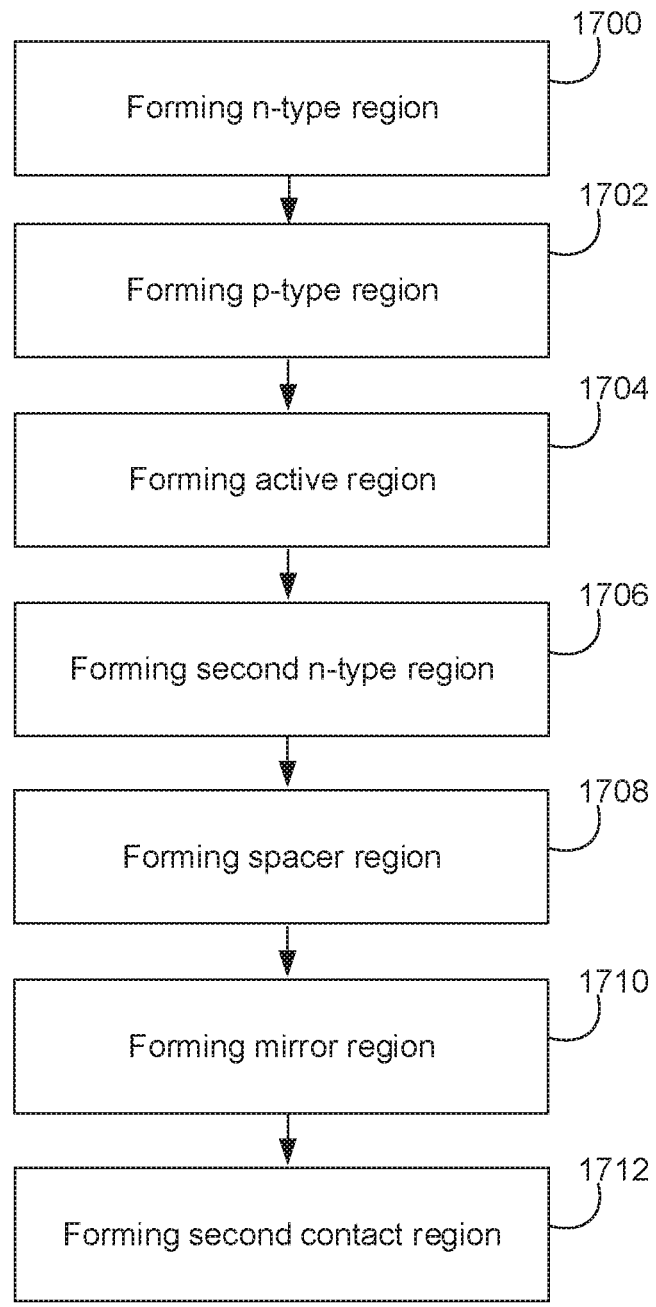
FIG. 17(b) is a flowchart illustrating a method according to one or more embodiments.

FIG. 17(b) illustrates a method of fabricating an optoelectronic device.

Block 1700 represents forming a n-type region 1.

Block 1702 represents forming a p-type region 3.

Block 1704 represents forming at least one active region 2, wherein the active region is comprised of at least one quantum well structure.

Block 1706 represents forming at least one second n-type region 4 on or above the p-type region.

Block 1708 represents forming at least one spacer region 5 which is on or above the second n-type region, wherein the spacer region partially covers the second n-type region. In another preferred embodiment, a pattern is formed by properly masking the second n-type region 4 with a periodic pattern comprised of stripes, circles, hexagons, or other pattern such that subsequent deposited region, such as said spacer region 5, preferentially form on the unmasked regions of the said second n-type region 4. Masking materials can be composed of silicon dioxide for example. The spacer region may be formed on or above the mask pattern. In one or more embodiments, the mask pattern contains/comprises, consists essentially of some silicon or silicon dioxide. In one or more embodiments, the mask pattern significantly reduces the formation of the spacer region on the mask pattern.

Block 1710 represents forming at least one mirror region 6 on or above the spacer region 5.

Block 1712 represents forming at least one second contact region 7 on or above the mirror region and the second n-type region 4, wherein the at least one second contact region forms a contact to the second n-type region.

E. Method to Fabricate High Extraction Efficiency thin Film Light Emitting Devices with Tunnel Junctions and Substrate Liftoff A light emitting diode (LED) is a device that comprises an active material (e.g., multi quantum wells, MQWs) sandwiched between a p-type and an n-type region. When a bias is applied to this thin-film crystal, electrons and holes recombine to emit light at a spectrum determined by the active regions/material. Due to the difference in refractive index between air and the semiconductor, most of the light generated by the active layer will be trapped inside the crystal if no additional processing is applied to the crystal to increase light extraction.

Thus, methods of improving LED device performance are needed. One or more embodiments of the present invention satisfy this need.

Ultraviolet (UV) LED light extraction is limited by the high refractive index of emitting crystals, absorption by the growth substrate, the high thermal impedance of many growth substrates (such as sapphire), and because of shadowing caused by the n- and p-contact metallization. There is a need for a design that eliminates n- and p-contact shadowing and wire bonding shadowing while at the same time flip chip bonding the LED devices to a thermally, mechanically, and optically appropriate substrate. Such device and process designs will enhance thermal performance of devices, device lifetime, and power. Also, such device and process designs will reduce light lost or absorbed because of wire bonding or n-contact and p-contact metallization. Furthermore, Ga or Al-face n-contacts have better performance than N-face n-contacts.

One or more embodiments of the present invention describe a method and structure to improve light extraction from thin film LEDs. A thin film UV LED is flip-chipped on an insulative carrier with high thermal conductivity. The carrier has pre-made contact pads for bonding. Each processed LED is aligned with the carrier wafer pattern for bonding. The growth (e.g., SiC) substrate is removed such that N-Face side of the buffer layer is the top most layer. The mesas are processed from the N-face side to isolate mesas from the N-Face side. Reflective n-contacts and p-contacts are deposited on Ga-side of the LEDs.

Device Structure and Fabrication

Figure 18A:
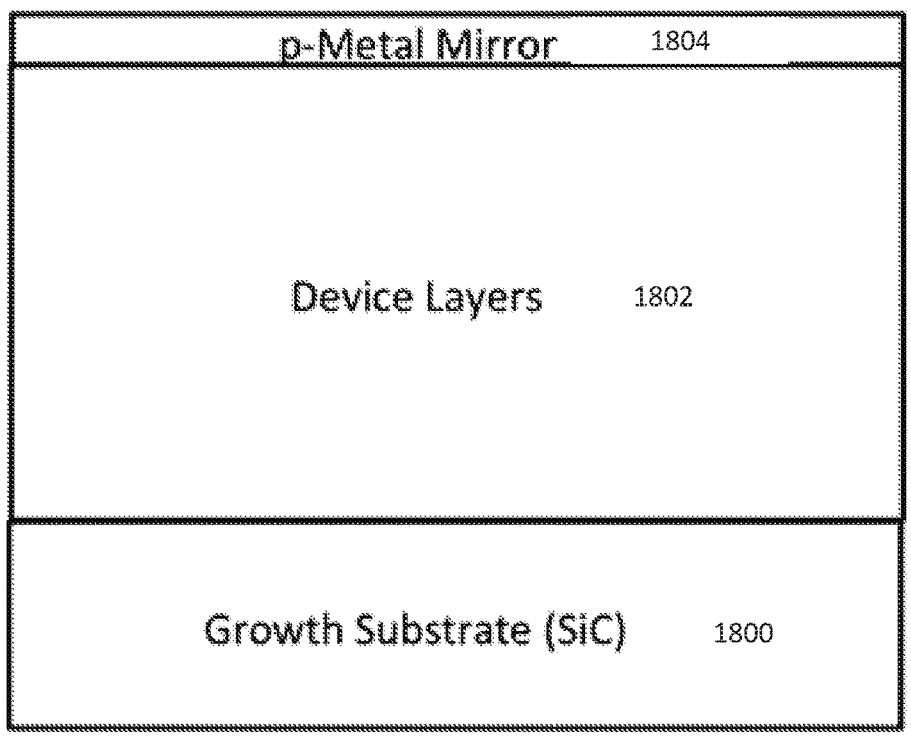
Figure 18B:
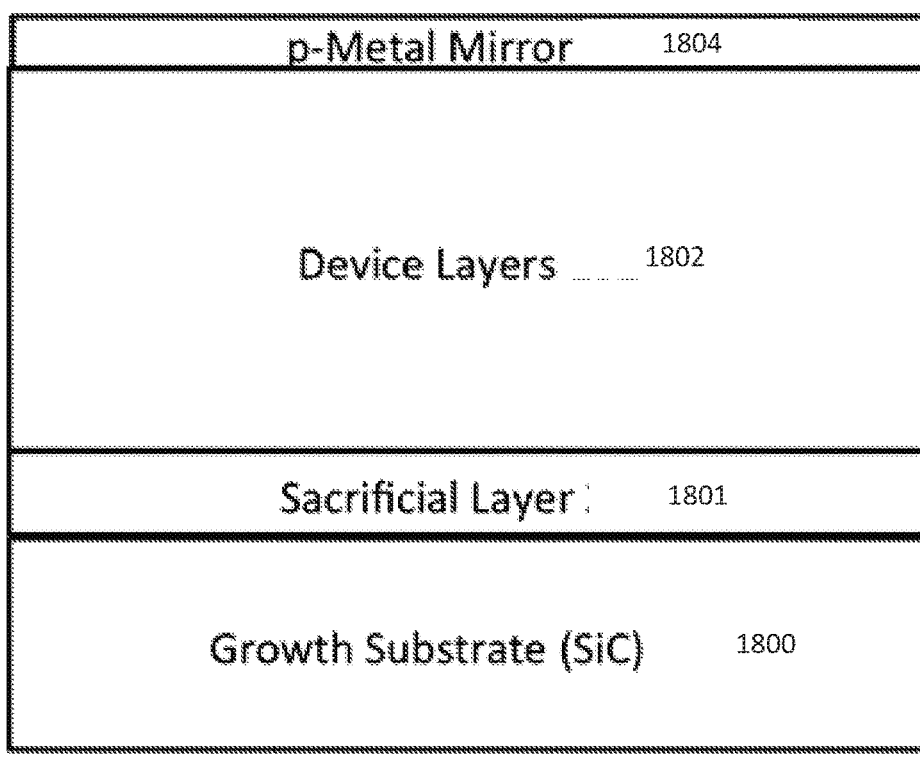

FIG. 18a and FIG. 18b show one embodiment of a method to fabricate a high extraction flip chip UV LED. Growth substrates 1800 could include AlN, SiC, GaN, or sapphire substrates, for example, and their choice is limited by cost, absorption, thermal characteristics, lattice mismatch, and ability to withstand the high temperatures necessary to grow a high quality active layer comprising AlGaN quantum wells. The active layer is in the device layers 1802.

Figure 18C:
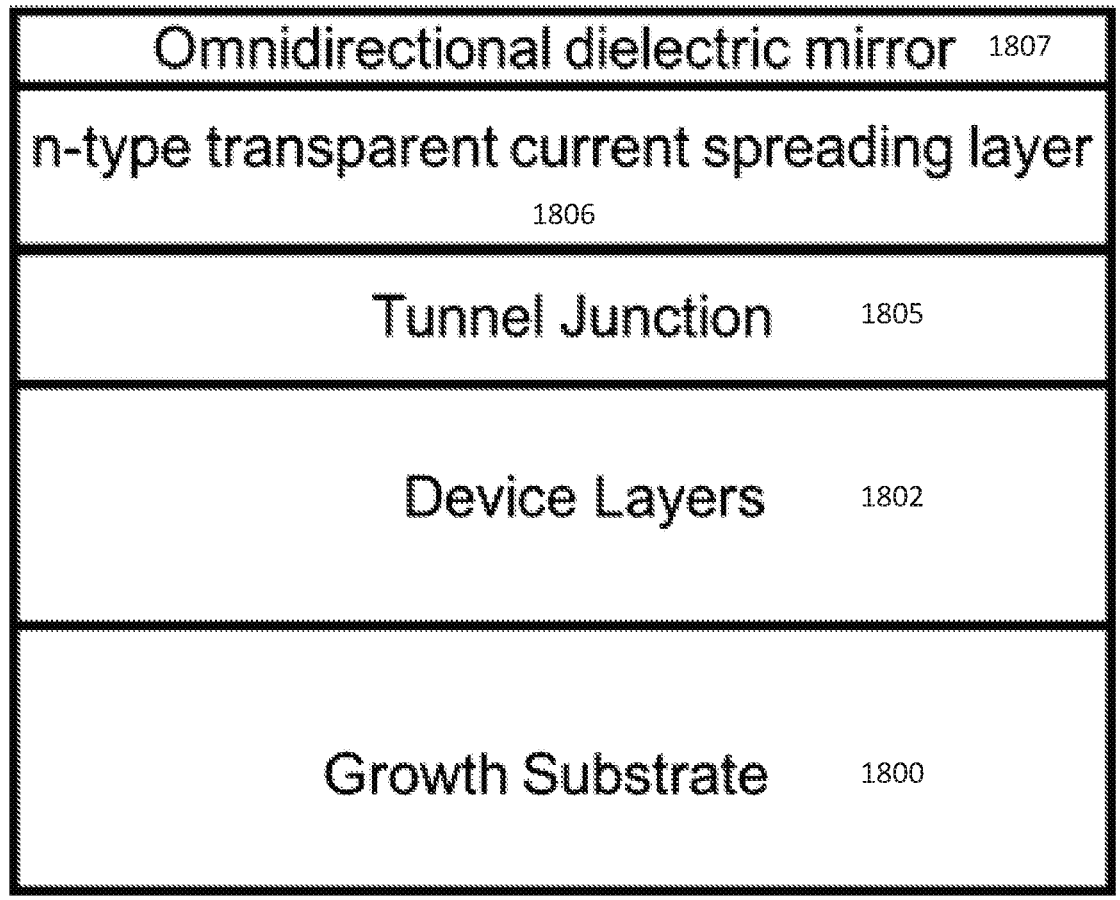

FIG. 18c shows tunnel junctions (1805 and 1806) are deposited on top of p-AlGaN (top layer of 1802) to enhance hole injections and act as transparent current spreading layers. Tunnel junctions can be deposited with MBE, MOCVD, sputtering and other deposition methods.

Surface treatment for the p-AlGaN (top layer of 1802) before deposition of the tunnel junctions is used to improve tunneling across the wideband-gap (3.4-6 eV) and reduce voltage. Examples of surface treatments include creating surface defects that increase hole density by removing hydrogen from the Mg—AlGaN layer (top layer of 1802), by annealing p-AlGaN with metal (Au, Ni, Pd), by plasma etching, and/or by chemical treatment such as HF, e.g., as described herein.

Embodiments of the present invention enable having both n-contact and p-contact from below by die-to-die alignment to the pre-made sub-mount with the p- and n-pads. The growth substrate (which covers and protects the carrier substrate pads during dry etch) is then removed by a dry etch or by undercutting a sacrificial layer (layer 1801). Then vias are made to access the p- and n-pads and devices are diced.

PEC Etch Example

FIG. 18b shows an embodiment of device structure 1800 in which the growth substrate 1800 is removed by undercutting a sacrificial layer 1801 using a photoelectrochemical (PEC) etch after flipchip mounting. The sacrificial layer 1801 can comprise (In,Al,Ga)N materials and can be grown with molecular beam epitaxy MBE or metal-organic chemical vapor deposition (MOCVD). The PEC etch needs to be uniform, leave smooth etched surfaces, and not cause etch damage to active layers of the device. Opening vias in the growth substrate and controlling the temperature of electrolyte (KOH) can improve PEC etch uniformity. A low concentration KOH solution (0.1-1.0 M) can be used to undercut a 1 $mm^2$ mesa or smaller. A wavelength of light will generate electron-hole pairs in the sacrificial layer 1801. A preferred material for the sacrificial layer 1801 is InGaN and a light source emitting light with photon energy lower than the bandgap of the, e.g., SiC substrate 1800 (6H—SiC: Hexagonal unit cell (Wurtzite) has 3.0 eV) can be used. For example, a 410 nm source of light (emitted from, e.g., a laser diode or visible LED) will generate electron and holes in the InGaN sacrificial layer 1801. The holes will form Indium oxide which will dissolve in KOH. The electrons complete the electrical circuit through the deposited PEC metal. An etch stop layer (comprising a higher bandgap energy layer such as AlGaN) can be used above the sacrificial layer 1801 to control the extent of the PEC etch.

Dry Etch Example

Figure 19A:
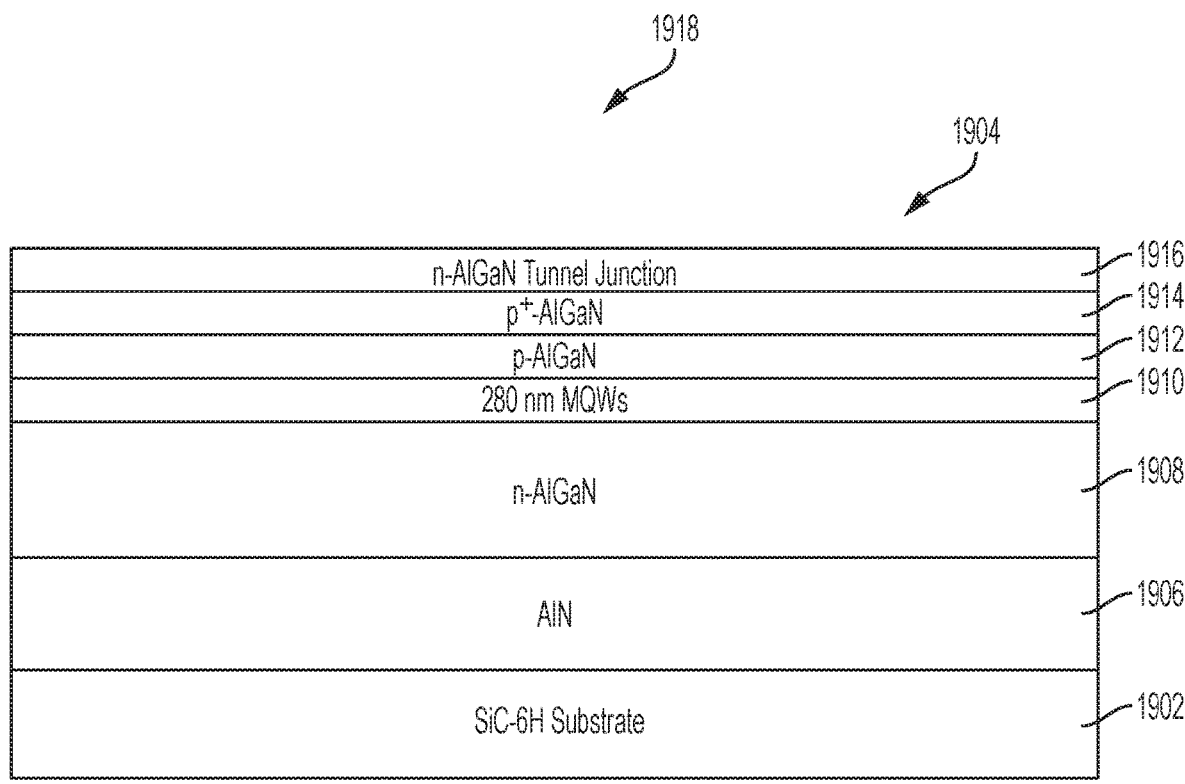
FIG. 19(a) illustrates a device structure according to another embodiment of the present invention.
Figure 19B:
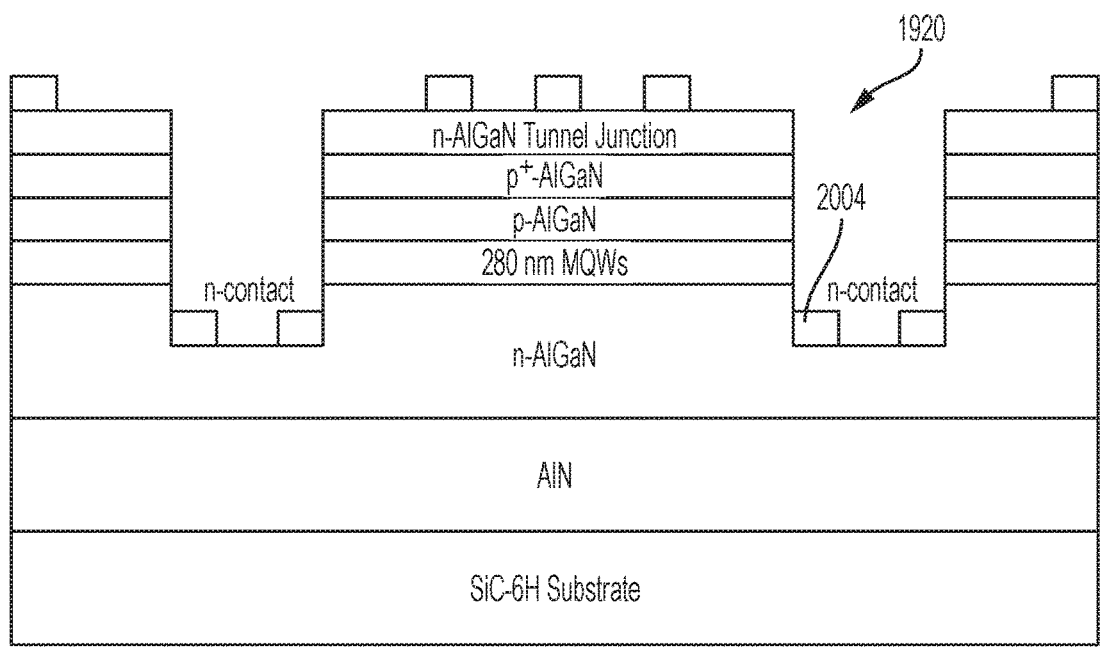
Figure 19C:
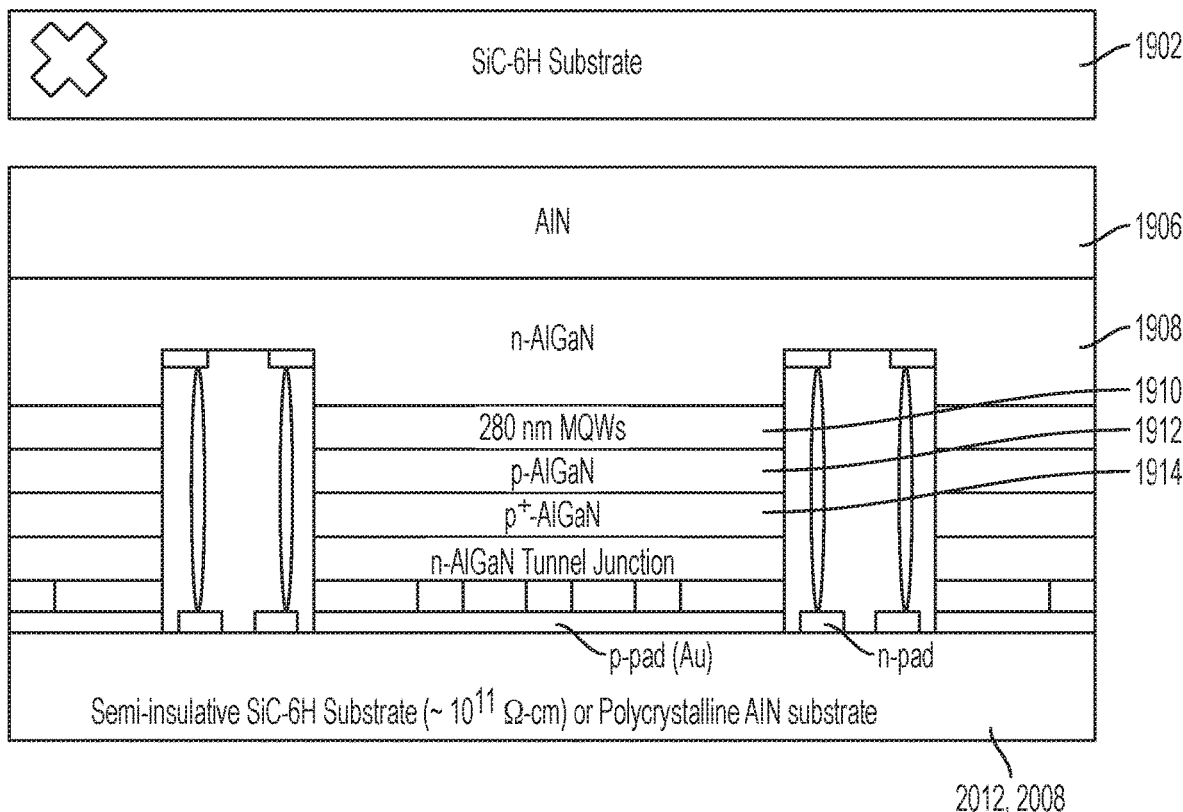
Figure 19D:
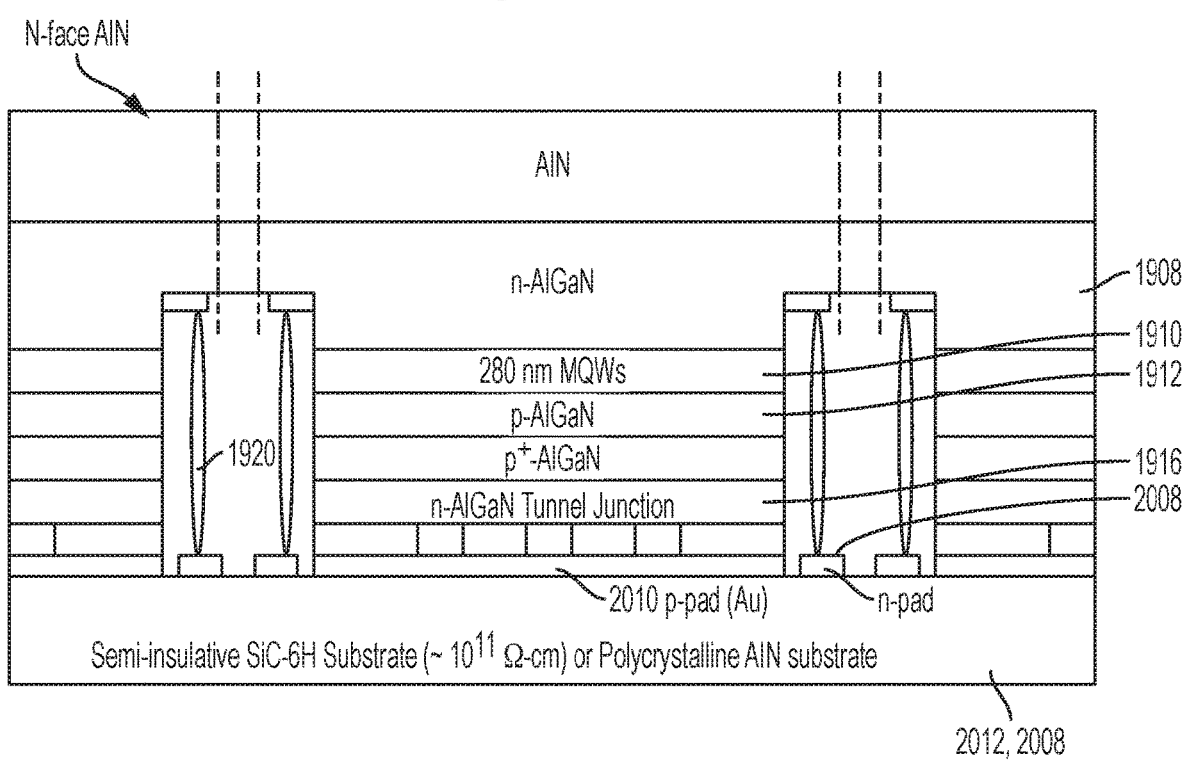

FIG. 19a shows an embodiment of a device structure in which the growth substrate 1900 will be removed by a dry etch after flip-chip mounting the device 1900. Mechanical removal of the substrate 1900 by lapping or by mechanical chemical polishing has limited ability to produce a substrate with small total thickness variation (TTV). The use of multi-step dry etching, on the other hand, can planarize the etched epi layer and produce a smooth surface. In one embodiment, fluorine-based gases such as, but not limited to, $SF_6$ could be used to etch the SiC growth substrate 1900 at high bias power and at high etch rates. Then, when the dry etched growth substrate 1900 thickness is reduced to about 10-20 microns thick, a switch to a lower bias power dry etch is made to increase the dry etch selectivity to SiC over the AlN layers 1902. Using $SF_6$ as an etch gas at a low bias power (50 W) and appropriate etch chamber pressure and plasma density can result in an 200:1 etch selectivity of SiC over AlN with reasonable SiC etch rate (~100 nm/min), which is sufficient to level the etched AlN buffer layer surface. The epitaxial structure 1904 for the device 1900 comprises aluminum containing nitride (e.g., AlN) layer 1906 on the substrate 1902, n-type AlGaN layer 1908 on the layer 1906, III-nitride active region 1910 on layer 1908, p-type AlGaN layer 1912 on layer 1910, $p^+$-type AlGaN layer 1914 on layer 1912, and n-type AlGaN tunnel junction 1916 on layer 1914.

The use of an appropriate carrier for etching in a plasma system makes the etching system more reliable. The use of a carrier such as a sapphire substrate or fused silica is more reliable and superior to using Al or Ni carrier wafers. Sapphire and fused silica wafers cause no metal sputtering into the etching chamber walls or onto the sample surface.

Roughening

Figure 19E:
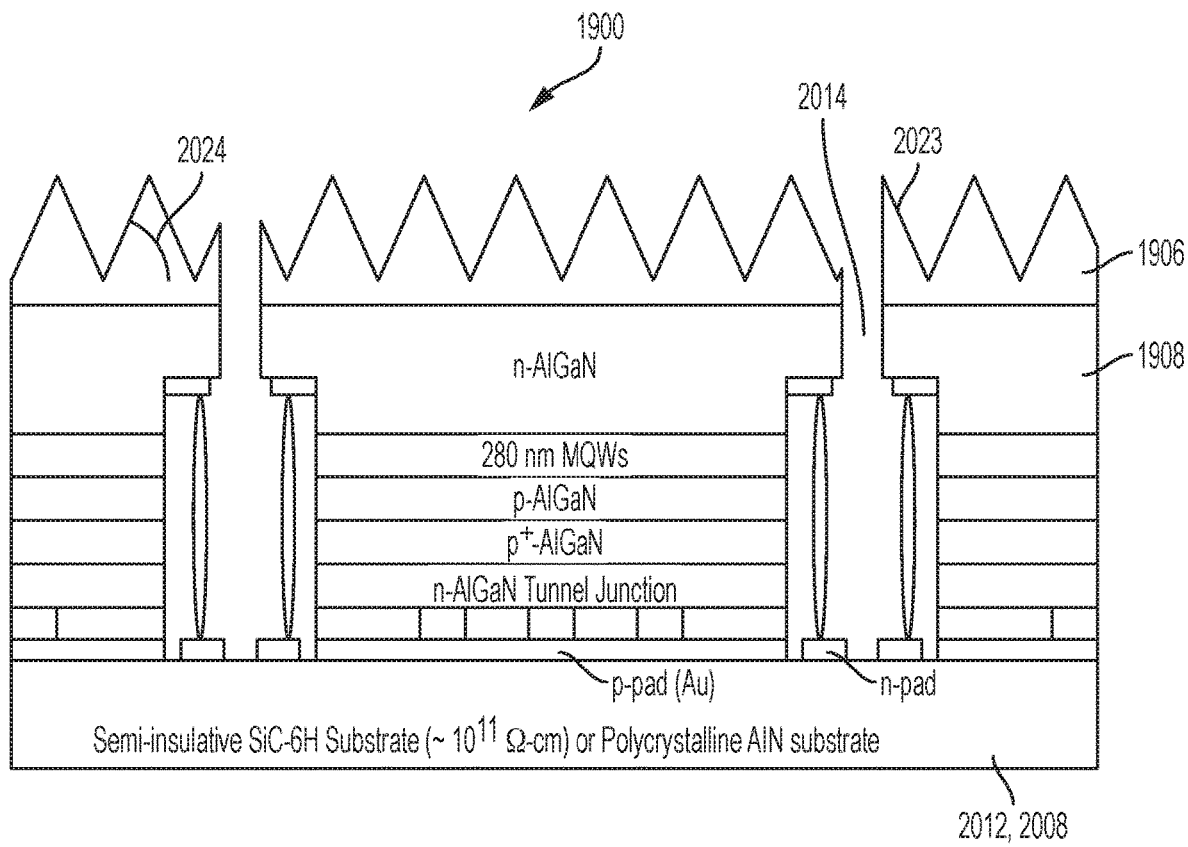
Figure 19F:
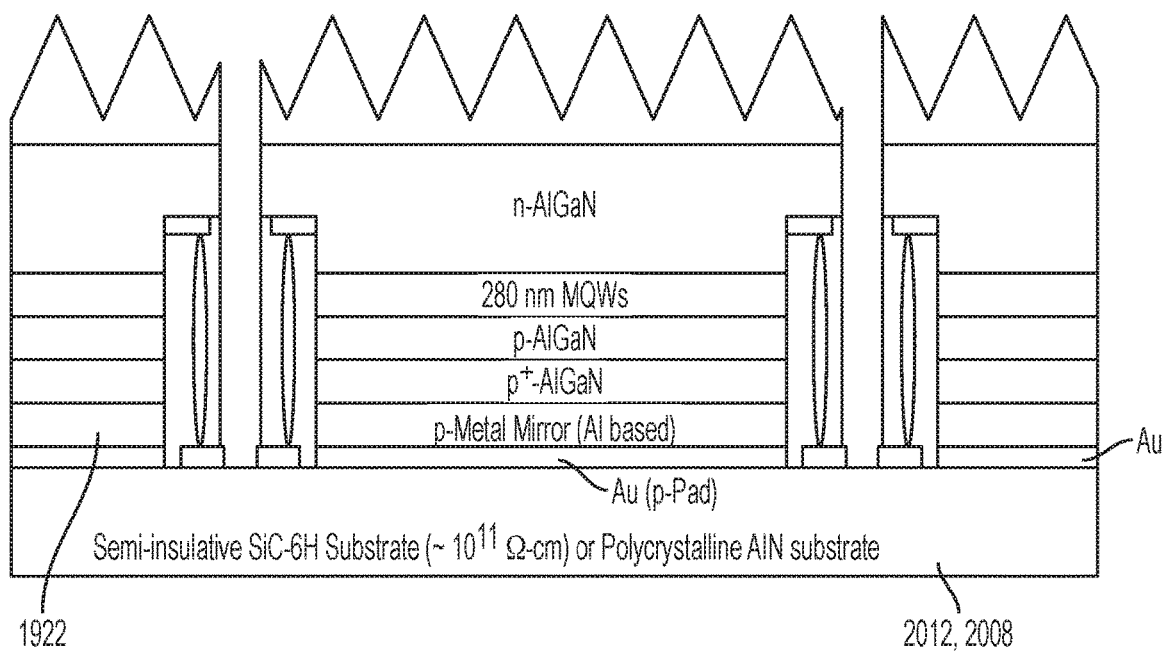

One or more embodiments of the present invention comprise roughening the N-face layer 2024, 2023 of the surface of the LED 1900, as illustrated in FIG. 19*e*. In one or more embodiments, the roughening is by natural KOH roughening (for c-plane devices) or by non-equilibrium roughening methods (such as a $Cl_2/Ar$ or $BCL_3\backslash Cl_2\backslash CHF_3$ dry etch) of other crystallographic planes. The ratio of etch gases and pressure in the etch chamber can be altered to affect the crystallographic directionality of the etch and the resulting sidewalls etch angle 2024. Other surface roughening methods such as, but not limited to, the use of photonics crystals to efficiently extract TE and TM waves, are also possible.

N-Face AlN forms hexagonal cones in KOH and TMAH with a high etch rate of around 1 micron per minute at a temperature of 85° C. The AlN buffer layer is kept because it has lower refractive index than the n-AlGaN. The low crystalline quality and nucleation layer will be removed by KOH etch.

Deep UV LEDs can emit a considerable amount of radiation in TM modes which can be hard to extract by conventional hexagonal cones combined with a highly reflective omnidirectional mirror. Thus, photonic crystals or other patterning methods can be used to as polarization independent light extractors.

Figure 20A:
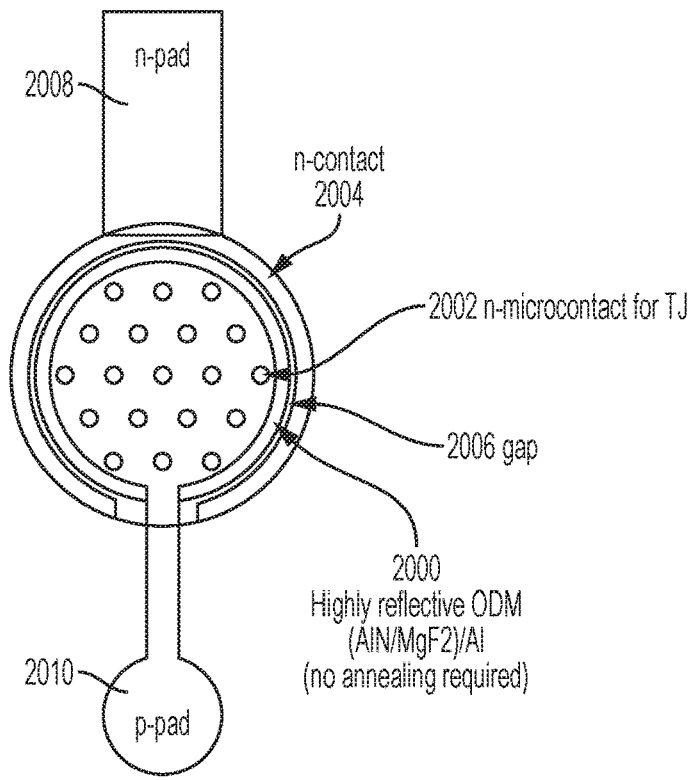
FIG. 20(*a*)-20(*b*) are top views of the semiconductor device according to one or more embodiments and showing premade p- and n-pads on the carrier (sub-mount).
Figure 20B:
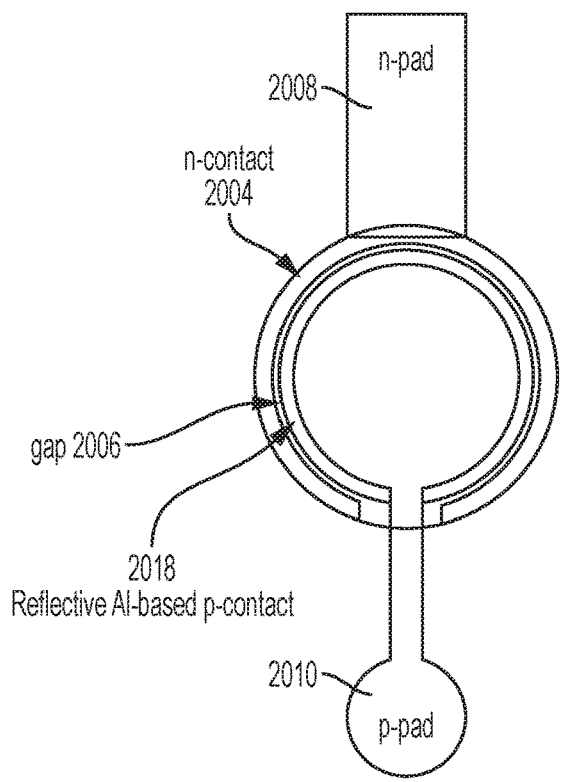
Figure 20D:
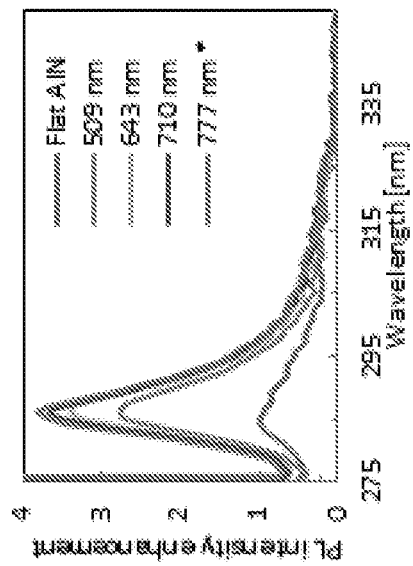
Figure 20C:
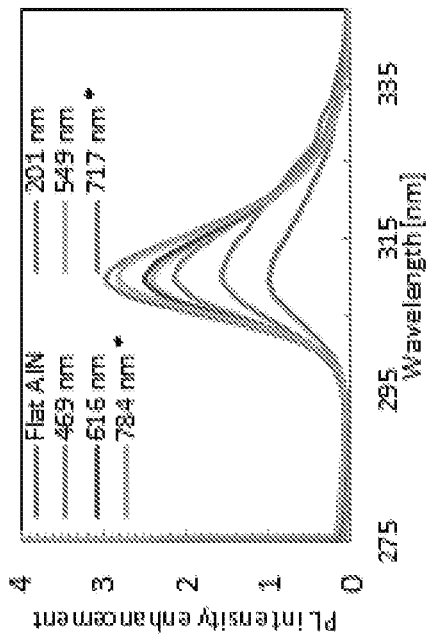
Figure 20F:
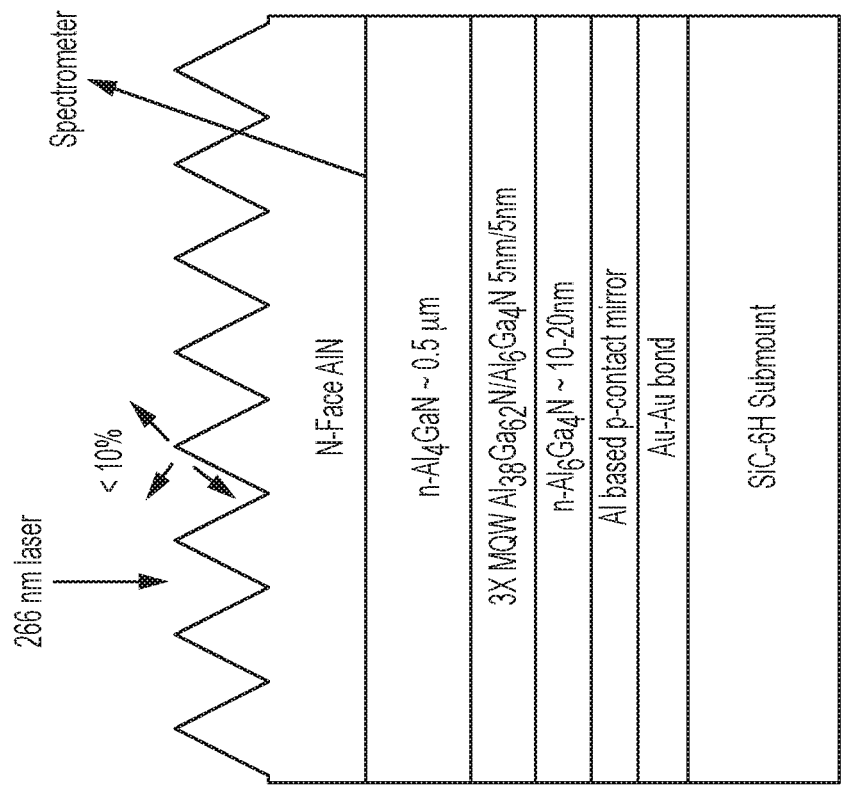
Figure 20E:
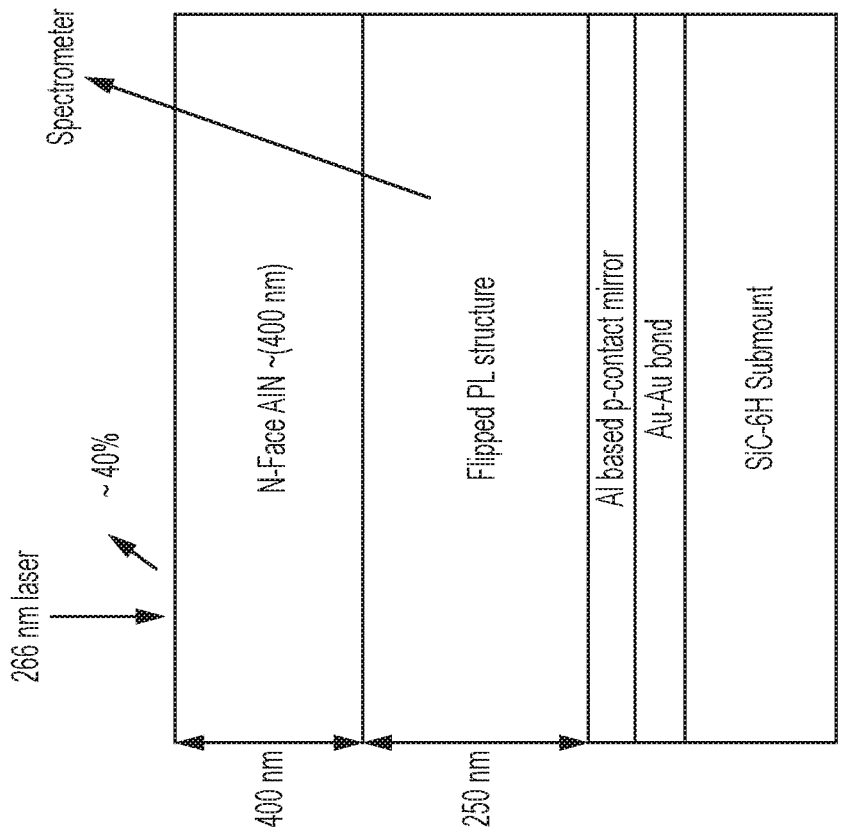

FIG. 20*a* illustrates the omnidirectional (ODM) contact mirror 2000 (see also 1807 in FIG. 18*c*) is perforated with an ohmic contact metal 2002 that injects current into the tunnel junction 1916, 1805 and current spreading layer 1806, 1912. In one example, the highly reflective mirror 2000 comprises $AlN/MgF_2/Al$ (no annealing required). Also shown is the n-contact 2004, a gap 2006, n-pad 2008, and p-pad 2010. In another example, a reflective Al based p-contact 2018 is used.

There are limited options for a lossless dielectric in the UV range, especially in the deep UV range. Nevertheless, options for a high refractive index dielectric include AlN (n>2), $Zr_3O_4$ (n>2), and many fluorides such as SrF (n=1.6). Low refractive index options include air (n=1), $MgF_2$ (n=1.4), and LiF (n=1.4). $MgF_2$ is much more resistive to water than LiF.

FIGS. 19 and 20 illustrate the method of the present invention further comprises protecting metallization 2004, n-pads 2008, p-pads 2010 on the sub-mount 2012 when vias 2014 are made to access the p- and n-pads 2008, 2010 and when devices are diced.

Example Fabrication Flow

The SiC substrate was removed partly by mechanical grinding, followed by a two-step inductively coupled plasma (ICP) etches: a fast non-selective $SF_6$ etch; a slow but highly selective $SF_6$ etch of SiC over AlN to plagiarize the surface and to stop at a smooth N-AlN surface. At 1000 W high ICP power, and 50 W substrate bias power the etch selectivity between SiC and AlN was high (>200) with a SiC etch rate of 100 nm/min. Inexpensive fused silica carrier wafers were used to withstand etching of >100 microns (or more) of SiC, without depleting the plasma's chemistry. Metal-coated carrier wafers were avoided to avoid sputtering metal on the sample or the etching chamber walls. Using a fused silica carrier wafer, etch rates at 1000 W ICP coil power is about 0.6 μm per min at a 400 W bias and a pressure of 1.33 Pa. The AFM surface roughness of the exposed AlN was ~0.6 nm over 25 μm². Exposed N-face AlN surface is roughened with aqueous KOH, which generates hexagonal pyramids that are highly efficient in light extraction. The etching conditions were investigated to optimize light extraction. By varying the etch time and temperature, it was shown that the hexagonal pyramid density is independent of threading dislocations density when etched in aqueous KOH.

FIGS. 20(*c*)-20(*d* show photoluminescence (PL) of flip-chip n-i-n structures in FIGS. 19(*a*)-19(*f*) and 20(*a*)-(*b*) studied as a figure of merit of for the impact of p-mirror reflectivity and the surface roughness on light extraction. MQW PL emission from FC-substrate/Au—Au-bond/p-mirror/n-AlGaN/MQW/n-AlGaN/AlN (400 nm) structure was enhanced with KOH roughening and non-annealed Al based p-contact (Pt/Al/Ni/Au). PL emission measurements showed more than 2× light extraction enhancement from the quantum wells. At MQW PL emission of 310 nm, and using 2.6 nm of Pt in a p-mirror (Pt/Al/Ni/Au) with a reflectivity of 87% at 310 nm, the PL enhancement after roughening the surface was limited to ~2.9×. In a second sample with MQW PL emission of 285 nm, a thinner layer of Pt (0.26 nm) resulted in 3.9× PL enhancement because of higher reflectivity (91%) at MQW emission of 285 nm.

Process Steps

Figure 21:
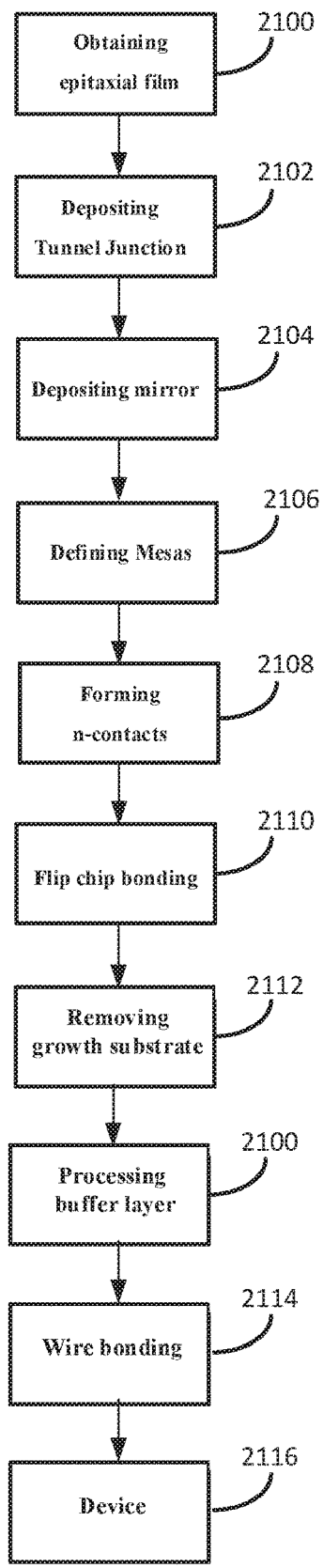
FIG. 21 is a flowchart illustrating a method of fabricating a device according to one or more embodiments.

FIG. 21 is a flowchart illustrating a method of fabricating an optoelectronic device according to one or more embodiments of the present invention.

Block 2100 represents obtaining or growing an epitaxial film 1802, 1904 comprising an optoelectronic device structure and an insulative buffer layer 1906, on a growth substrate 1902, 1800 (e.g., free standing Gallium Nitride substrate, Silicon Carbide substrate, Silicon substrate, Aluminum Nitride substrate, or sapphire substrate). The optoelectronic device structure includes an (e.g., III-nitride) active layer 1910 between a p-type (e.g., III-nitride) layer 1912 and an n-type (e.g., III-nitride) layer 1908. The insulative buffer layer 1906 is between the substrate 1902 the device structure 1918. In one or more embodiments, the insulative buffer layer 1906 has a higher bandgap than the active layer 1910. In one or more embodiments, the buffer layer 1906 comprises AlN or an aluminum containing nitride.

In one or more embodiments, the active layer 1910 has a composition and structure to emit light comprising deep ultraviolet (UV) emission having a wavelength below 350 nanometers.

Examples of the growth substrate 1902, 1800 include a freestanding GaN substrate, SiC, Si, AlN, or a sapphire substrate.

Block 2102 represents obtaining or depositing a tunnel junction 1916, 1805 and a current spreading layer 1806 on top of the (e.g., wide bandgap) p-side of the device 1900, wherein the current spreading layer 1806 is a transparent or semitransparent layer.

In one or more embodiments, tunneling through the tunnel junction 1916, 1805 is enhanced by one or more surface treatments. The surface treatment comprises treating a p-type surface 2016 of the p-type layer 1914 in the tunnel junction 1916.

In one or more embodiments, the treating/surface treatment comprises annealing the p-type surface 2016; depositing (after the annealing) the tunnel junction 1916 by depositing metal (such as Au, Ni and, Pd) on the p-type layer 1914, thereby forming a metallized layer on the p-type layer 1914; and then chemically removing the metallized layer.

In one or more embodiments, the surface treatment/ treating comprises processing the p-type layer 1914 by creating Ga vacancies or Al vacancies before depositing the tunnel junction 1916 on the p-type layer 1914.

In one or more embodiments, the surface treatment comprises treating a p-type surface 2016 of the p-type layer with acids such as hydrofluoric acid or HF.

Block 2104 represents optionally depositing a mirror 2000, 1807, 2018 wherein the active layer 1910 is between the mirror 2000, 1807 and the insulative buffer layer 1906. In one or more embodiments, the mirror is a reflecting and stable p-contact mirror 2018 or dielectric based omnidirectional mirror 2000 on the backside of the device 1900 to increase light extraction of the device.

In one or more embodiments, the step comprises depositing a highly reflective coating for reflecting the UV range on top of the tunnel junction and/or current spreading layer 1916.

In one or more embodiments, the mirror 2000, 1807, 2018 is made from one or more lossless dielectric layers and/or Aluminum.

In one or more embodiments, the mirror 2000 is made from one or more lossless dielectric layers.

In one or more embodiments, the step comprises perforating the surface of the tunnel junction 1916 with n-contact metals 2002; and depositing the mirror comprising a highly reflective omnidirectional mirror 2002 on/in the surface perforated with the n-contact metals.

Block 2106 represents defining device mesas 1920 in the epitaxial film 1904 (including the tunnel junction 1916 and/or mirror 2000, if present).

Block 2108 represents making one or more n-contacts 2004 in a metal-face of the device 1900 (e.g., the thin film LED).

Block 2110 represents flip chip bonding the epitaxial film 1904, including the defined device mesas 1920, onto an insulative/insulating carrier sub-mount or substrate 2012. The insulative/insulating carrier substrate 2012 has one or more pre-made p-pads 2010 and one or more pre-made n-pads 2008. In one or more embodiments, the highly reflective coating, for reflecting the UV range, is deposited on the carrier substrate. In one or more embodiments, the carrier substrate 2012 includes air gaps and the highly reflective coating is on the air gaps and on the carrier substrate 2012.

Examples of the carrier 2012 include semi insulating SiC (~$10^{11}$ Ωcm) or a polycrystalline AlN substrate. In one or more embodiments, the device 1900 is sub-mounted onto the carrier comprising a flexible substrate.

In one or more embodiments, the flip chip bonding comprises a low temperature (<250° C.) flip chip bonding process.

Block 2112 represents removing the growth substrate 1902, wherein the N-face side of the insulative buffer layer is exposed.

In one or more embodiments, the growth substrate 1902 is removed using a highly selective etch between the growth substrate 1902 and the insulative buffer layer 1906.

In one or more embodiments, the substrate 1902 is removed by mechanically (polishing, lapping).

In one or more embodiments, the growth substrate 1800 is removed using a wet etch.

In one or more embodiments, the substrate 1800 is removed by lift-off though an undercut etch of a sacrificial layer 1801.

In one or more embodiments, the growth substrate 1800 is removed using a uniform PEC etch in which vias are made in the growth substrate 1800. A PEC etch-stop layer can be used.

In one or more embodiments, the growth substrate 1800 is removed by a PEC etch while controlling chemical electrolyte temperature (below 10° C.) to control the etch rate uniformity.

In one or more embodiments, the substrate 1902 is removed by a multistep dry etch.

In one or more embodiments, the substrate 1902 is removed mechanically by polishing and lapping, and the rest of the substrate 1902 is removed by a multistep dry etch.

In one or more embodiments, part the multistep dry etch includes a highly selective dry etch of the growth substrate 1902 over the buffer layer 1906.

Block 2114 represents processing and patterning the buffer layer 1906 to enhance light extraction from the device. The step can comprise processing the N-face of the buffer layer 1906 to access the n-pads 2008 and the p-pads 2010.

In one or more embodiments, the buffer layer 1906 surface (such as AlN) is roughened 2016 by KOH.

In one or more embodiments, the buffer layer 1906 surface (such as AlN) is roughened 2016 by fabricating a photonic crystal.

Block 2116 represents bonding 1920 to the one or more n-pads 2008 and the one or more p-pads 2010, wherein the wire bonding 1920 is connected from the metal side of the device 1900 without the wire bonds 1920 obstructing light emission from the device 1900.

In one or more embodiments, n-contacts 2004 are made to the metal face of the device 1900.

Block 2118 represents the end result, a device 1900 (e.g., III-nitride device) having performance enhanced by flip-chipping the device(s) onto an insulative carrier substrate 2012 with pre-made p-pads 2010 and n-pads 2008, and removing the growth substrate 1902 by a highly selective etch between the substrate 1902 and the buffer layer 1906.

In one or more embodiments, the optoelectronic device 1900 comprises an epitaxial film 1802, 1904, comprising an optoelectronic device structure, wherein the optoelectronic device structure includes an active layer 1910 between a p-type layer 1912 and an n-type layer 1908, and the epitaxial film 1802, 1904 includes an insulative/insulating buffer layer 1906 having a higher bandgap than the active layer 1910; and the epitaxial film 1802, 1904 is flip chip bonded onto an insulative/insulating carrier substrate 2012 having one or more pre-made p-pads 2010 and one or more pre-made n-pads 2008, and wherein the N-face side of the insulative/insulating buffer layer 1906 is exposed.

FIG. 21 further illustrates a method of reusing a growth substrate 1800 for new growth, comprising performing a lift off of the growth substrate 1800 using a PEC sacrificial layer 1801 without damaging the growth substrate 1800.

Tunnel junctions 1916, 1805 enable the use of n-type transparent current spreading layers 1806 and improve hole injections into the p-AlGaN 1912, improve current droop, and allow the use of very high reflective dielectric/metal omnidirectional mirrors 2000, 2018 or photonic crystals.

In one or more embodiments, the active layer 1910 of the optoelectronic device 1900 is sandwiched between a highly reflective mirror 1922 and the insulative buffer layer 1906 with higher bandgap.

Advantages and Improvements

Deep UV LEDs are expected to enable new markets for disinfections (surface, water, liquid) and biomedical and chemical applications.

P-type AlGaN (p-AlGaN) has low hole mobility, low hole density, high contact resistance, and high resistivity. The use of transparent or semitransparent tunnel junctions with transparent n-type current spreading layers enables designing high light extraction efficiency UV LEDs by improving current spreading and enhancing hole injection into the MQWs.

SiC is a viable substrate to make high internal quantum efficiency (IQE) UV LEDs. However, its use has been limited because, prior to the present invention, there were no feasible ways to lift-off the substrate. Processes according to one or more embodiments of the present invention show a path for making high EQE and wall plug efficiency (WPE) deep UV LEDs on SiC. Furthermore, the use of tunnel junctions enables much higher EQE, and WPE designs.

Thus, one or more embodiments of the present invention describe technology enabling the fabrication of high External Quantum Efficiency (EQE) thin-film AlGaN Deep UV LEDs grown by MOCVD, wherein the LEDs are grown with a transparent or semi-transparent tunnel junction as a current spreading layer to the p-AlGaN side. One or more embodiments of the process fabricate a Thin-Film Flip-Chip (TFFC) UV LED wherein the active region is sandwiched between a patterned or rough buffer layer and a highly reflective omnidirectional mirror.

Other applications include using the etch process resulting in a smooth N-face morphology for other electronics applications. For example, AlN epitaxial films are used to make RF transistors, and power electronics devices, and acoustic wave filter (Akoustis), etc.

References for Part E (Incorporated by Reference Herein)

[1] U.S. Pat. No. 7,932,111.

[2] U.S. patent application Ser. No. 12/059,907 by Umesh K. Mishra, Lee McCarthy, Chang Soo Suh, and Siddharth Rajan, entitled METHOD TO FABRICATE III-N SEMICONDUCTOR DEVICES ON THE N-FACE OF LAYERS WHICH ARE GROWN IN THE III-FACE DIRECTION USING WAFER BONDING AND SUBSTRATE REMOVAL.

[3] US Patent Publication No. 2008/05893, by Umesh K. Mishra, Yi Pei, Chang, Siddharth Rajan, and Man Hoi Wong entitled N-FACE HIGH ELECTRON MOBILITY TRANSISTORS WITH LOW BUFFER LEAKAGE AND LOW PARASITIC RESISTANCE.

[4] U.S. Pat. No. 7,948,011 by and Siddharth Rajan, Chang Soo Suh, James S. Speck, and Umesh K. Mishra.

F. Buried Tunnel Junction Aperture For III-Nitride Surface-Emitting Lasers

Electrically-injected GaN-based vertical-cavity surface-emitting lasers (VCSELs) were first demonstrated in 2008, but since then, only seven research groups have been able to share this accomplishment [1-7]. III-nitride VCSELs have unique advantages compared to edge-emitting lasers, such as low threshold current, high-speed direct modulation, circular mode profile, emission normal to the substrate, and ability to create densely-packed two-dimensional (2D) VCSEL arrays. Operating in the ultraviolet to visible regime, these advantages give rise to numerous potential applications, such as high-density optical storage, displays, visible light communication, and solid-state lighting.

There is a need to improve the performance of III-nitride VCSELs. The present invention satisfies this need.

I. III-nitride VCSEL Structure

Each device was grown by metal-organic chemical-vapor deposition (MOCVD) on m-plane free-standing GaN substrates and had multiple quantum well (MQW) active regions designed for an emission wavelength of 405 nanometers (nm). While other reports of III-nitride VCSELs have been c-plane devices, m-plane offers many advantages such as higher peak material gain and 100% polarization.

A dual-dielectric distributed Bragg reflector (DBR) design was chosen for its wide stopband and to avoid the challenges of epitaxial DBR growth. The dual-dielectric DBR design requires flip-chip bonding, and substrate removal has been reliably accomplished by incorporating a sacrificial MQW layer in the epitaxy that selectively undercut etches during photoelectrochemical (PEC) etching. Precise cavity length control has been achieved by using an n-AlGaN stop-etch layer during a top-down PEC etch. The following sections discuss the choice of aperture and intracavity contact design which can significantly impact the performance of III-nitride VCSELs.

II. Aperture Design

The most common design for III-nitride VCSELs has consisted of a dielectric aperture for current confinement.

While initial devices from the University of California at Santa Barbara (UCSB) had $SiN_x$ apertures, recent designs have used an aluminum ion implanted aperture (IIA), as depicted in FIG. 22(a). This has enabled a planar Indium Tin Oxide (ITO) design which can significantly reduce the internal loss [9].

An alternative design from UCSB used PEC etching to laterally etch the active MQW to create an air-gap aperture. Selective etching outside the aperture was accomplished by shielding the core of the device with a metal hard mask to block the illumination source that is necessary for PEC etching.

Lastly, the most recent design from UCSB uses a buried tunnel junction (BTJ) aperture which has the potential for current and lateral optical confinement.

III. Intracavity Contact Design

The intracavity contact is necessary due to the high spreading resistance of p-GaN. The initial UCSB III-nitride VCSELs used electron beam evaporation to deposit indium tin oxide (ITO) as the intracavity contact. More recently, TJ intracavity contacts have been employed at UCSB using molecular beam epitaxy (MBE), as shown in FIG. 22(a) and FIG. 22(b). These consist of n-GaN with highly doped $n^+$GaN at the p-GaN interface and on the other side for metal contact. The performance of III-nitride VCSELs with ITO and TJ intracavity contacts are discussed in the next section.

IV. Results and Discussion

Our results [2, 8, 10] have shown that aperture and intracavity contact design significantly impact III-nitride VCSEL performance.

Due to p-GaN plasma damage during SiNx deposition, the dielectric SiNx aperture VCSEL had a ~1 V increase in voltage compared to the IIA VCSEL. The threshold current density of the IIA VCSEL was 16 kA/cm$^2$, which was ~5× lower than the device with a SiNx aperture. This was likely due to the planar ITO design that was enabled by ion implantation.

The next experiment compared the VCSEL, performance of a IIA device versus a PEC air-gap aperture. The PEC aperture VCSEL reached a peak output power of 180 μW while the IIA device only reached an output power of 80 μW. This difference was likely due to the inability of the IIA device to confine higher order modes that appear at higher currents. The increased optical confinement of the PEC aperture led to well-defined lateral modes, in contrast with the observed filamentary lasing of the IIA device and the dielectric aperture device. The critical disadvantage of the PEC aperture design was its structural instability which resulted in low yield.

The next performance comparison was between IIA VCSELs with ITO and TJ intracavity contacts. VCSELs with conventional ITO intracavity contacts were compared with VCSELS with TJ intracavity contacts grown using MBE. The TJ VCSEL had a threshold current density of 3.5 kA/cm² and peak output power of 550 μW, which is much improved compared to the ITO VCSEL with respective values of 8 kA/cm² and 80 μW. These improvements were attributed to the lower internal loss of the TJ compared to ITO intracavity contacts.

Results from the latest BTJ aperture VCSELs showed that current confinement has been achieved, as shown in FIG. 22(c). The most recent BTJ aperture design has great potential for III-nitride VCSELs as it offers a solution for both current and optical confinement. Initial experimental results show current confined to the aperture in the BTJ device.

Process Steps

Figure 23:
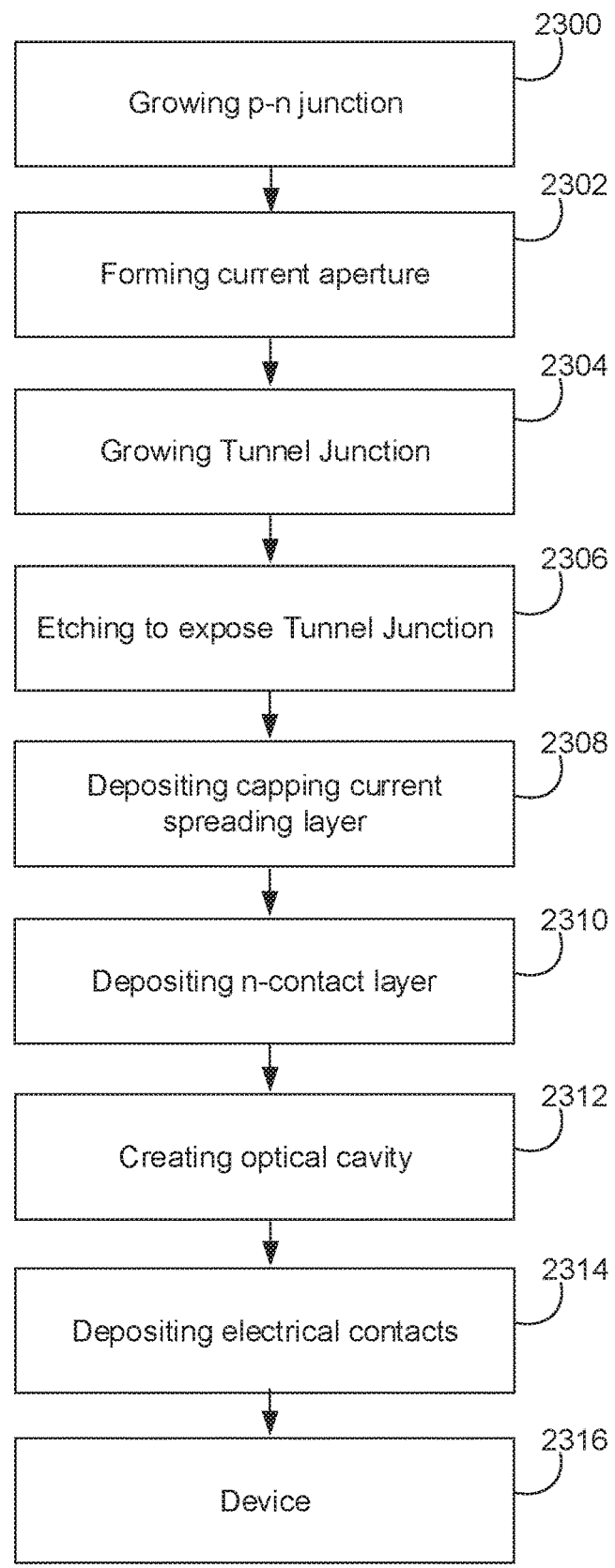
FIG. 23 is a flowchart illustrating a method of fabricating a VCSEL according to one or more embodiments of the present invention.

FIG. 23 illustrates a method of fabricating a VCSEL 2200. The method comprises the following steps (referring also to FIG. 22(a)).

Block 2300 represents growing a III-nitride p-n junction 2202 comprising an active optical gain medium 2204 (e.g., active MQW). The step comprises growing the III-nitride active optical gain medium between the p-type layer 2206 (e.g., p-GaN) and an n-type layer (e.g., n-GaN) 2208. The step can further comprise growing an etch stop layer 2210 for cavity length definition (e.g., n-type AlGaN, n-AlGaN) on the n-GaN 2208. Also shown is p-AlGaN layer 2208a.

Block 2302 represents forming a current aperture. In one or more embodiments, the TJ formed in block 2304 comprises a current and/or optical aperture and this step 2302 can be omitted. In one or more further embodiments, an aluminum ion implanted current aperture 2212 (e,g., Al ion implant) is deposited/formed on the p-type layer (p-GaN). In one or more further embodiments, an air-gap current aperture is formed on the p-type layer (p-GaN).

Block 2304 represents growing an n-type III-nitride tunnel junction (TJ) 2214 on the p-side of the p-n junction (e,g., by growing n+ III-nitride (e.g., n⁺-GaN 2214a) on or above the p-GaN 2206). In one or more embodiments, the TJ 2214 or GaN 2214a comprises/forms a current aperture and/or an optical aperture providing lateral current and/or optical confinement. In one or more further embodiments, the Al ion implanted layer 2212 or the air-gap current aperture is between the TJ/GaN 2214a and the p-GaN 2206 to provide further current confinement.

Block 2306 represents etching to expose a sidewall 2216 of the TJ 2214.

Block 2308 represents depositing a capping current spreading layer 2217, e.g., on or above the TJ 2214. In one or more embodiments, the capping layer has a lower refractive index than the p-n junction 2202. For example, the current spreading layer 2217 can be an n-type AlGaN layer (n-AlGaN) between the TJ 2214 and the p-side DBR (p-DBR) 2218 formed in Block 2312, wherein the n-AlGaN extends onto sides/edges 2216 of the TJ 2214 or GaN 2214.

Block 2310 represents forming an n-contact layer (e.g., n⁺GaN) 2220 on or above the n-GaN layer or the etch stop layer.

Block 2312 represents creating an optical cavity 2222, e.g., formation of (e.g., dielectric) DBRs comprising an n-side DBR (n-DBR) 2224 on the n-side 2226 and a p-side DBR 2318 (p-DBR) on the p-side 2228. In one or more embodiments, after flip-chip bonding to a submount 2230 (e.g., copper flip chip subsrate), access to the n-side 2226 of the device 2200 is accomplished by PEC etching of a sacrificial MQW. It could also be accomplished by chemical mechanical polishing to remove the substrate.

Block 2314 represents depositing electrical contacts 2232a-b, comprising depositing first metal pad (e.g., Ti/Au) 2232a on the n-contact layer 2220 and second metal pad 2232b (e.g., Ti/Au) on the TJ 2214.

Block 2316 represents the end result, a VCSEL 2200 (e.g., as illustrated in FIG. 22(a)) comprising a p-type III-nitride layer 2206 (e.g., p-GaN); an n-type III-nitride layer 2208 (e.g., n-GaN); a III-nitride active optical gain medium 2204 between the p-type layer 2206 and the n-type layer 2208; a TJ 2214 (e.g., between n⁺GaN 2214a and p-GaN 2206); a p-side Distributed Bragg Mirror (p-DBR) 2218 on a p-side 2228 of the VCSEL 2200; and an n-side DBR (n-DBR) 2224 on the n-side 2226 of the VCSEL 22200; wherein the TJ provides lateral current and lateral optical confinement in the VCSEL 2200.

A voltage applied across the first metal pad 2232a and the second metal pad 2232b generates a current flowing between the n-GaN 2208 and the p-GaN 22206, wherein the current injects electrons and holes into the active region 2204. The holes and the electrons recombine in the active region 2204 to emit the light 2234. Thereby, the VCSEL 2200 emits light in response to the voltage applied across the first metal pad 2232a and the second metal pad 2232b.

In one or more embodiments, the TJ 2214 laterally confines the width W of the optical mode 2236 (e.g. transverse mode) formed in the optical cavity 2222 in response to the light 2234 emitted by the active region 2204 and confined between the DBR mirrors 2224 and 2218 (i.e., the width w of the light beam, in a plane perpendicular to the light propagation direction between the DBRs 2218, 2224, is confined by the TJ or by the GaN 2214a forming the TJ 2214).

In one or more embodiments, the TJ 2214/III-nitride 2214a is an intracavity contact and confines the spread of current laterally in a direction perpendicular to the direction between the n-GaN 2208 and the p-GaN 2206. In one or more further embodiments, an aluminum ion implanted aperture 2212 or an air-gap current aperture is provided between the TJ 2214 and the p-type layer 2206, providing further lateral confinement of the current.

In one or more embodiments, the VCSEL 2200 further comprises a current spreading layer 2217 surrounding the tunnel junction 2214. For this purpose, the current spreading layer 2217 may be an n-type AlGaN layer (n-AlGaN) provided between the TJ 2214/GaM 2214a and the p-DBR 2218, wherein the current spreading layer 2217 (e.g., n-AlGaN) extends onto sides 2216 of the TJ 2214/III-nitride 2214a. In one or more embodiments, the current spreading layer 2217 covers a top surface and sidewalls 2216 of the TJ 2214. In one or more embodiments, the current spreading layer 2217 is a capping layer having a lower refractive index than the p-n junction 2202.

Possible Modifications and Variations

Possible modifications include, but are not limited to, structure variations with different cavity lengths (expressed in multiples of the emission wavelength λ, e.g., cavity length of 13λ or 23λ), different numbers of quantum wells (QWs) in the active region, and different numbers of periods (P) in the DBR.

Cavity thickness, number of QWs, and number of n-DBR mirror periods can be optimized to improve III-nitride VCSEL performance.

Variations of the BTJ aperture (e.g., different diameter apertures) for III-nitride VCSELs are also possible. BTJ apertures using different capping materials for capping layer 2217 are also possible.

One or more embodiments of the present invention could be used to achieve high power density nonpolar VCSEL arrays with 100% polarization and/or continuous wave operated III-nitride nonpolar VCSELs.

Advantages and Improvements

One or more embodiments of the present invention offer one of the best aperture designs for III-nitride VCSELs. Conventional aperture designs address current confinement, but do not have effective lateral optical confinement. The present disclosure shows the BTJ aperture for III-nitride VCSELs confines current to the aperture. Moreover, the BTJ aperture VCSEL according to one or more embodiments of the present invention can be designed for increased lateral optical confinement by utilizing lower refractive index materials for the capping layer (as compared to the tunnel junction, p-GaN, and n-GaN) such as n-AlGaN. The increased lateral optical confinement will lead to lower thresholds and improved III-nitride VCSEL performance.

Nomenclature

The term "III-nitrides" refers to any alloy composition of the (Ga,Al,In,B)N semiconductors having the formula $Ga_wAl_xIn_yB_zN$ where $0 \leq w \leq 1$, $0 \leq x \leq 1$, $0 \leq y \leq 1$, $0 \leq z \leq 1$, and $w+x+y+z=1$.

Spontaneous and piezoelectric polarization effects in GaN or III-nitride based devices are eliminated by growth of the device on nonpolar planes of the crystal. Such planes contain equal numbers of Ga (or group III atoms) and N atoms and are charge-neutral. Furthermore, subsequent nonpolar layers are equivalent to one another so the bulk crystal will not be polarized along the growth direction. Two such families of symmetry-equivalent nonpolar planes in GaN are the {11-20} family, known collectively as a-planes, and the {1-100} family, known collectively as m-planes. Thus, nonpolar III-nitride is grown along a direction perpendicular to the (0001) c-axis of the III-nitride crystal.

Another approach to reducing polarization effects in (Ga,Al,In,B)N devices is to grow the devices on semi-polar planes of the crystal to form device layers. The term "semipolar plane" (also referred to as "semipolar plane") can be used to refer to any plane that cannot be classified as c-plane, a-plane, or m-plane. In crystallographic terms, a semi-polar plane may include any plane that has at least two nonzero h, i, or k Miller indices and a nonzero 1 Miller index.

Polar c-plane devices can also be fabricated. The Gallium or Ga face of GaN is the $c^+$ or (0001) plane, and the Nitrogen or N-face of GaN or a III-nitride layer is the $c^-$ or (000-1) plane.

References for Part F (Incorporated by Reference Herein)

[1] T. Hamaguchi, N. Fuutagawa, S. Izumi, M. Murayama, and H. Narui, "Milliwatt-class GaN-based blue vertical-cavity surface-emitting lasers fabricated by epitaxial lateral overgrowth," *physica status solidi (a)*, pp. n/a-n/a, 2016.

[2] J. T. Leonard, E. C. Young, B. P. Yonkee, D. A. Cohen, T. Margalith, S. P. DenBaars, J. S. Speck, and S. Nakamura, "Demonstration of a III-nitride vertical-cavity surface-emitting laser with a III-nitride tunnel junction intracavity contact," *Applied Physics Letters*, vol. 107, p. 091105, 2015.

[3] W.-J. Liu, X.-L. Hu, L.-Y. Ying, J.-Y. Zhang, and B.-P. Zhang, "Room temperature continuous wave lasing of electrically injected GaN-based vertical cavity surface emitting lasers," *Applied Physics Letters*, vol. 104, p. 251116, 2014.

[4] T. Onishi, O. Imafuji, K. Nagamatsu, M. Kawaguchi, K. Yamanaka, and S. Takigawa, "Continuous Wave Operation of GaN Vertical Cavity Surface Emitting Lasers at Room Temperature," *IEEE Journal of Quantum Electronics*, vol. 48, pp. 1107-1112, 2012.

[5] G. Cosendey, A. Castiglia, G. Rossbach, J.-F. Carlin, and N. Grandjean, "Blue monolithic AlInN-based vertical cavity surface emitting laser diode on free-standing GaN substrate," *Applied Physics Letters*, vol. 101, p. 151113, 2012.

[6] K. Daiji, M. Daisuke, K. Takao, N. Kyosuke, K. Jun, H. Yu, M. Hiroaki, and M. Takashi, "Demonstration of Blue and Green GaN-Based Vertical-Cavity Surface-Emitting Lasers by Current Injection at Room Temperature," *Applied Physics Express*, vol. 4, p. 072103, 2011.

[7] T.-C. Lu, C.-C. Kao, H.-C. Kuo, G.-S. Huang, and S.-C. Wang, "CW lasing of current injection blue GaN-based vertical cavity surface emitting laser," *Applied Physics Letters*, vol. 92, p. 141102, 2008.

[8] J. T. Leonard, D. A. Cohen, B. P. Yonkee, R. M. Farrell, T. Margalith, S. Lee, S. P. DenBaars, J. S. Speck, and S. Nakamura, "Nonpolar III-nitride vertical-cavity surface-emitting lasers incorporating an ion implanted aperture," *Applied Physics Letters*, vol. 107, p. 011102, 2015.

[9] C. O. Holder, J. T. Leonard, R. M. Farrell, D. A. Cohen, B. Yonkee, J. S. Speck, S. P. DenBaars, S. Nakamura, and D. F. Feezell, "Nonpolar III-nitride vertical-cavity surface emitting lasers with a polarization ratio of 100% fabricated using photoelectrochemical etching," *Applied Physics Letters*, vol. 105, p. 031111, 2014.

[10] J. T. Leonard, B. P. Yonkee, D. A. Cohen, L. Megalini, S. Lee, J. S. Speck, S. P. DenBaars, and S. Nakamura, "Nonpolar III-nitride vertical-cavity surface-emitting laser with a photoelectrochemically etched air-gap aperture," *Applied Physics Letters*, vol. 108, p. 031111, 2016.

Conclusion

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An optoelectronic device, comprising:
   a flip chip III-Nitride light emitting diode (LED);
   a dielectric coating on the LED; a metallic reflector backing the dielectric coating; and
   a contact metallization to the LED, wherein:
   the contact metallization comprises aluminum; and
   the contact metallization comprises the metallic reflector and vias through the dielectric coating.

2. The optoelectronic device of claim 1, further comprising at least one n-type III-Nitride layer for current spreading on at least one side of the LED.

3. The optoelectronic device of claim 1, further comprising n-type III-Nitride layers for current spreading on both sides of the LED.

4. The optoelectronic device of claim 1, further comprising a semi-transparent conducting layer as current spreading on the p-side of the LED.

5. The optoelectronic device of claim 4, wherein the semi-transparent conducting layer is indium tin oxide.

6. The optoelectronic device of claim 4, wherein the semi-transparent conducting layer is zinc oxide.

7. The device of claim 1, wherein the metallic reflector consists essentially of aluminum.

8. The device of claim 1, where the dielectric coating is a multi-layer stack of alternating dielectrics.

9. The optoelectronic device of claim 1, wherein the metallic reflector has a reflectivity greater than 80% for light having a wavelength of 450 nanometers.

10. The method of claim 9, wherein:
providing the flip chip LED comprises:
forming a p-n junction structure comprising a p-type III-nitride layer on or above an n-type III-nitride layer; and
forming an n-type III-nitride structure on the p-type III-nitride layer, forming a tunnel junction between the n-type III-nitride structure and the p-type III-nitride layer;
forming the dielectric coating on the n-type III-nitride structure;
forming the vias through the dielectric coating; and wherein the metallic reflector is on the dielectric coating; and the vias contact the n-type III-nitride structure.

11. An optoelectronic device, comprising:
a p-n junction structure comprising a p-type III-nitride layer on or above an n-type III-nitride layer;
an n-type III-nitride structure on the p-type III-nitride layer, forming a tunnel junction between the n-type III-nitride structure and the p-type III-nitride layer;
a dielectric coating on the n-type III-nitride structure;
one or more vias through the dielectric coating; and
metal comprising:
a metallic reflector on the dielectric coating; and
the vias to contact the n-type III-nitride structure, wherein the metal consists essentially of aluminum.

12. The optoelectronic device of claim 11, wherein, comprising:
the metal comprises an n-type contact (n-contact) to the device, the n-contact having a specific contact resistivity below $1 \times 10^{-6}$ $\Omega cm^2$.

13. The optoelectronic device of claim 11, wherein the device is a light emitting diode (LED), edge emitting laser, or vertical cavity surface emitting laser.

14. The optoelectronic device of claim 11, wherein a reflectivity of the metallic reflector is higher than 80% for light having a wavelength of 450 nm.

15. The optoelectronic device of claim 11, wherein a subsequent metal stack is deposited on the aluminum for wire bonding or die attachment.

16. A method of making an optoelectronic device, comprising:
providing a flip chip III-Nitride light emitting diode (LED);
providing a dielectric coating on the LED; a metallic reflector backing the dielectric coating; and
depositing a contact metallization to the LED, wherein:
the contact metallization comprises aluminum; and
the contact metallization comprises the metallic reflector and vias through the dielectric coating.

17. The method of claim 16, wherein the aluminum is a layer deposited and annealed in a low oxygen environment with a partial pressure of oxygen less than $10^{-4}$ torr.

18. The method of claim 16, wherein the aluminum is a layer annealed at a temperature less than 660° C.

19. The method of 16, wherein at least 99% of the contact metallization is the aluminum.

* * * * *